(12) United States Patent
Masuoka et al.

(10) Patent No.: US 9,601,505 B2
(45) Date of Patent: Mar. 21, 2017

(54) SEMICONDUCTOR DEVICE

(71) Applicant: UNISANTIS ELECTRONICS SINGAPORE PTE. LTD., Singapore (SG)

(72) Inventors: Fujio Masuoka, Tokyo (JP); Hiroki Nakamura, Tokyo (JP)

(73) Assignee: Unisantis Electronics Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/596,389

(22) Filed: Jan. 14, 2015

(65) Prior Publication Data
US 2015/0200201 A1    Jul. 16, 2015

(30) Foreign Application Priority Data

Jan. 16, 2014    (JP) .................................. 2014-005795

(51) Int. Cl.
*H01L 27/115*    (2006.01)
*H01L 29/66*    (2006.01)

(52) U.S. Cl.
CPC .. *H01L 27/11582* (2013.01); *H01L 27/11556* (2013.01); *H01L 27/11578* (2013.01); *H01L 29/66833* (2013.01)

(58) Field of Classification Search
None
See application file for complete search history.

(56) References Cited

U.S. PATENT DOCUMENTS

| | | | |
|---|---|---|---|
| 7,936,004 B2 | 5/2011 | Kito et al. | |
| 8,295,091 B2 | 10/2012 | Itagaki et al. | |
| 8,643,081 B2 | 2/2014 | Fujiwara et al. | |
| 8,648,404 B2 | 2/2014 | Ko et al. | |
| 8,811,079 B2 | 8/2014 | Fukuda et al. | |
| 8,861,275 B2 | 10/2014 | Maeda | |
| 2006/0261404 A1* | 11/2006 | Forbes | H01L 27/11568 257/324 |

(Continued)

FOREIGN PATENT DOCUMENTS

JP    2007266143 A    10/2007
JP    2008117959 A    5/2008
(Continued)

*Primary Examiner* — Johannes P Mondt
(74) *Attorney, Agent, or Firm* — Laurence Greenberg; Werner Stemer; Ralph Locher

(57) ABSTRACT

A semiconductor device includes a first selection gate insulating film surrounding a first pillar-shaped semiconductor layer, a first selection gate surrounding the first selection gate insulating film, a first bit line connected to the first pillar-shaped semiconductor layer, a layer including a first charge storage layer which surrounds a second pillar-shaped semiconductor layer, a first control gate surrounding the layer, a layer including a second charge storage layer which surrounds the second pillar-shaped semiconductor layer, a second control gate surrounding the layer, a first lower-portion internal line connecting the first and second pillar-shaped semiconductor layers, a layer including a third charge storage layer, a third control gate, a layer including a fourth charge storage layer, a fourth control gate, a second selection gate insulating film, a second selection gate, a first source line, and a second lower-portion internal line.

21 Claims, 46 Drawing Sheets

(56) References Cited

U.S. PATENT DOCUMENTS

| | | | | |
|---|---|---|---|---|
| 2009/0310425 | A1* | 12/2009 | Sim | H01L 27/11526 365/185.29 |
| 2010/0181612 | A1* | 7/2010 | Kito | H01L 27/11551 257/319 |
| 2010/0207190 | A1* | 8/2010 | Katsumata | G11C 16/0483 257/319 |
| 2011/0284947 | A1 | 11/2011 | Kito et al. | |
| 2012/0213009 | A1* | 8/2012 | Aritome | G11C 16/0408 365/185.29 |
| 2013/0146960 | A1* | 6/2013 | Sakui | H01L 29/78 257/314 |
| 2013/0264626 | A1 | 10/2013 | Sawa | |
| 2013/0307047 | A1 | 11/2013 | Sakuma et al. | |
| 2015/0078089 | A1* | 3/2015 | Sakui | G11C 16/26 365/185.17 |

FOREIGN PATENT DOCUMENTS

| | | | |
|---|---|---|---|
| JP | 2011198435 | A | 10/2011 |
| JP | 2011204856 | A | 10/2011 |
| JP | 2012119013 | A | 6/2012 |
| JP | 2013004690 | A | 1/2013 |
| JP | 2013161803 | A | 8/2013 |
| JP | 2013187294 | A | 9/2013 |
| JP | 2013219239 | A | 10/2013 |
| JP | 2013239622 | A | 11/2013 |

* cited by examiner

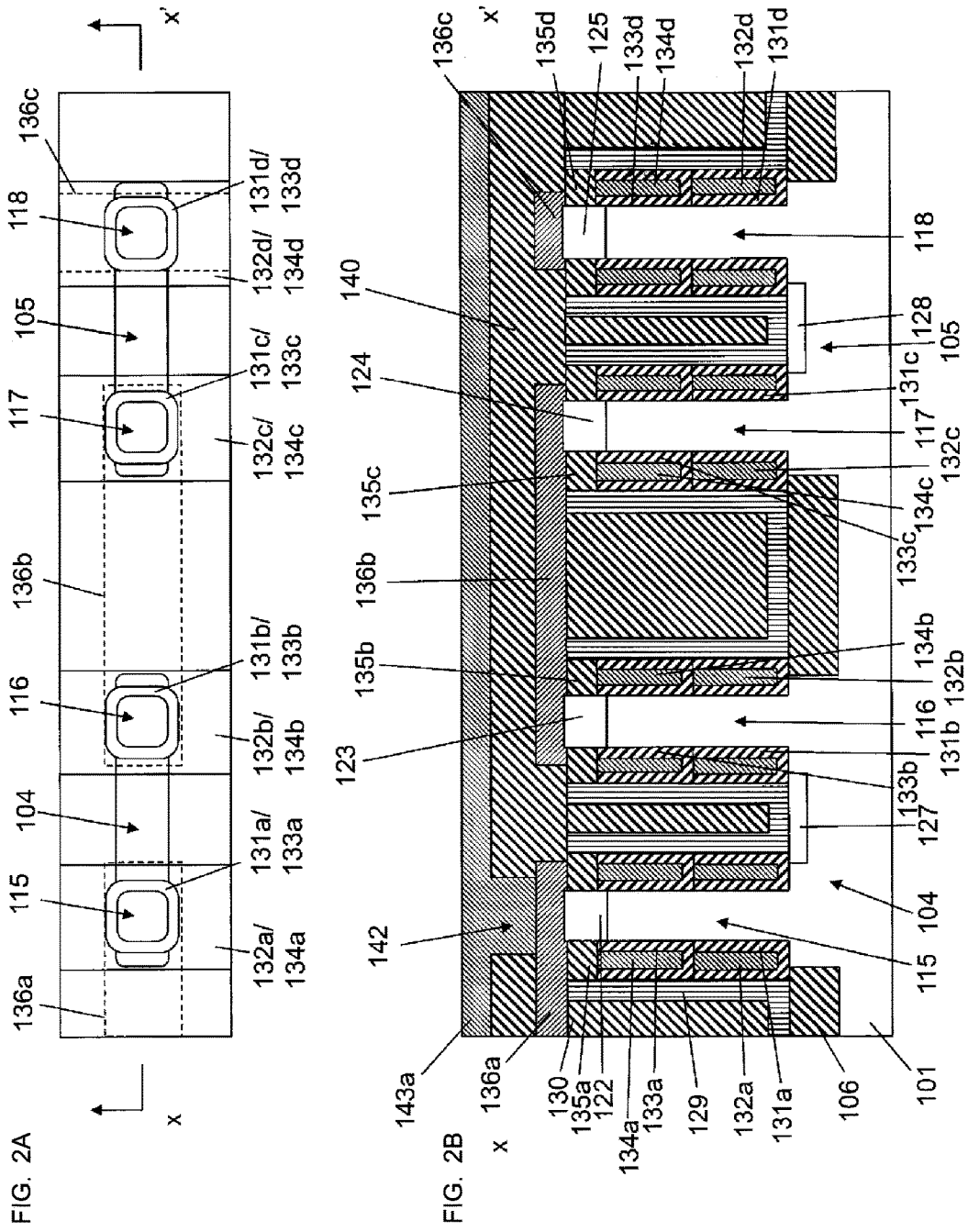

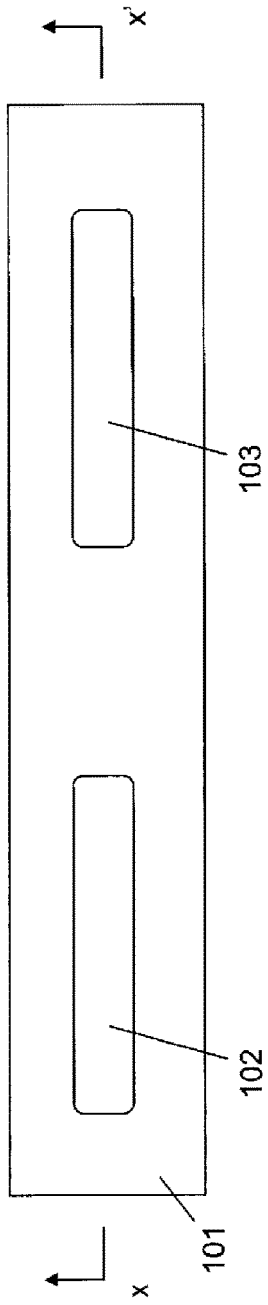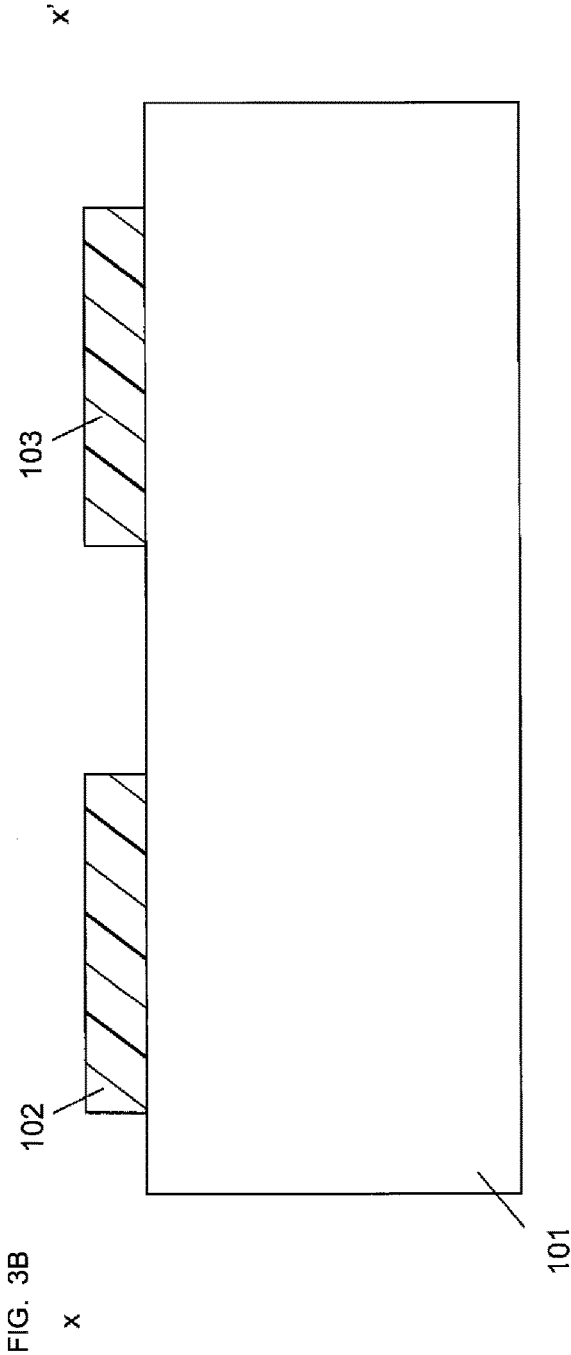

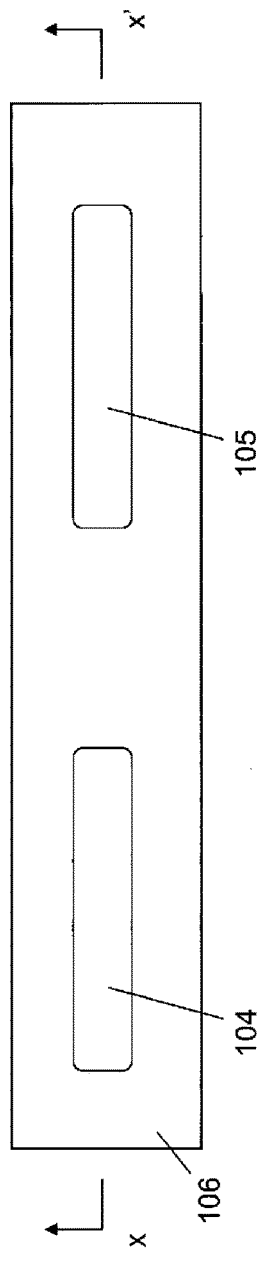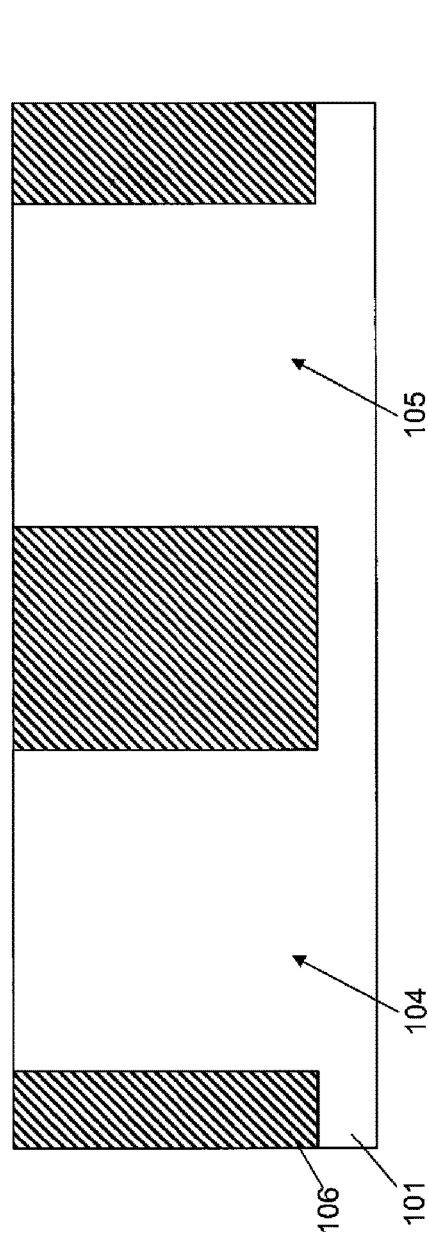

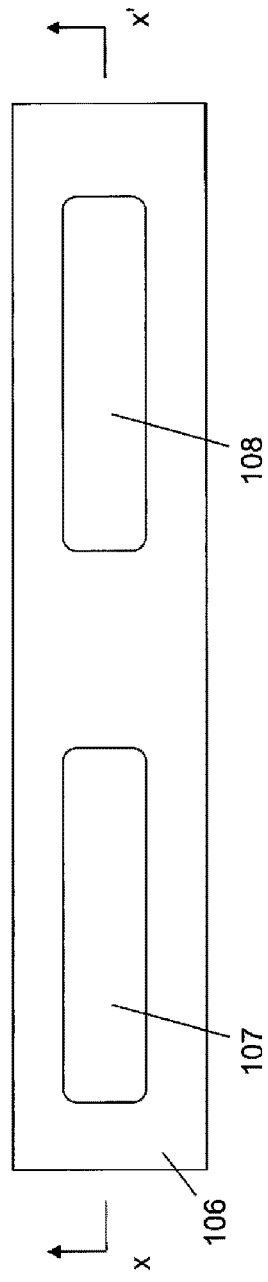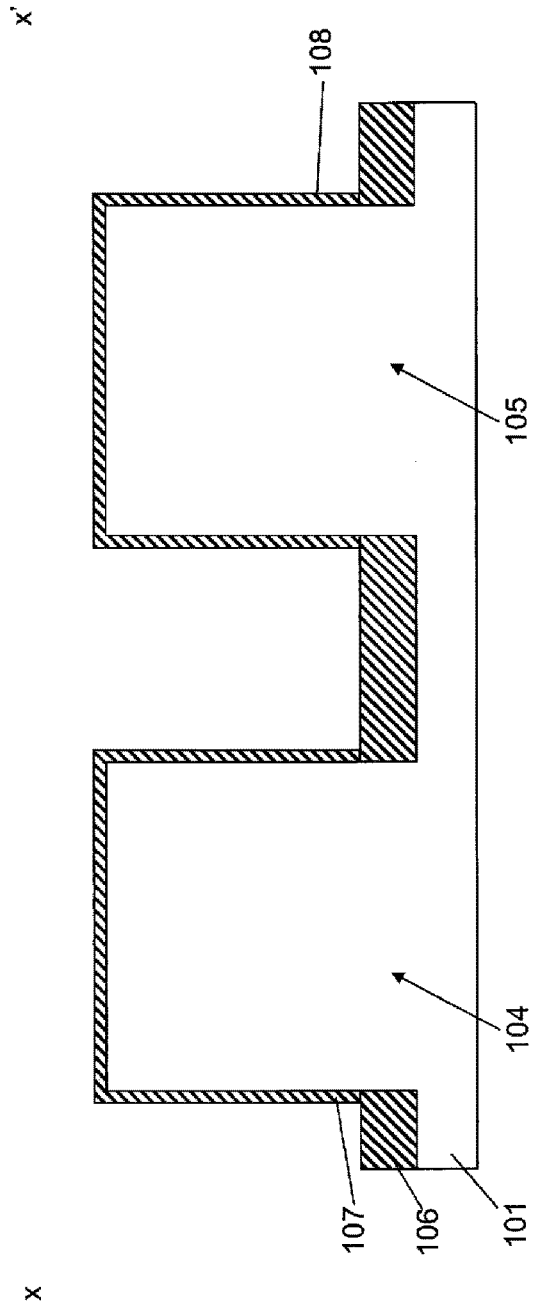
FIG. 8A
FIG. 8B

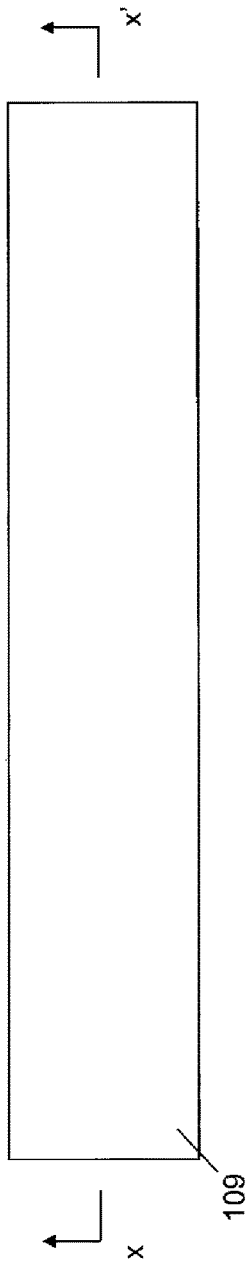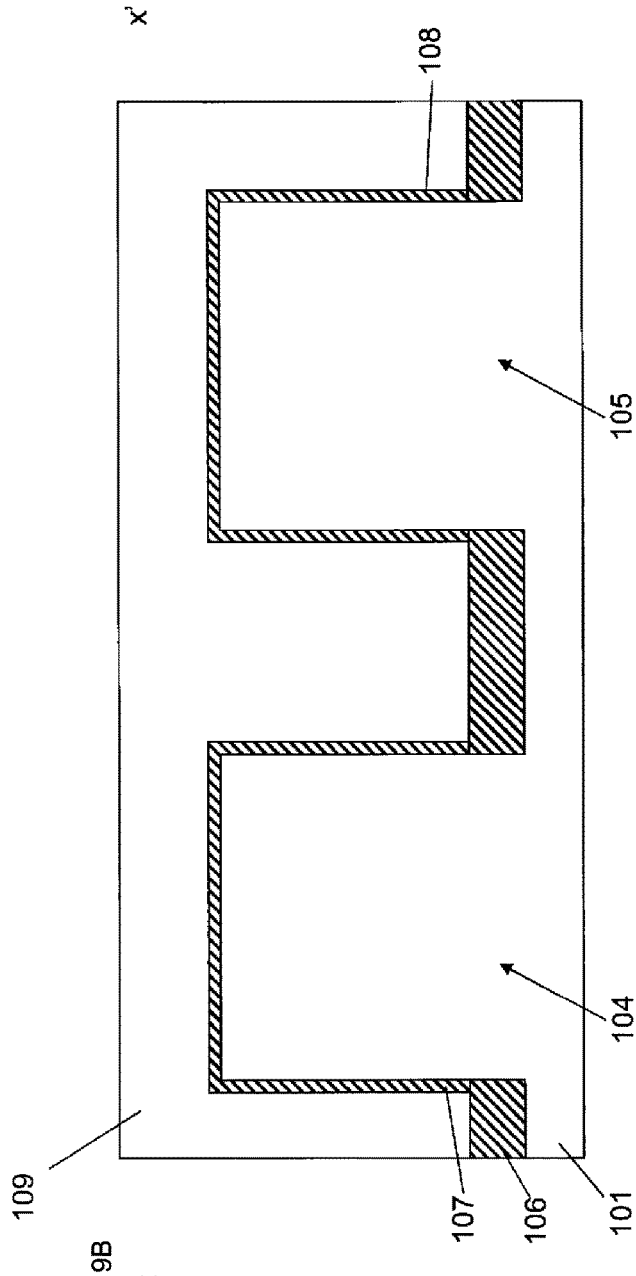
FIG. 9A
FIG. 9B

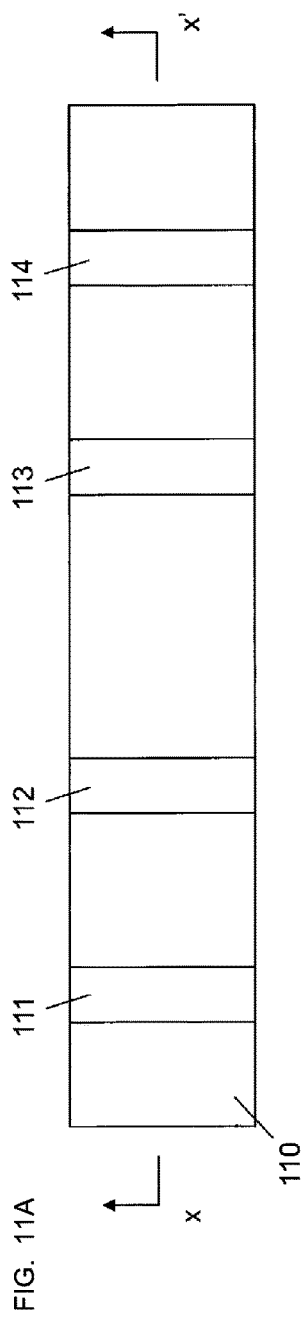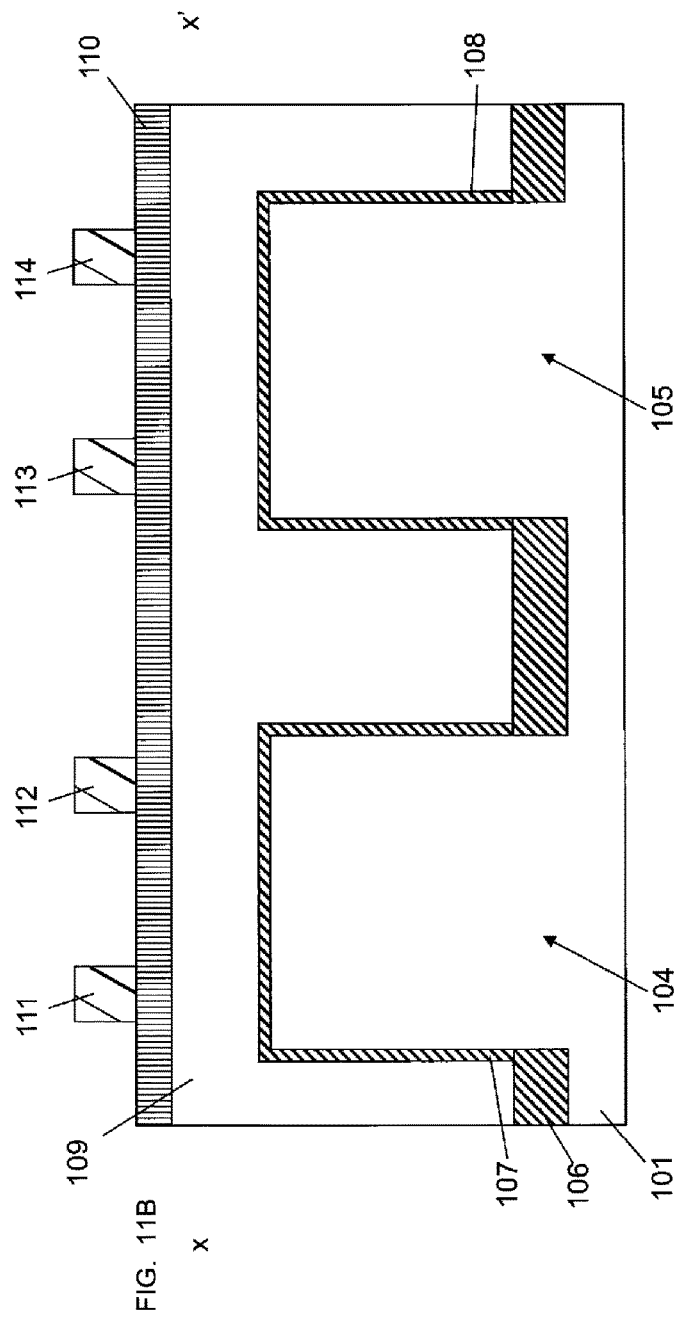

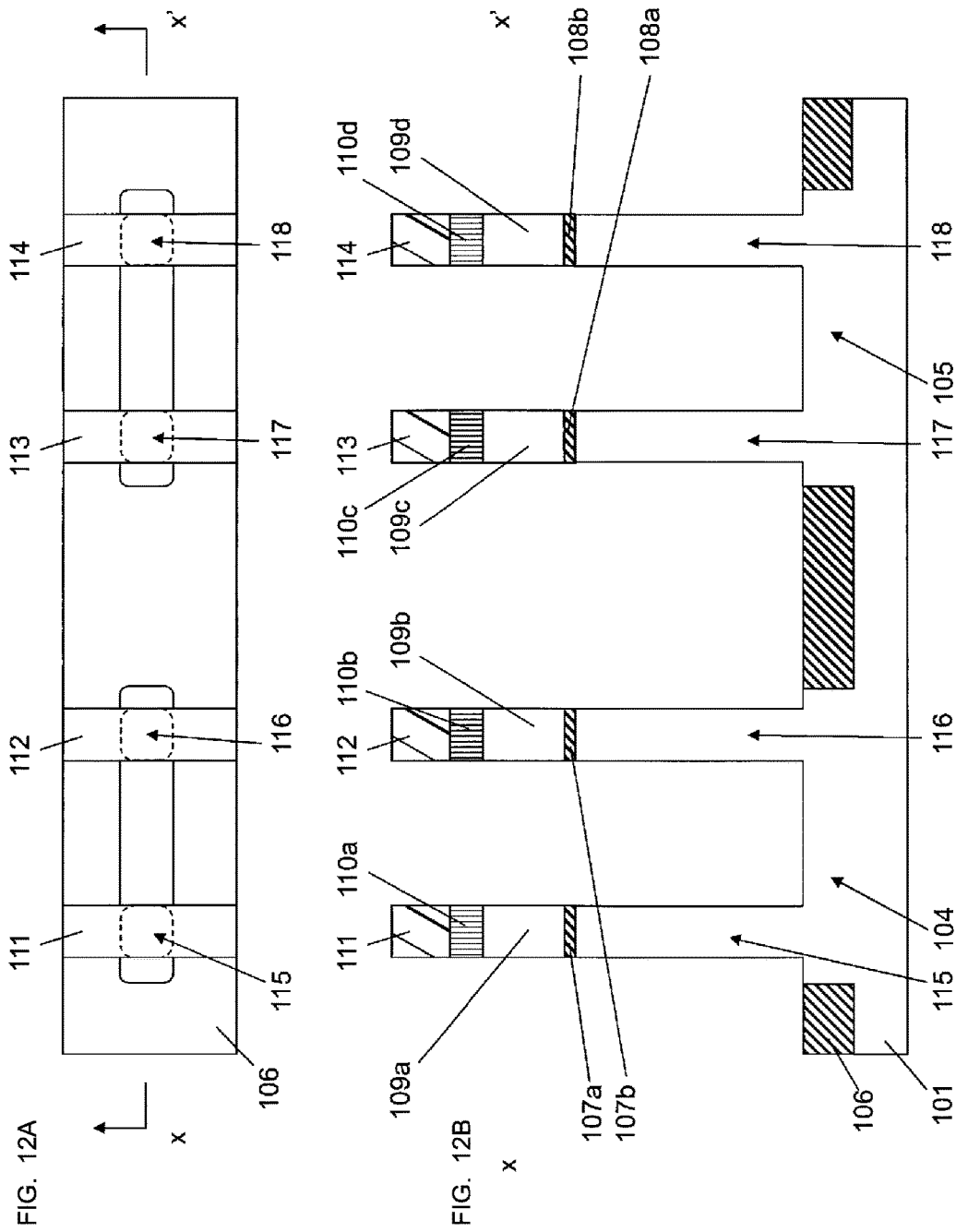

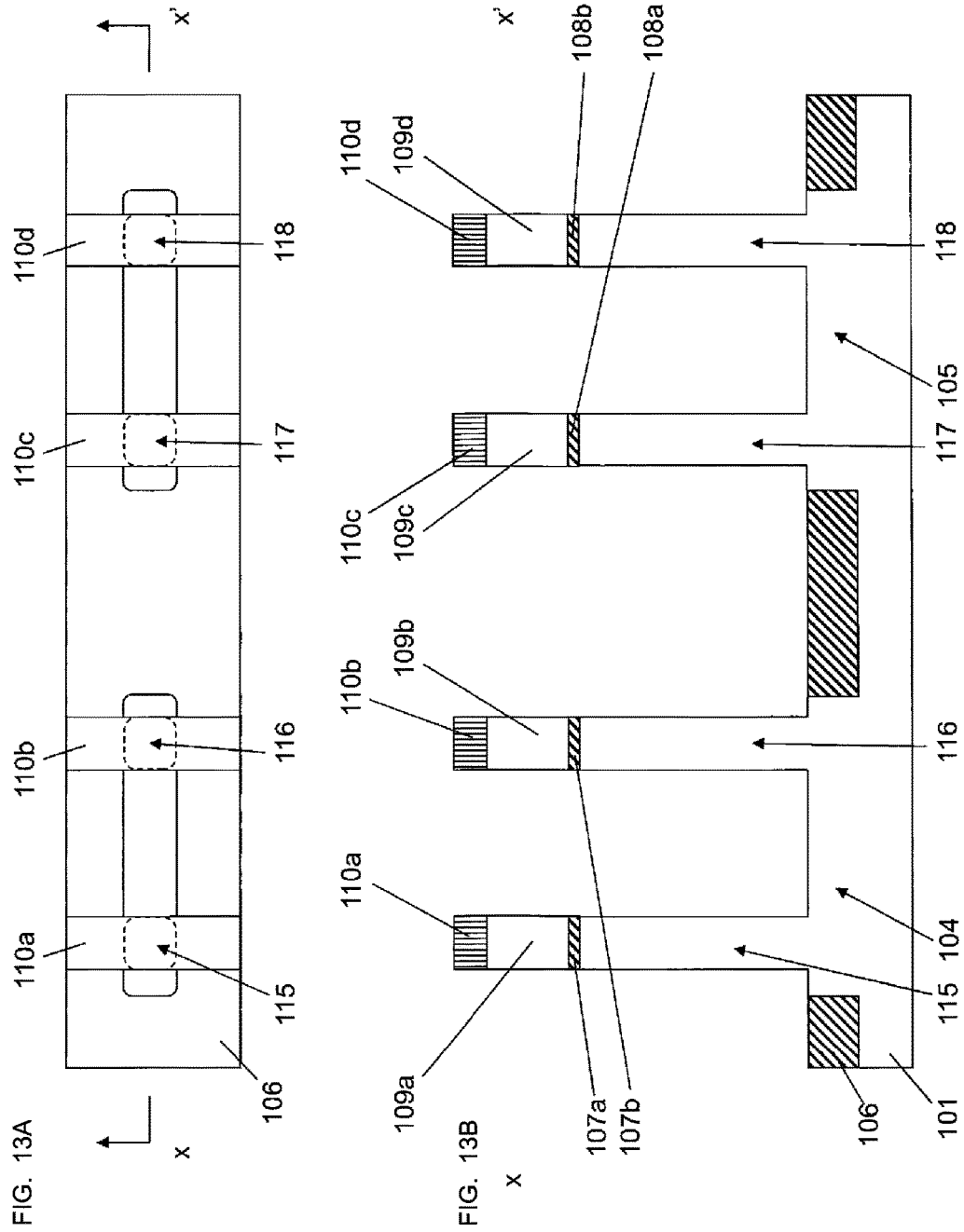

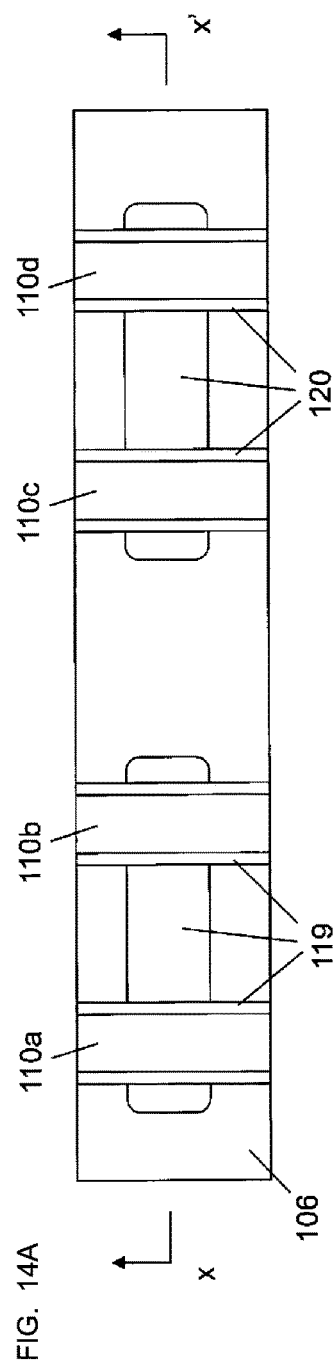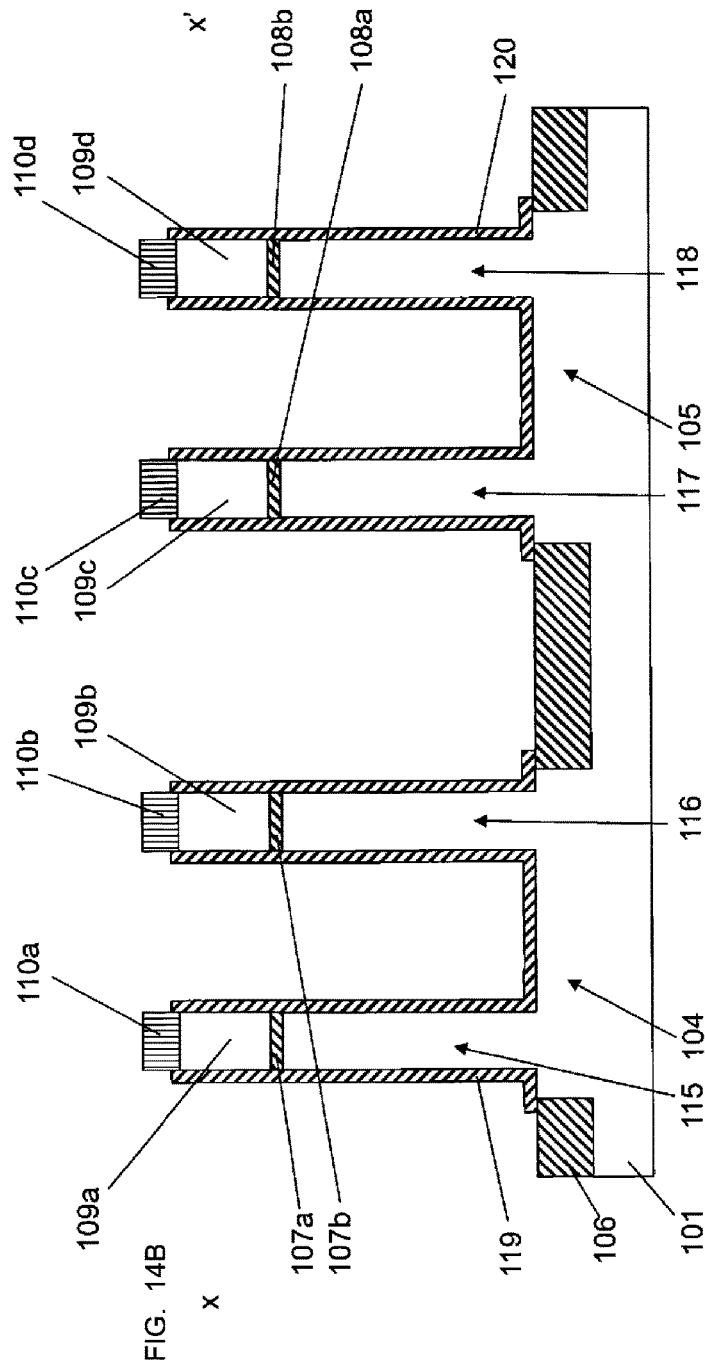

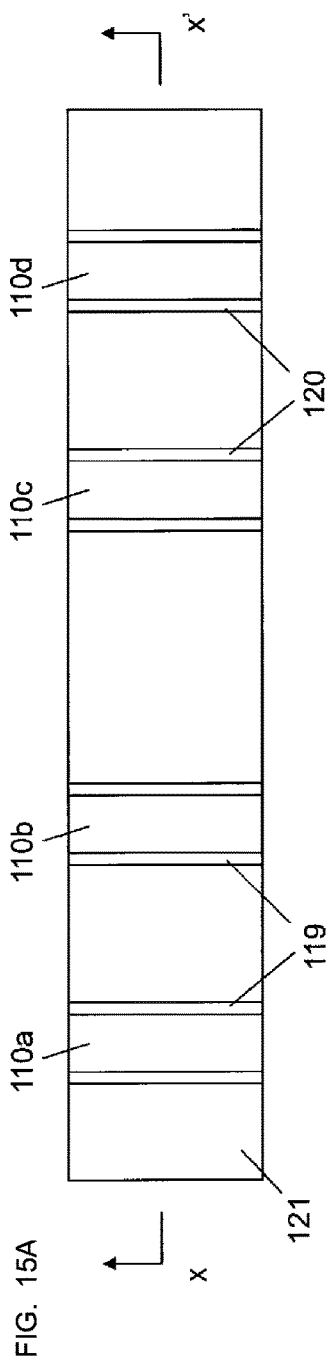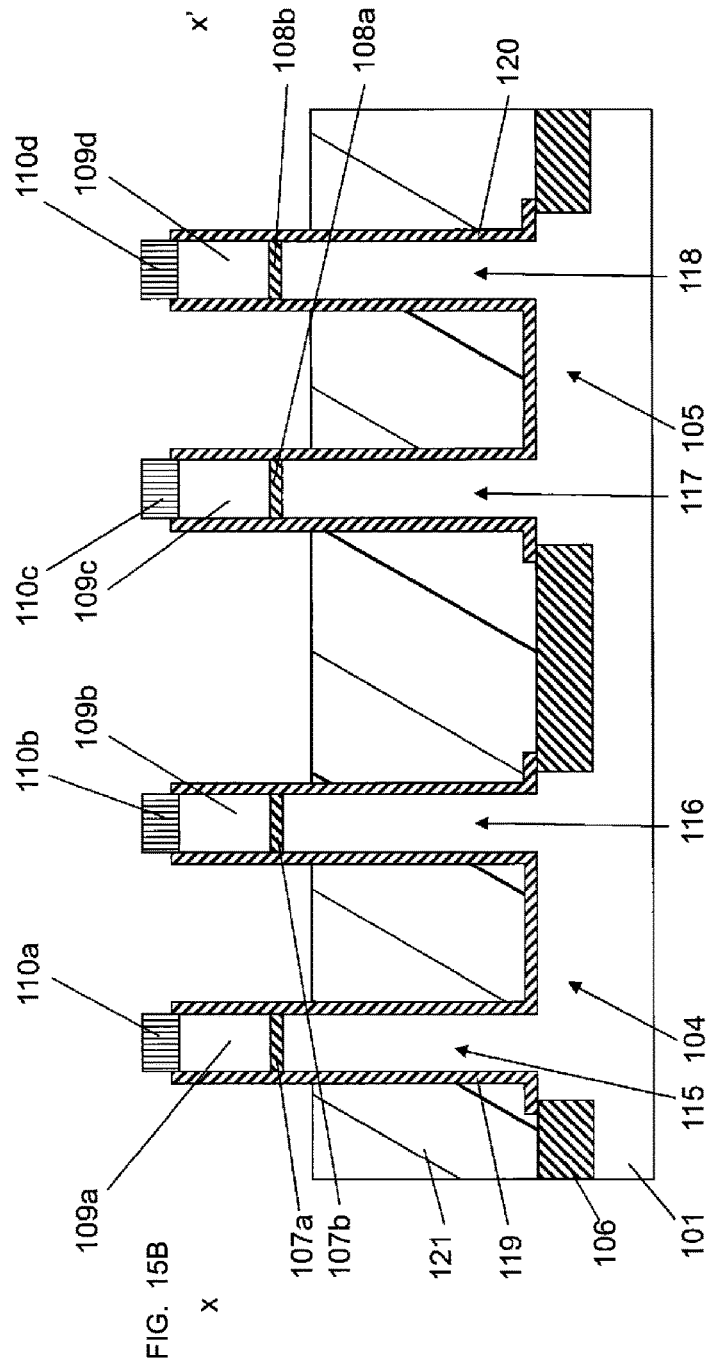

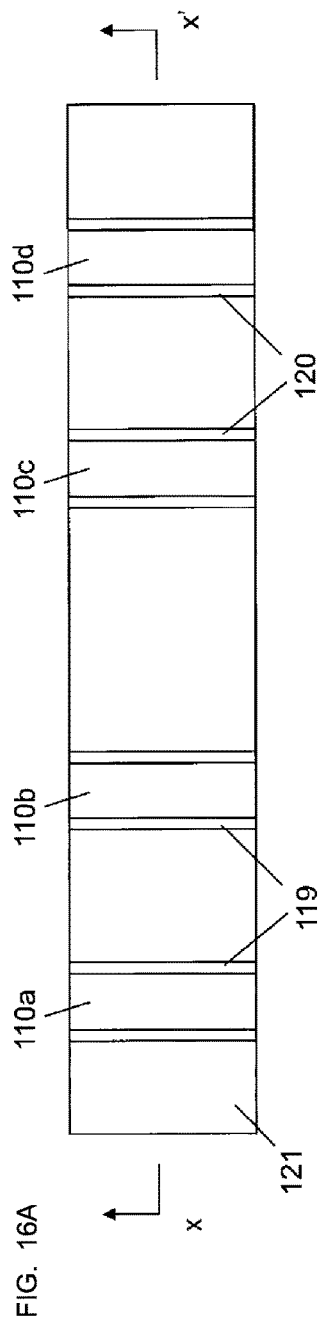
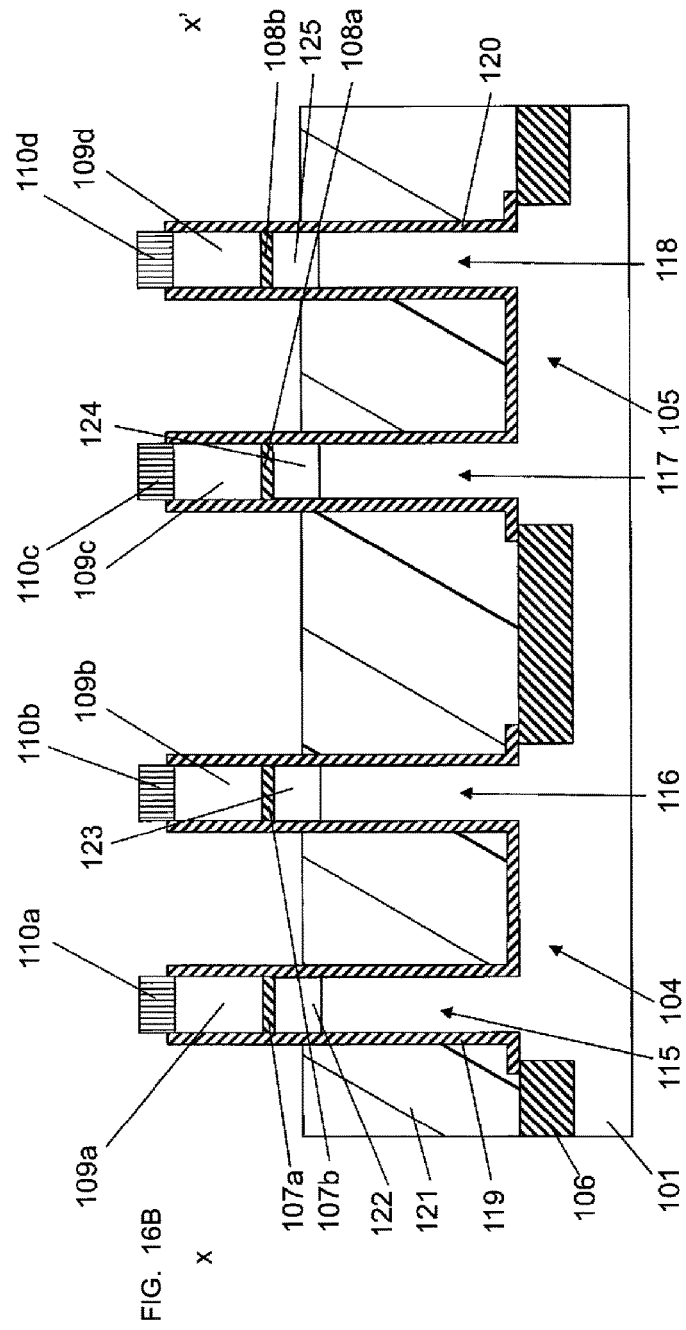
FIG. 16A
FIG. 16B

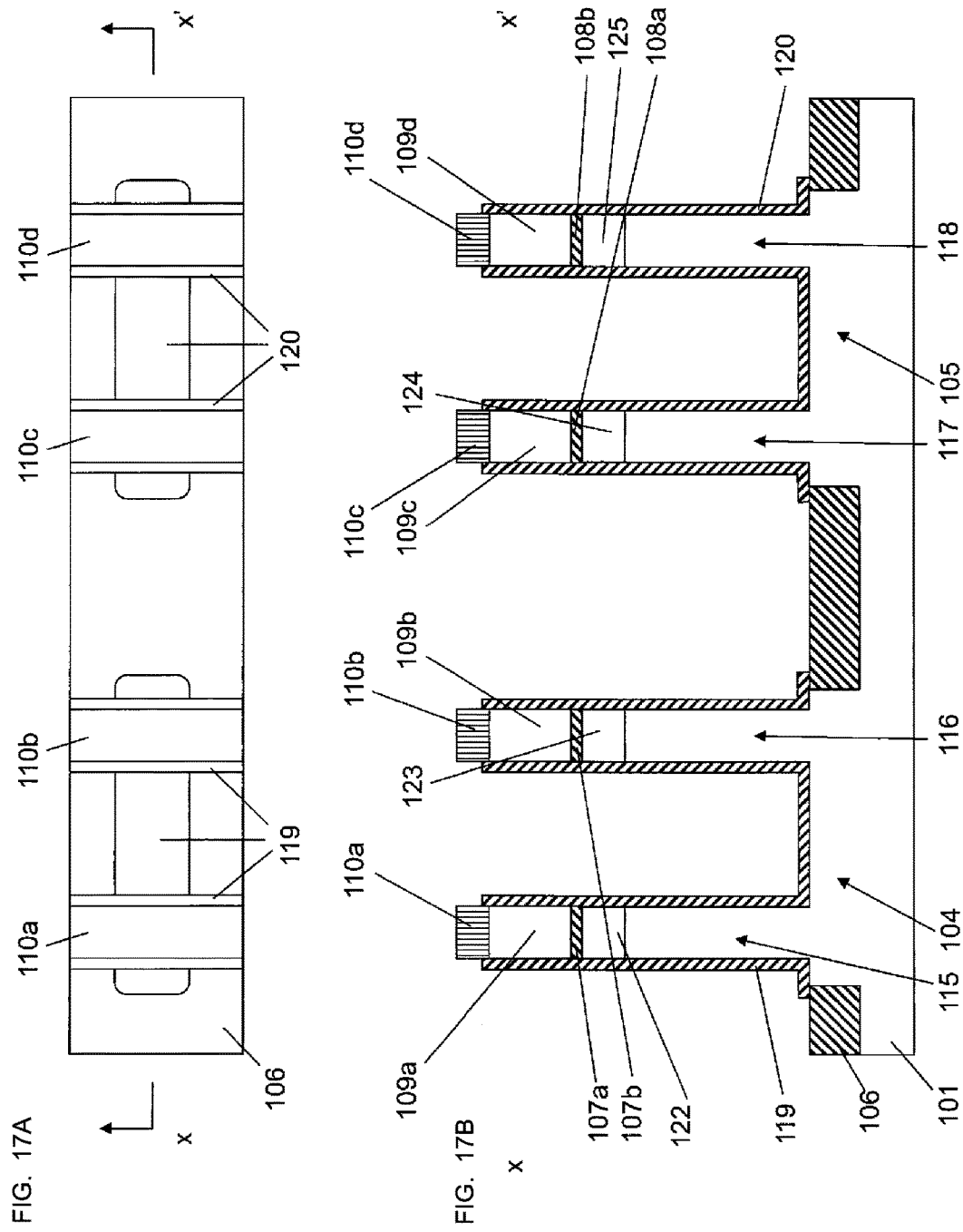

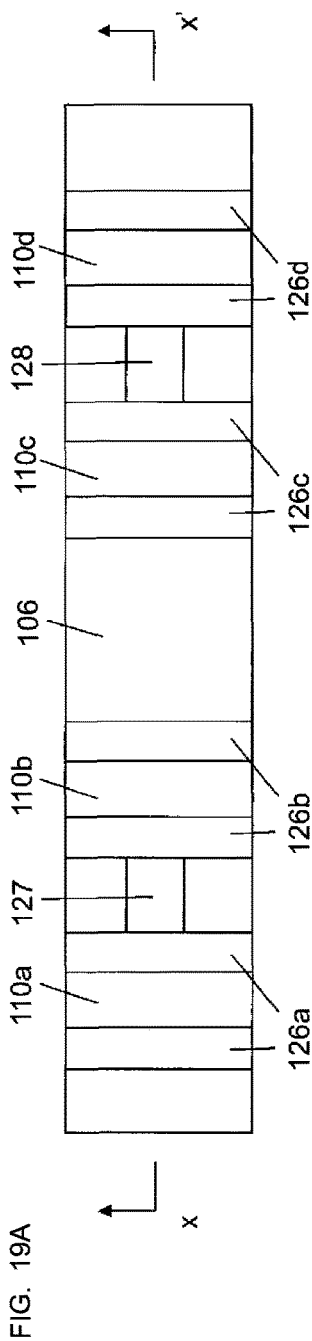
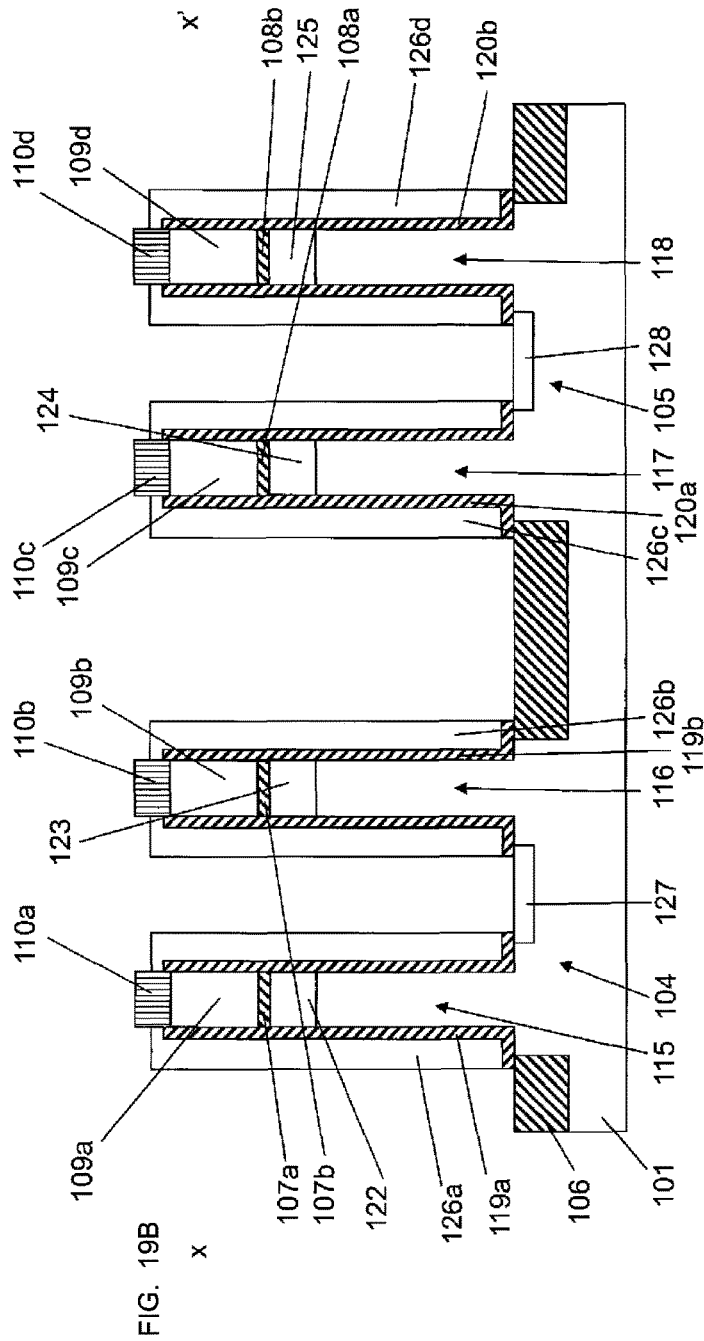
FIG. 19A
FIG. 19B

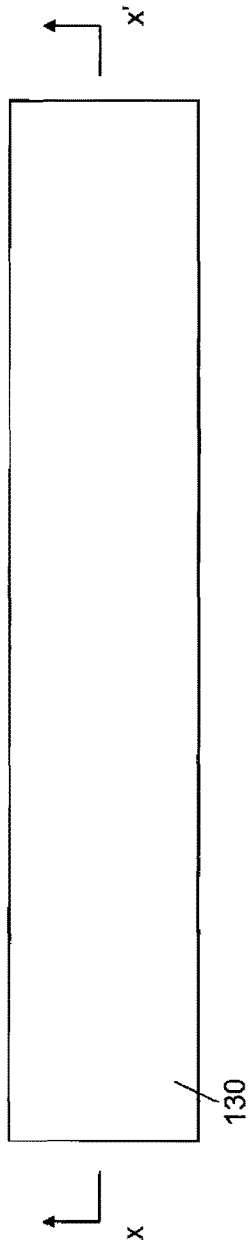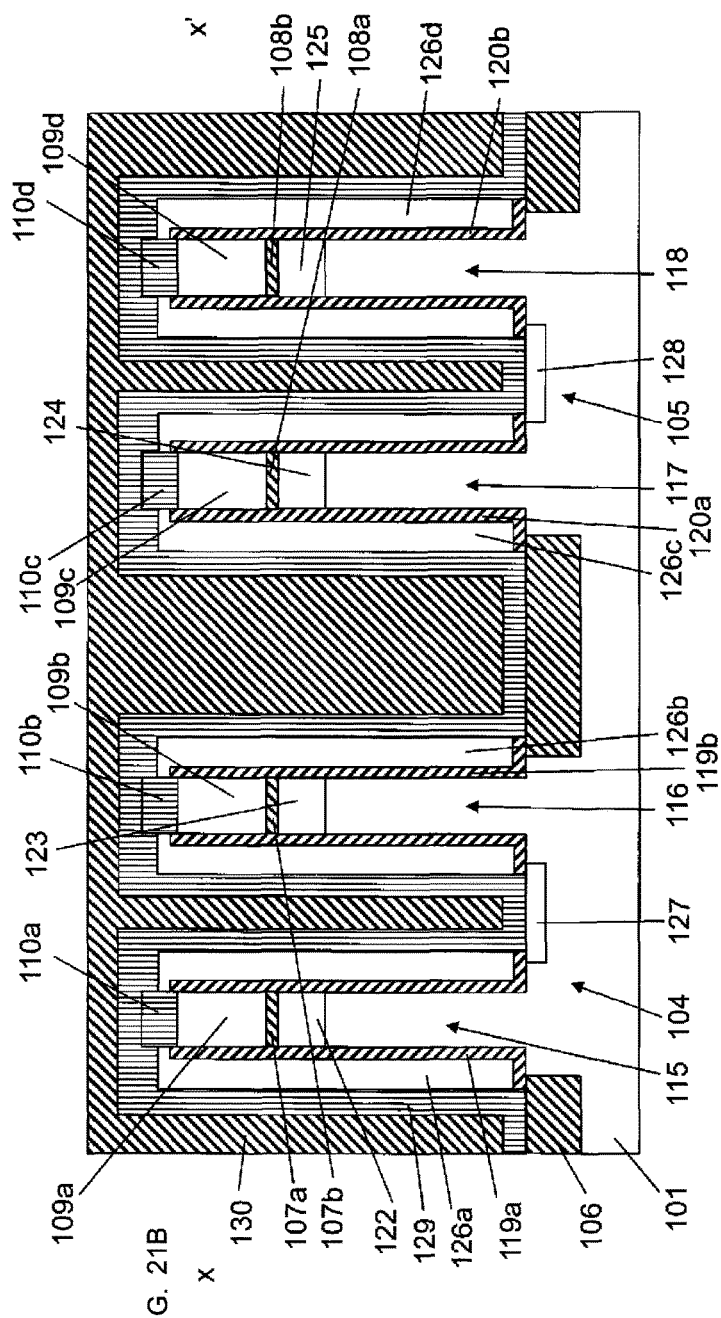
FIG. 21A
FIG. 21B

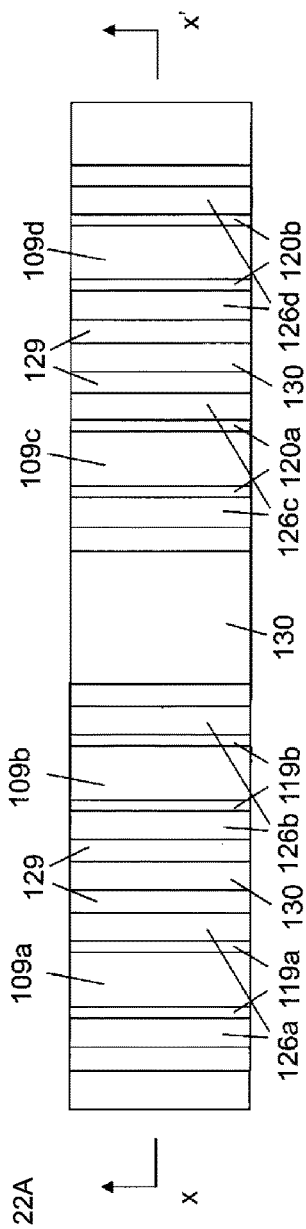
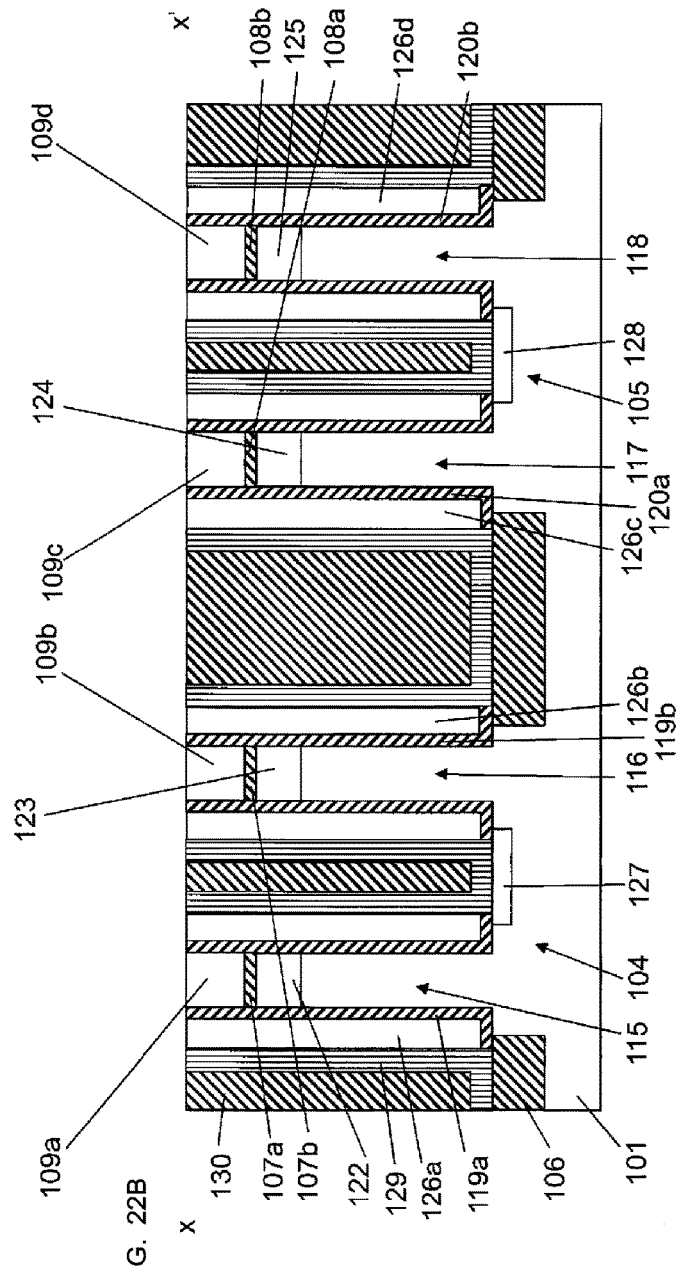
FIG. 22A
FIG. 22B

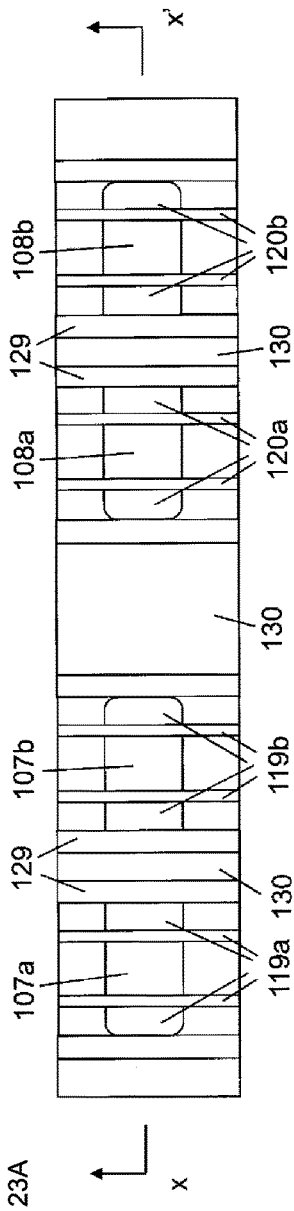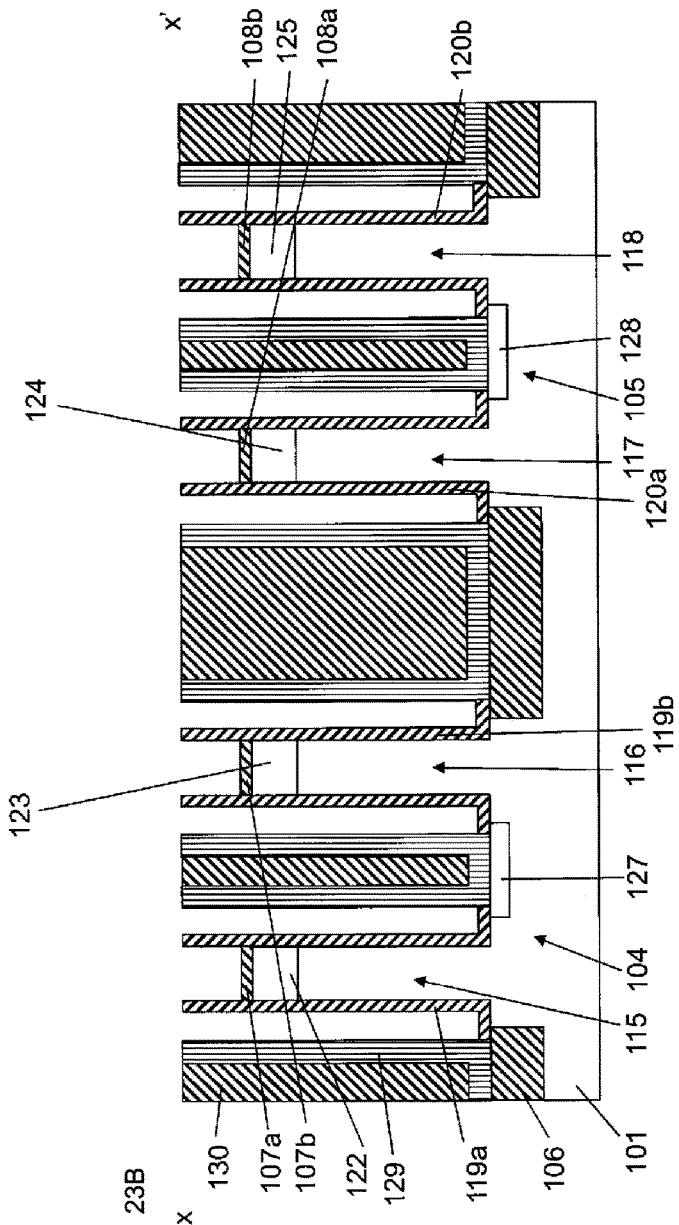

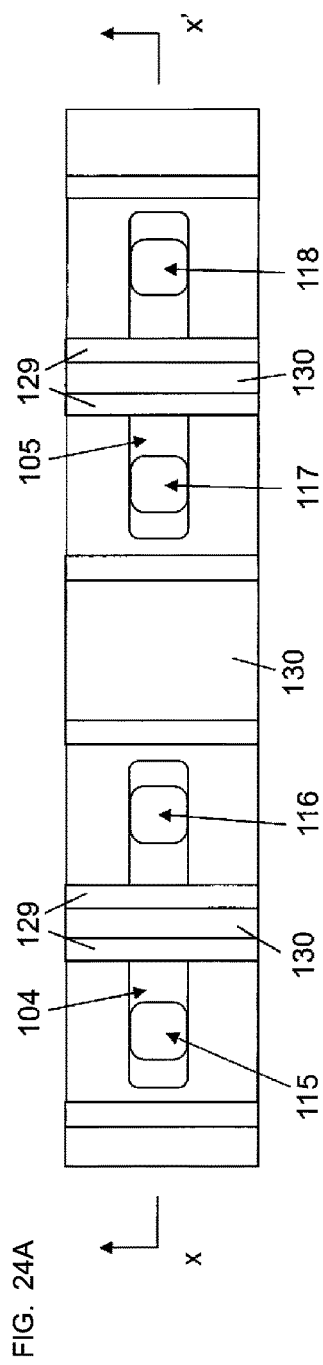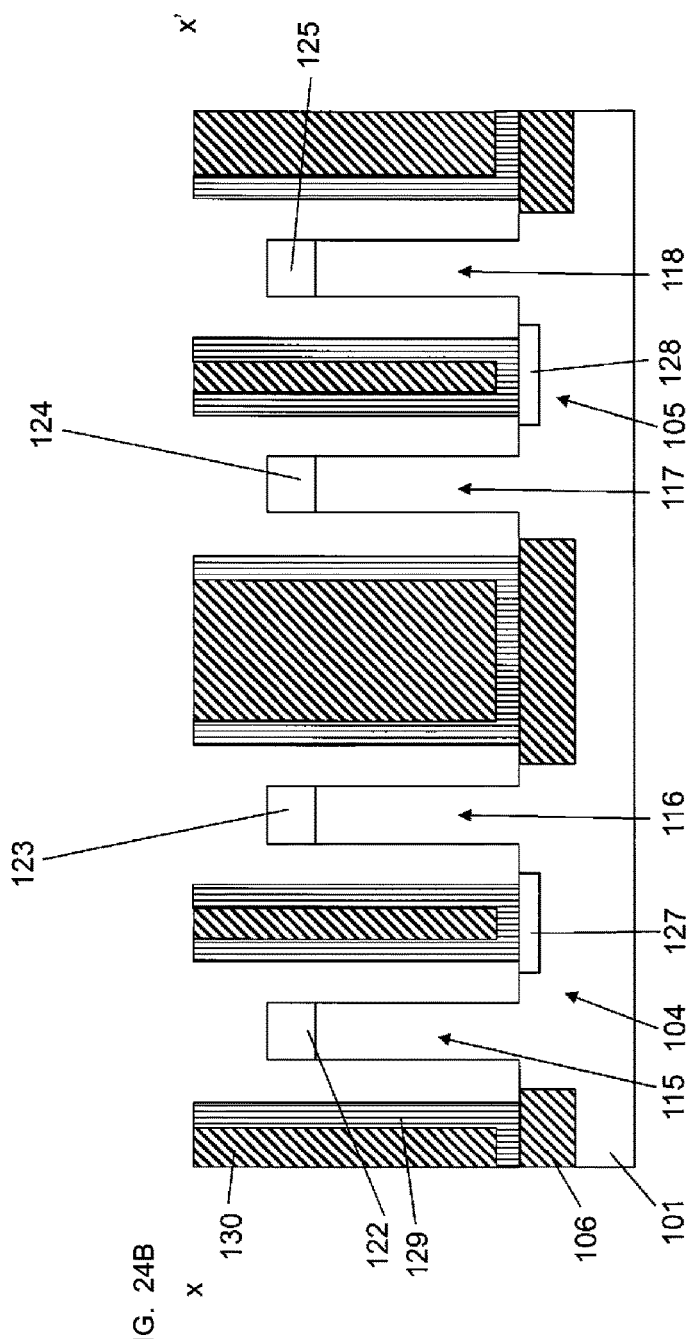
FIG. 24A
FIG. 24B

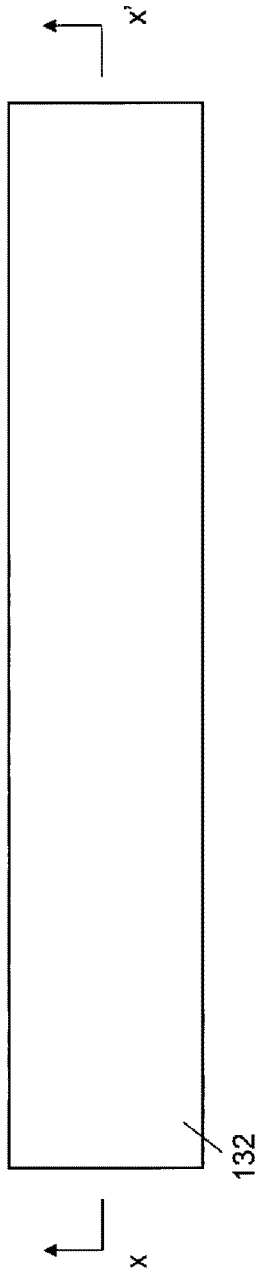
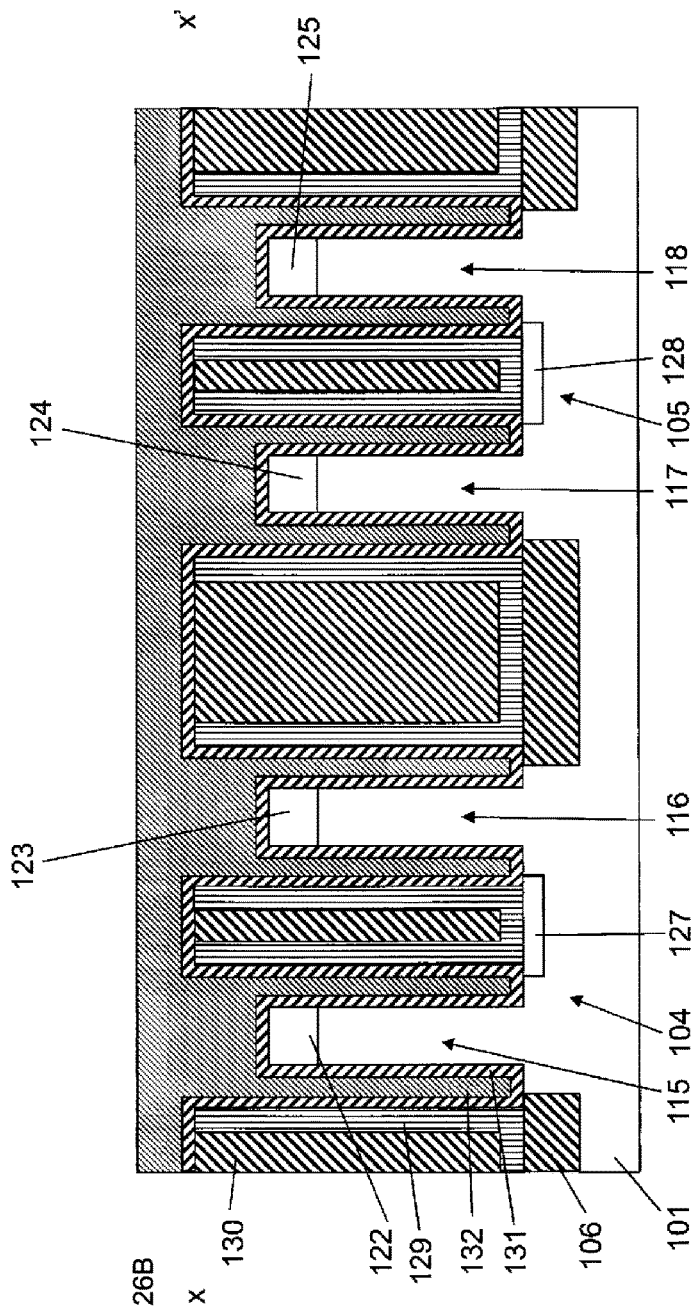
FIG. 26A
FIG. 26B

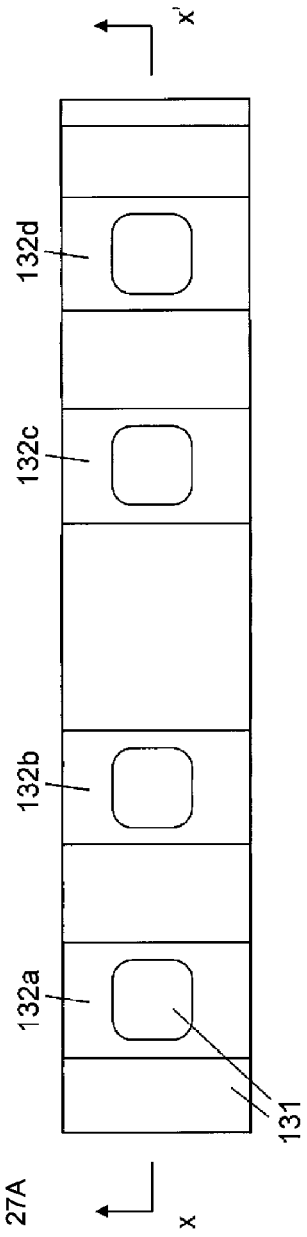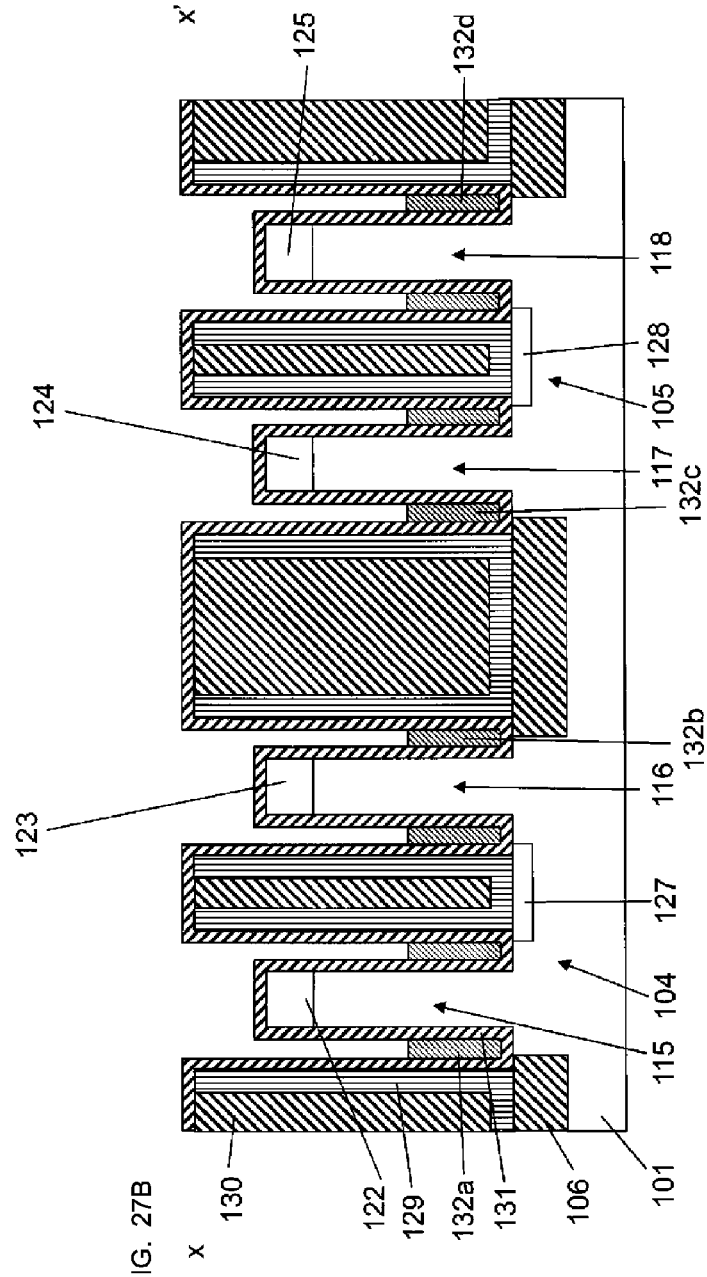

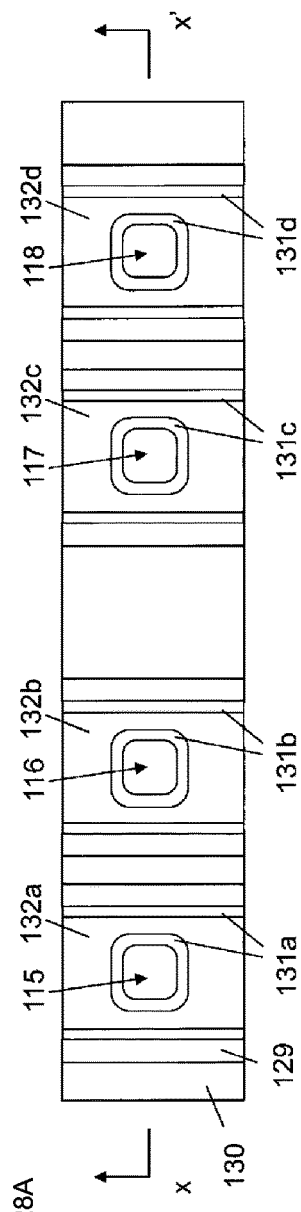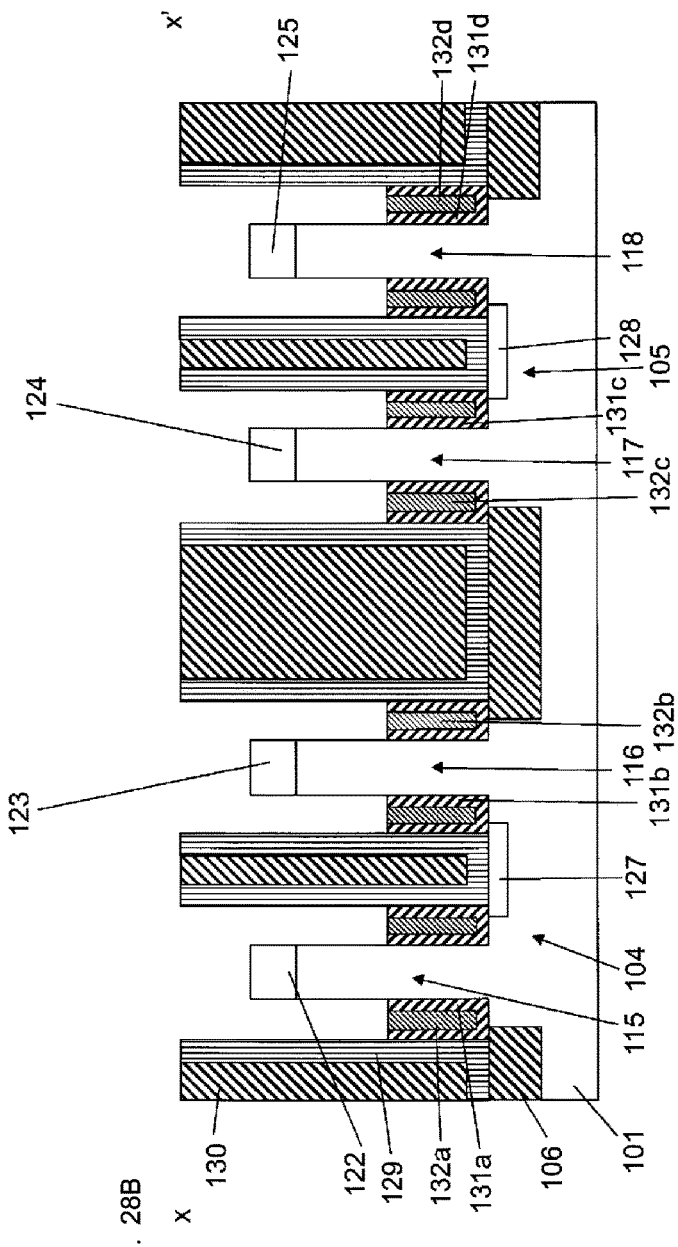
FIG. 28A
FIG. 28B

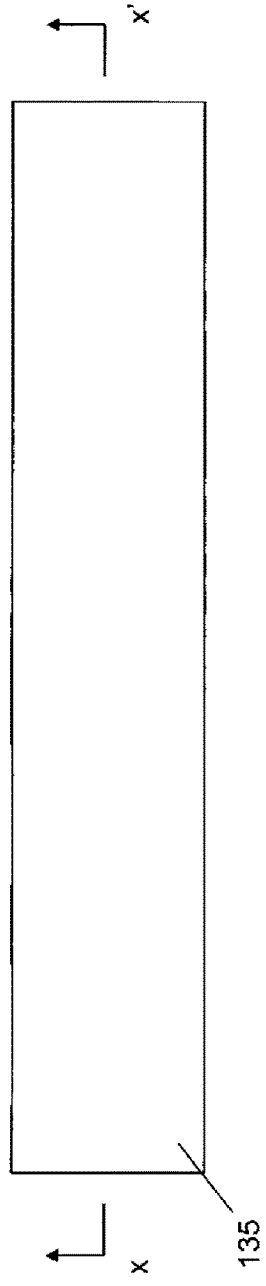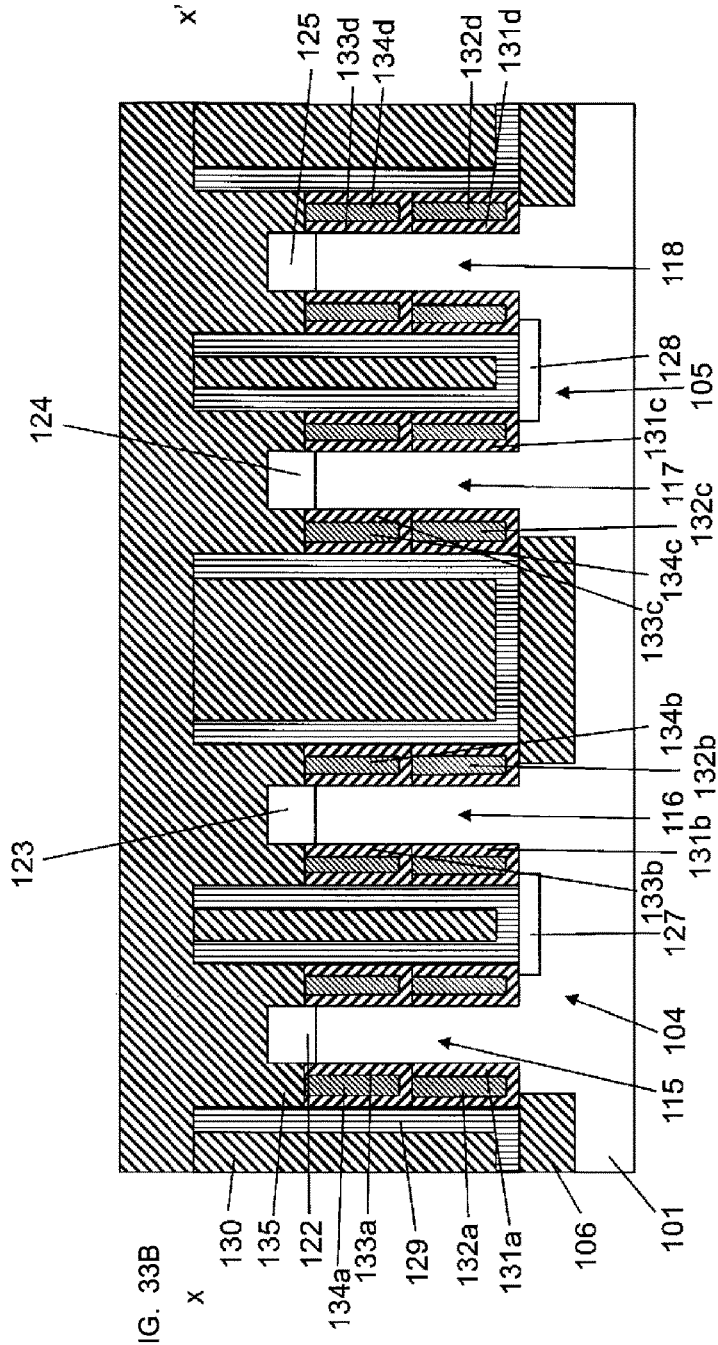

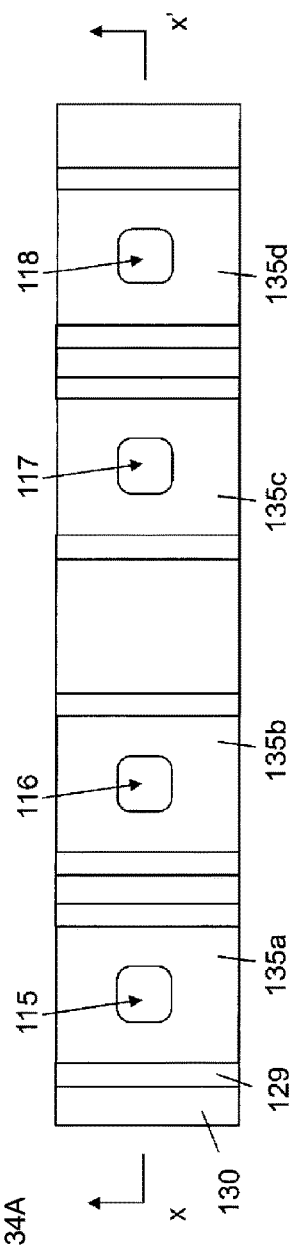
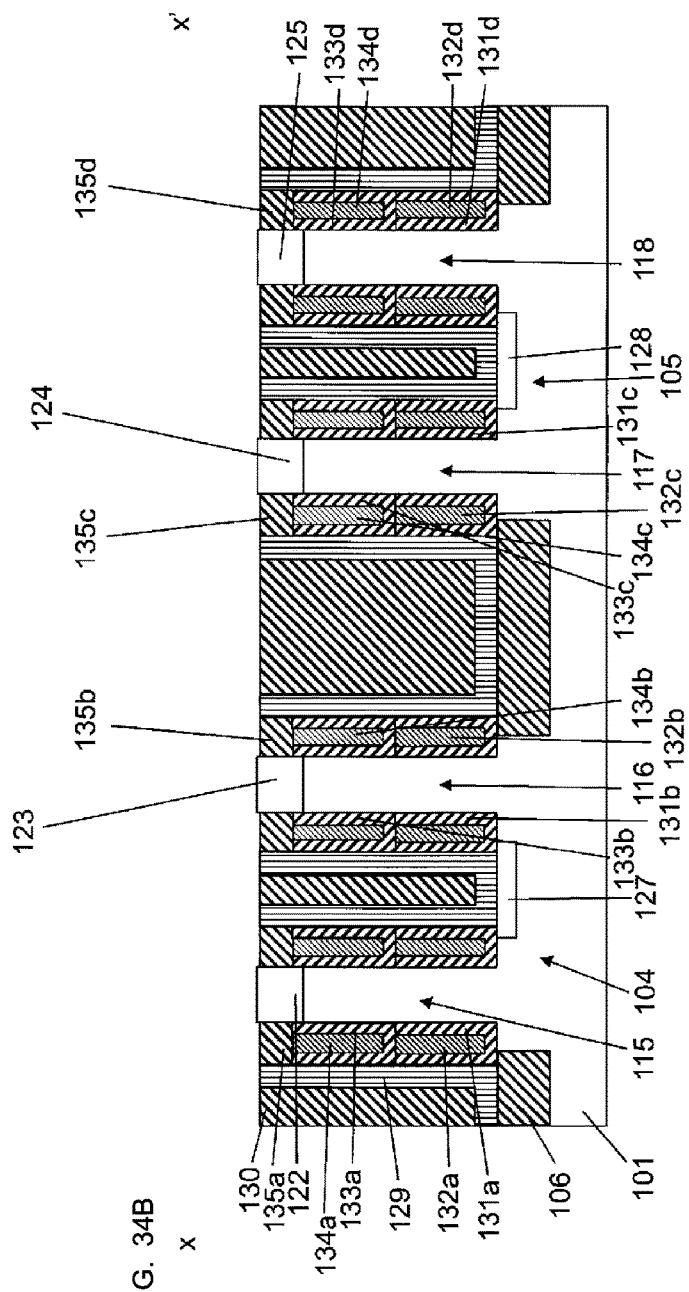

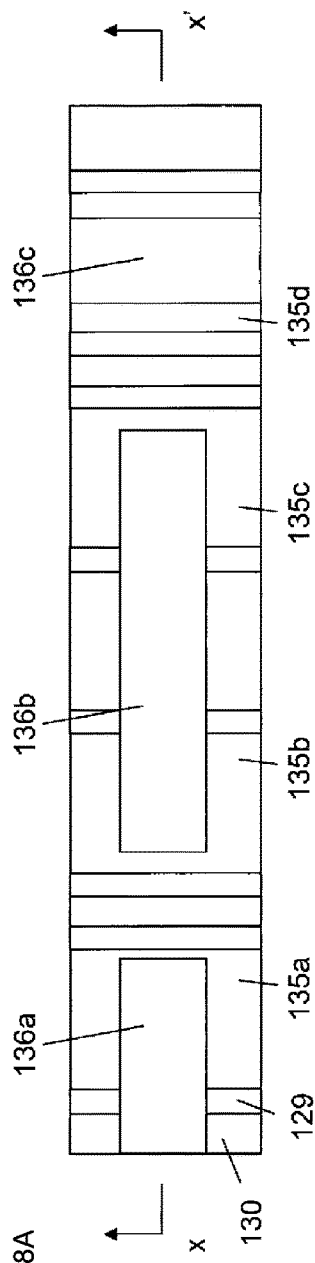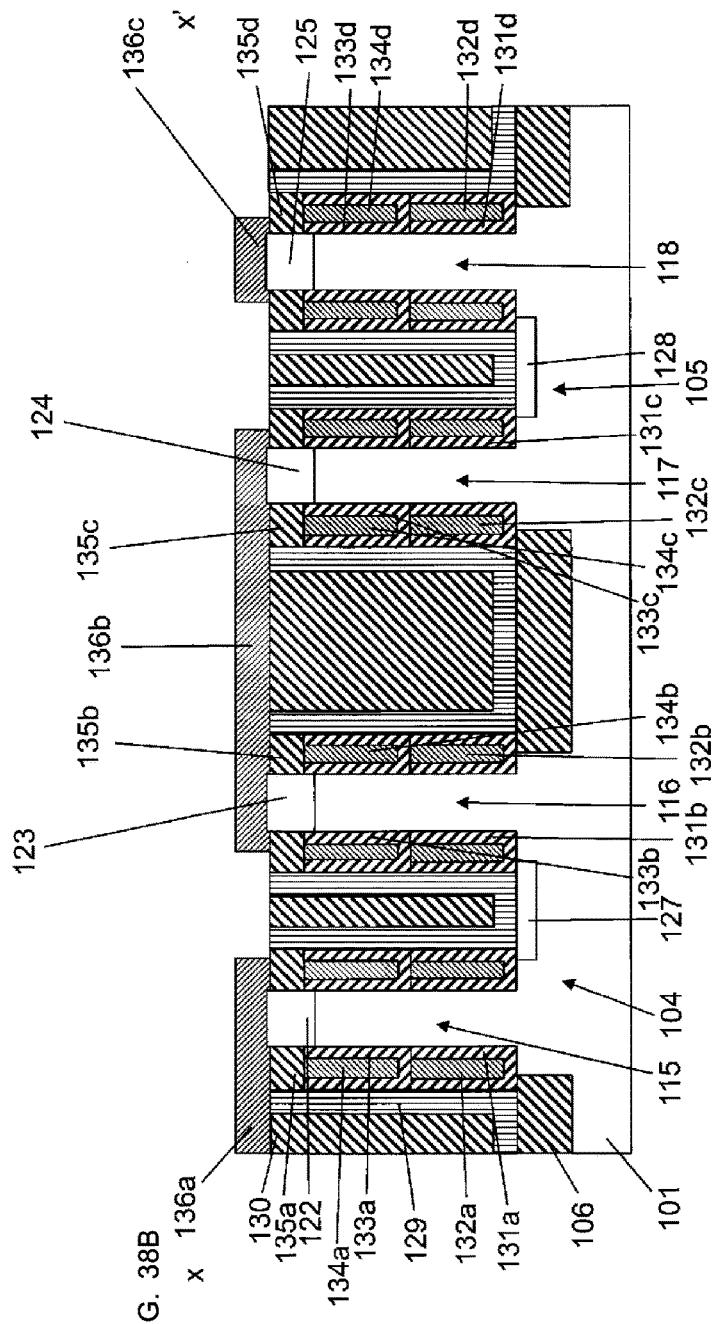

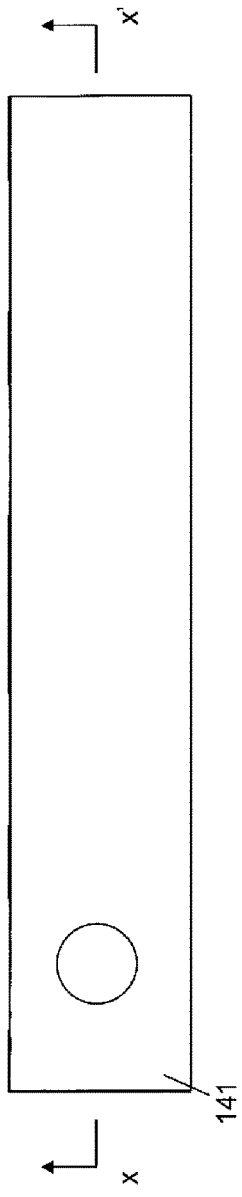
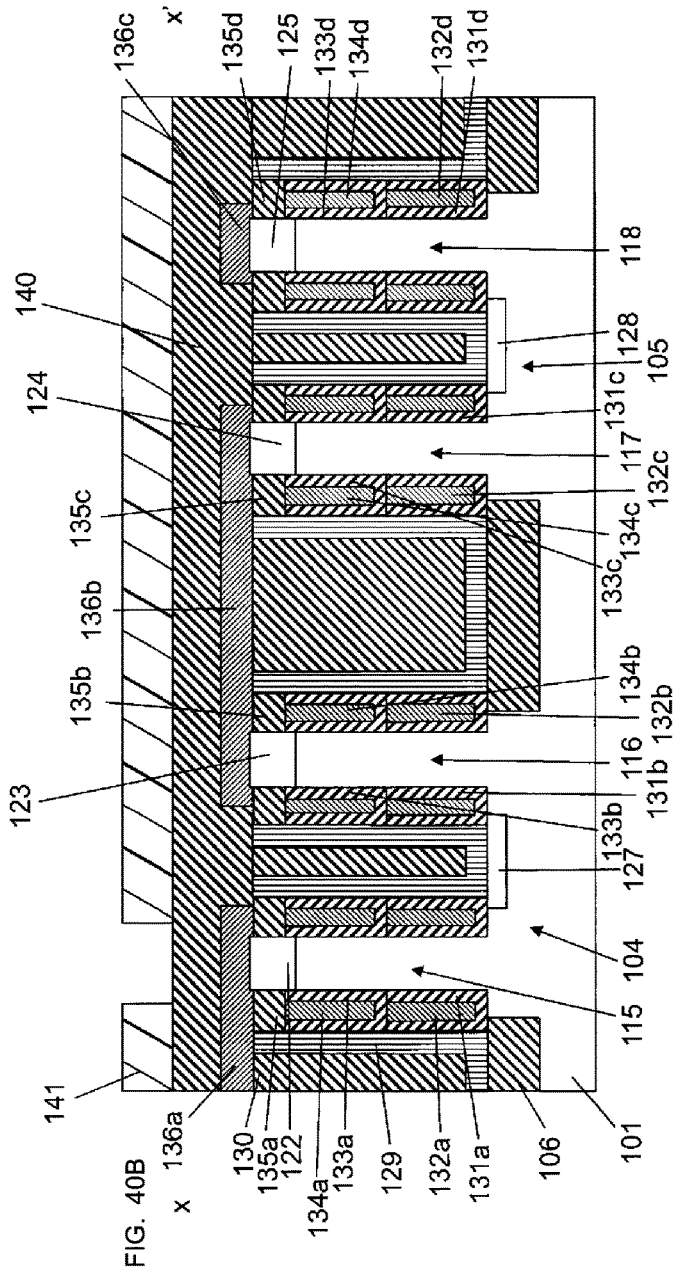
FIG. 40A
FIG. 40B

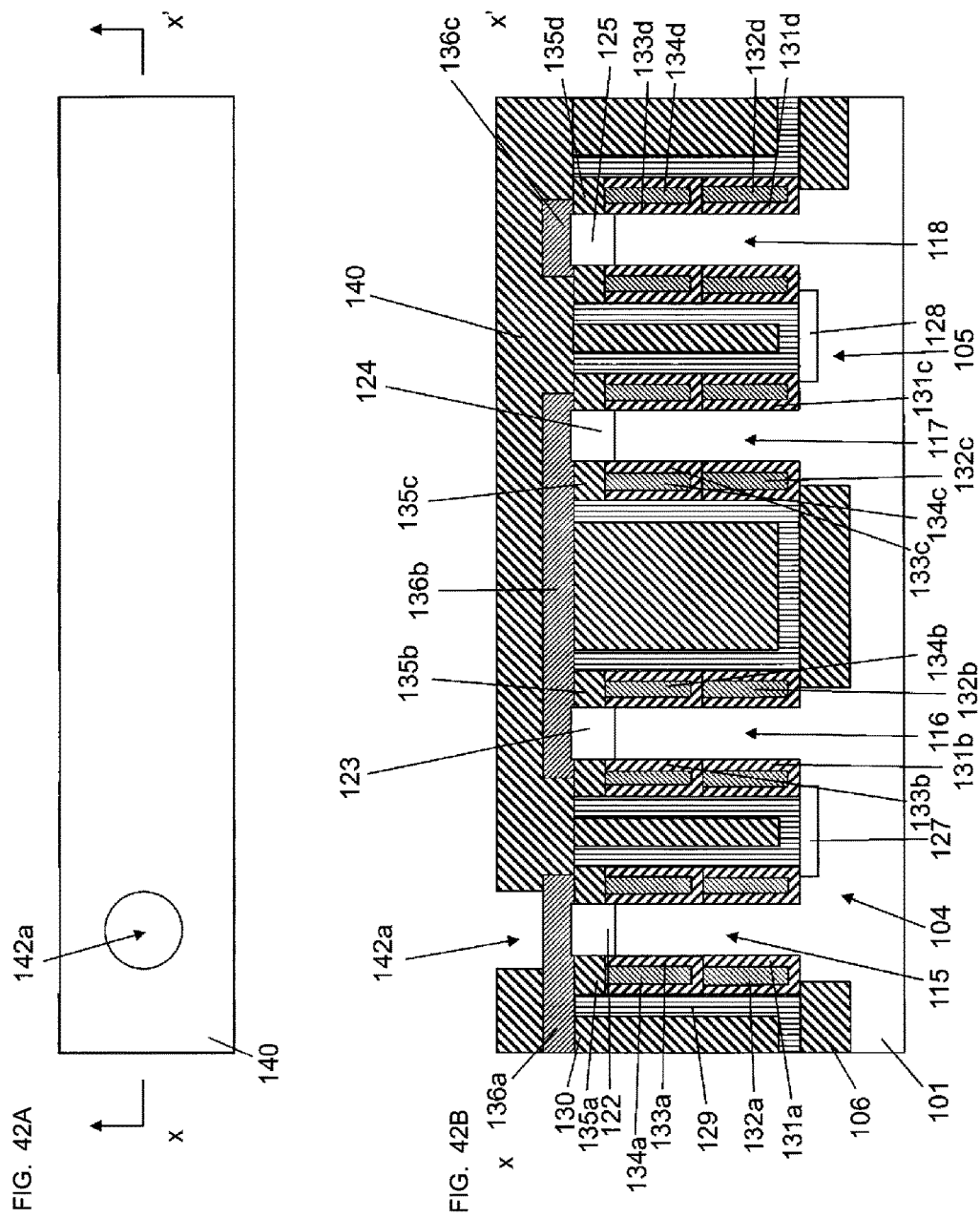

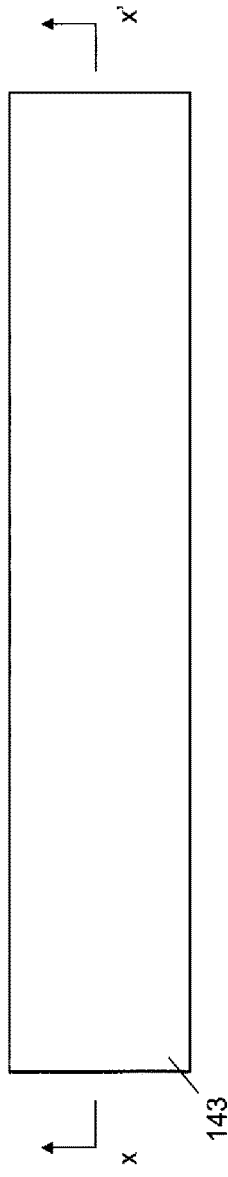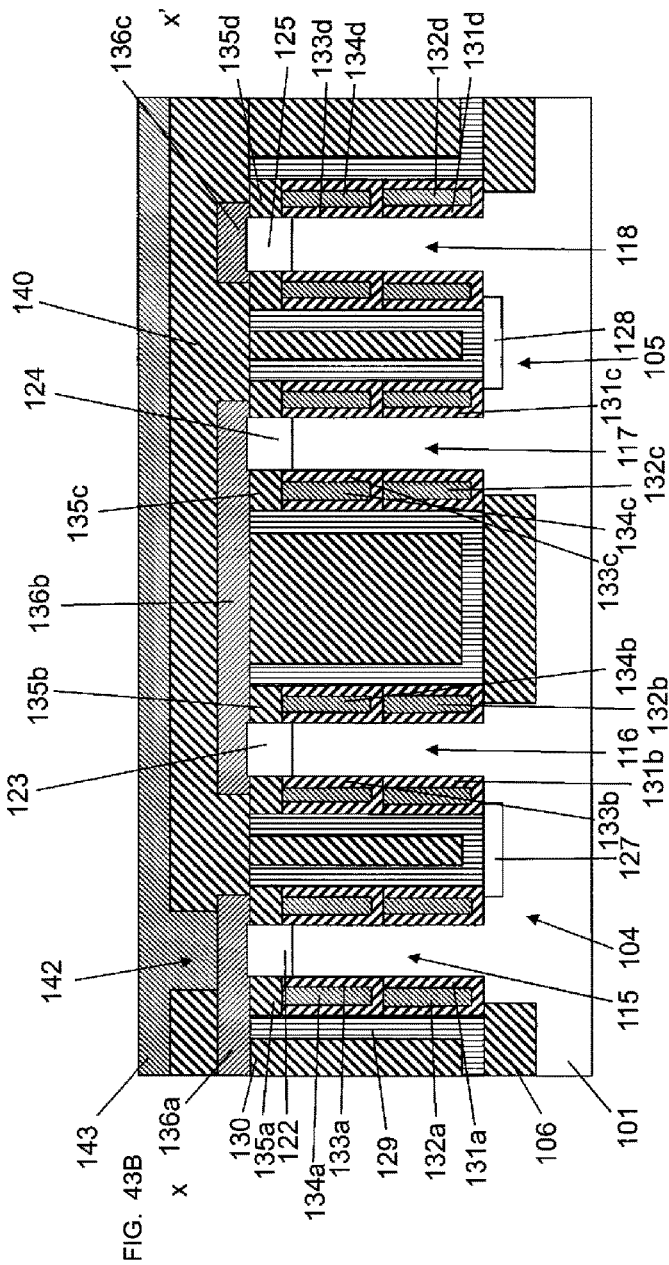
FIG. 43A
FIG. 43B

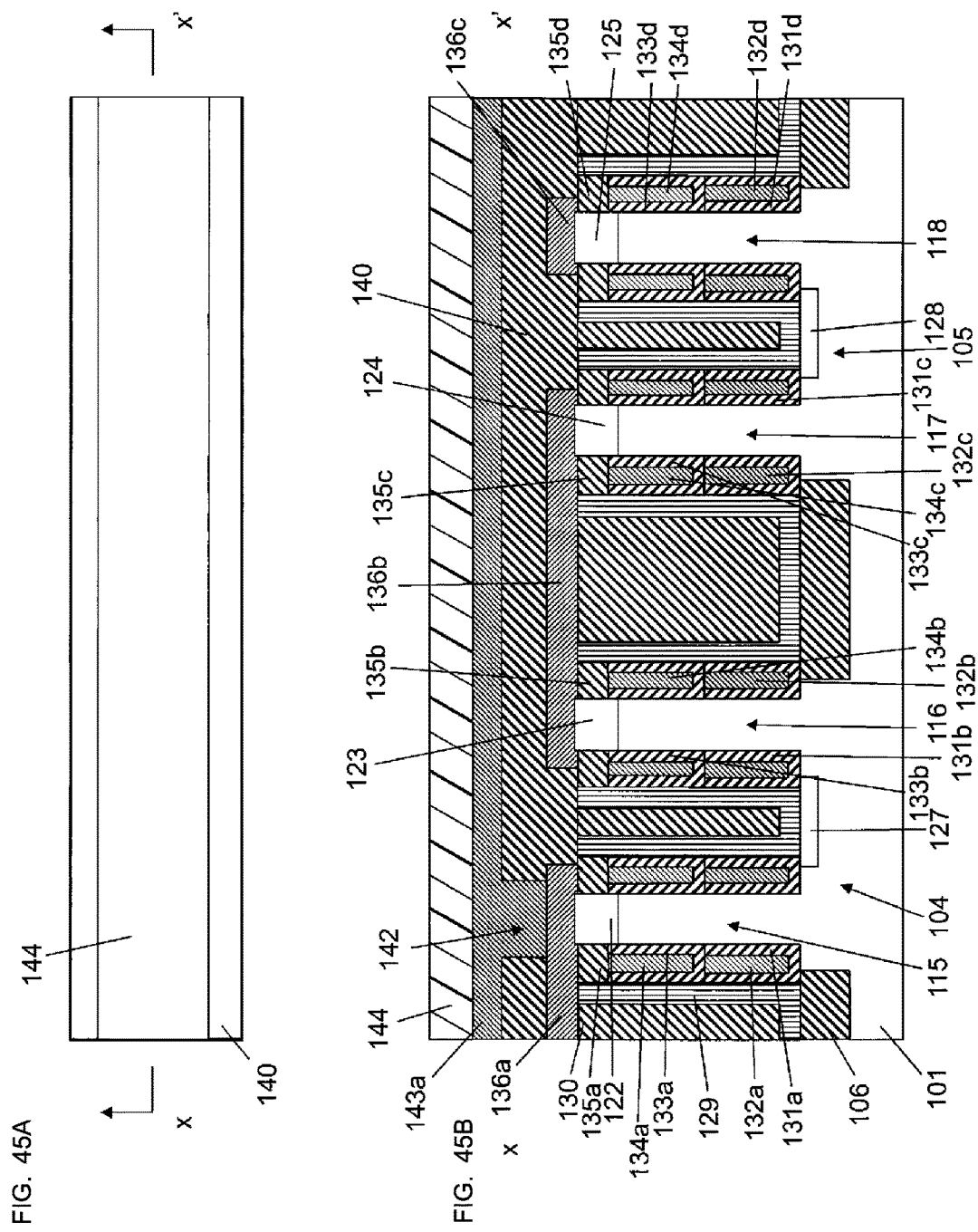

SEMICONDUCTOR DEVICE

CROSS REFERENCE TO RELATED APPLICATIONS

The present invention contains subject matter related to Japanese Patent Application No. 2014-005795 filed at the Japanese Patent Office on Jan. 16, 2014, the entire contents of which are incorporated herein by reference.

BACKGROUND OF THE INVENTION

Field of the Invention

The present invention relates to a semiconductor device.

Recently, there have been proposed semiconductor memory devices in which memory cells are three-dimensionally arranged in order to increase the scale of integration of the semiconductor memory devices (see, for example, Japanese Unexamined Patent Application Publication No. 2007-266143 and Japanese Unexamined Patent Application Publication No. 2013-4690).

According to Japanese Unexamined Patent Application Publication No. 2007-266143, a plurality of memory cells are connected in series in the vertical direction, and a drain selection gate and a source selection gate are respectively formed above and below the plurality of memory cells.

According to Japanese Unexamined Patent Application Publication No. 2013-4690, a plurality of memory cells are connected in series in the vertical direction, and a drain selection gate or a source selection gate is formed above the plurality of memory cells.

Thus, according to Japanese Unexamined Patent Application Publication No. 2007-266143 and Japanese Unexamined Patent Application Publication No. 2013-4690, at least one or two selection gates are formed in addition to an equal number of control gates as the number of memory cells.

The number of fabrication steps increases as the number of gates increases.

In addition, at least one or two selection gates, which do not store any information therein, are formed for each single pillar-shaped semiconductor layer. Further, at least one or two circuits for driving a selection gate are needed for each single pillar-shaped semiconductor layer.

SUMMARY OF THE INVENTION

Accordingly, it is an object of the present invention to provide a structure of a semiconductor device in which the number of selection gates per pillar-shaped semiconductor layer is reduced.

A semiconductor device according to an aspect of the present invention includes a first pillar-shaped semiconductor layer; a first selection gate insulating film surrounding the first pillar-shaped semiconductor layer; a first selection gate surrounding the first selection gate insulating film; a first bit line connected to an upper portion of the first pillar-shaped semiconductor layer; a second pillar-shaped semiconductor layer; a layer including a first charge storage layer, surrounding the second pillar-shaped semiconductor layer; a first control gate surrounding the layer including the first charge storage layer; a layer including a second charge storage layer, the layer being disposed above the first control gate and surrounding the second pillar-shaped semiconductor layer; a second control gate surrounding the layer including the second charge storage layer; a first lower-portion internal line connecting a lower portion of the first pillar-shaped semiconductor layer to a lower portion of the second pillar-shaped semiconductor layer; a third pillar-shaped semiconductor layer; a layer including a third charge storage layer, surrounding the third pillar-shaped semiconductor layer; a third control gate surrounding the layer including the third charge storage layer; a layer including a fourth charge storage layer, the layer being disposed above the third control gate and surrounding the third pillar-shaped semiconductor layer; a fourth control gate surrounding the layer including the fourth charge storage layer; a fourth pillar-shaped semiconductor layer; a second selection gate insulating film surrounding the fourth pillar-shaped semiconductor layer; a second selection gate surrounding the second selection gate insulating film; a first source line connected to an upper portion of the fourth pillar-shaped semiconductor layer; and a second lower-portion internal line connecting a lower portion of the third pillar-shaped semiconductor layer to a lower portion of the fourth pillar-shaped semiconductor layer.

The second control gate and the fourth control gate may be provided in a plurality, and the second control gates and the fourth control gates may be disposed in a direction perpendicular to a substrate.

The semiconductor device may further include a fifth pillar-shaped semiconductor layer; a layer including a fifth charge storage layer, surrounding the fifth pillar-shaped semiconductor layer; a fifth control gate surrounding the layer including the fifth charge storage layer; a layer including a sixth charge storage layer, the layer being disposed above the fifth control gate and surrounding the fifth pillar-shaped semiconductor layer; a sixth control gate surrounding the layer including the sixth charge storage layer; a sixth pillar-shaped semiconductor layer; a layer including a seventh charge storage layer, surrounding the sixth pillar-shaped semiconductor layer; a seventh control gate surrounding the layer including the seventh charge storage layer; a layer including an eighth charge storage layer, the layer being disposed above the seventh control gate and surrounding the sixth pillar-shaped semiconductor layer; an eighth control gate surrounding the layer including the eighth charge storage layer; a third lower-portion internal line connecting a lower portion of the fifth pillar-shaped semiconductor layer to a lower portion of the sixth pillar-shaped semiconductor layer; and a first upper-portion internal line connecting an upper portion of the second pillar-shaped semiconductor layer to an upper portion of the fifth pillar-shaped semiconductor layer.

The sixth control gate and the eighth control gate may be provided in a plurality, and the sixth control gates and the eighth control gates may be disposed in a direction perpendicular to a substrate.

The semiconductor device may further include a seventh pillar-shaped semiconductor layer; a layer including a ninth charge storage layer, surrounding the seventh pillar-shaped semiconductor layer; a ninth control gate surrounding the layer including the ninth charge storage layer; a layer including a tenth charge storage layer, the layer being disposed above the ninth control gate and surrounding the seventh pillar-shaped semiconductor layer; a tenth control gate surrounding the layer including the tenth charge storage layer; an eighth pillar-shaped semiconductor layer; a layer including an eleventh charge storage layer, surrounding the eighth pillar-shaped semiconductor layer; an eleventh control gate surrounding the layer including the eleventh charge storage layer; a layer including a twelfth charge storage layer, the layer being disposed above the eleventh control gate and surrounding the eighth pillar-shaped semiconductor layer; a twelfth control gate surrounding the layer including the twelfth charge storage layer; a fourth lower-portion internal line connecting a lower portion of the seventh pillar-shaped semiconductor layer to a lower portion of the eighth pillar-shaped semiconductor layer; and a second upper-portion internal line connecting an upper portion of the third pillar-shaped semiconductor layer to an upper portion of the eighth pillar-shaped semiconductor layer.

The tenth control gate and the twelfth control gate may be provided in a plurality, and the tenth control gates and the twelfth control gates may be disposed in a direction perpendicular to a substrate.

The semiconductor device may further include a first fin-shaped semiconductor layer disposed below the first pillar-shaped semiconductor layer and the second pillar-shaped semiconductor layer; and a second fin-shaped semiconductor layer disposed below the third pillar-shaped semiconductor layer and the fourth pillar-shaped semiconductor layer, wherein the first lower-portion internal line may be formed in the first fin-shaped semiconductor layer, and the second lower-portion internal line may be formed in the second fin-shaped semiconductor layer.

The semiconductor device may further include a third fin-shaped semiconductor layer disposed below the fifth pillar-shaped semiconductor layer and the sixth pillar-shaped semiconductor layer, wherein the third lower-portion internal line may be formed in the third fin-shaped semiconductor layer.

The semiconductor device may further include a fourth fin-shaped semiconductor layer disposed below the seventh pillar-shaped semiconductor layer and the eighth pillar-shaped semiconductor layer, wherein the fourth lower-portion internal line may be formed in the fourth fin-shaped semiconductor layer.

The semiconductor device may further include a first element separation film disposed around the first fin-shaped semiconductor layer and the second fin-shaped semiconductor layer.

The semiconductor device may further include a third selection gate disposed below the first selection gate.

The semiconductor device may further include a fourth selection gate disposed below the second selection gate.

The semiconductor device may further include a thirteenth control gate disposed below the first selection gate.

The semiconductor device may further include a fourteenth control gate disposed below the second selection gate.

The first lower-portion internal line may be a first diffusion layer and the second lower-portion internal line may be a second diffusion layer.

The third lower-portion internal line may be a third diffusion layer.

The fourth lower-portion internal line may be a fourth diffusion layer.

The semiconductor device may further include a fifth diffusion layer disposed in an upper portion of the first pillar-shaped semiconductor layer; a sixth diffusion layer disposed in an upper portion of the second pillar-shaped semiconductor layer; a seventh diffusion layer disposed in an upper portion of the third pillar-shaped semiconductor layer; and an eighth diffusion layer disposed in an upper portion of the fourth pillar-shaped semiconductor layer.

The semiconductor device may further include a ninth diffusion layer disposed in an upper portion of the fifth pillar-shaped semiconductor layer; and a tenth diffusion layer disposed in an upper portion of the sixth pillar-shaped semiconductor layer.

The semiconductor device may further include an eleventh diffusion layer disposed in an upper portion of the seventh pillar-shaped semiconductor layer; and a twelfth diffusion layer disposed in an upper portion of the eighth pillar-shaped semiconductor layer.

The layer including the first charge storage layer may include a nitride film serving as a charge storage layer.

According to the aspect of the present invention, a structure of a semiconductor device in which the number of selection gates per pillar-shaped semiconductor layer is reduced can be provided.

Pillar-shaped semiconductor layers having a selection gate formed therearound and pillar-shaped semiconductor layers having control gates alone formed therearound are used. Specifically, an "m" number of pillar-shaped semiconductor layers having control gates alone formed therearound are arranged in a line and pillar-shaped semiconductor layers having a selection gate therearound are arranged at the respective ends of the line. The pillar-shaped semiconductor layers are connected to one another by lower-portion internal lines, each of which connects lower portions of adjacent pillar-shaped semiconductor layers, and by upper-portion internal lines, each of which connects upper portions of adjacent pillar-shaped semiconductor layers, to connect memory cells in series. This configuration consequently makes the number of selection gates per pillar-shaped semiconductor layer equal to 2/m.

If m is equal to 32, the number of selection gates per pillar-shaped semiconductor layer is equal to 2/32. If m is equal to 64, the number of selection gates per pillar-shaped semiconductor layer is equal to 2/64. Accordingly, the number of circuits for driving a selection gate can be reduced.

In addition, because pillar-shaped semiconductor layers having control gates alone formed therearound are used, the number of gates can be reduced by one or two. Consequently, the number of fabrication steps can be reduced.

Other features which are considered as characteristic for the invention are set forth in the appended claims.

Although the invention is illustrated and described herein as embodied in semiconductor device it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 2A is a plan view of the semiconductor device according to the embodiment of the present invention and FIG. 2B is a sectional view taken along line X-X' illustrated in FIG. 2A.

FIG. 3A is a plan view illustrating a method for fabricating the semiconductor device according to the embodiment of the present invention and FIG. 3B is a sectional view taken along line X-X' illustrated in FIG. 3A.

FIG. 6A is a plan view illustrating the method for fabricating the semiconductor device according to the embodiment of the present invention and FIG. 6B is a sectional view taken along line X-X' illustrated in FIG. 6A.

FIG. 8A is a plan view illustrating the method for fabricating the semiconductor device according to the embodiment of the present invention and FIG. 8B is a sectional view taken along line X-X' illustrated in FIG. 8A.

FIG. 9A is a plan view illustrating the method for fabricating the semiconductor device according to the embodiment of the present invention and FIG. 9B is a sectional view taken along line X-X' illustrated in FIG. 9A.

FIG. 11A is a plan view illustrating the method for fabricating the semiconductor device according to the embodiment of the present invention and FIG. 11B is a sectional view taken along line X-X' illustrated in FIG. 11A.

FIG. 12A is a plan view illustrating the method for fabricating the semiconductor device according to the embodiment of the present invention and FIG. 12B is a sectional view taken along line X-X' illustrated in FIG. 12A.

FIG. 13A is a plan view illustrating the method for fabricating the semiconductor device according to the embodiment of the present invention and FIG. 13B is a sectional view taken along line X-X' illustrated in FIG. 13A.

FIG. 14A is a plan view illustrating the method for fabricating the semiconductor device according to the embodiment of the present invention and FIG. 14B is a sectional view taken along line X-X' illustrated in FIG. 14A.

FIG. 15A is a plan view illustrating the method for fabricating the semiconductor device according to the embodiment of the present invention and FIG. 15B is a sectional view taken along line X-X' illustrated in FIG. 15A.

FIG. 16A is a plan view illustrating the method for fabricating the semiconductor device according to the embodiment of the present invention and FIG. 16B is a sectional view taken along line X-X' illustrated in FIG. 16A.

FIG. 17A is a plan view illustrating the method for fabricating the semiconductor device according to the embodiment of the present invention and FIG. 17B is a sectional view taken along line X-X' illustrated in FIG. 17A.

FIG. 19A is a plan view illustrating the method for fabricating the semiconductor device according to the embodiment of the present invention and FIG. 19B is a sectional view taken along line X-X' illustrated in FIG. 19A.

FIG. 21A is a plan view illustrating the method for fabricating the semiconductor device according to the embodiment of the present invention and FIG. 21B is a sectional view taken along line X-X' illustrated in FIG. 21A.

FIG. 22A is a plan view illustrating the method for fabricating the semiconductor device according to the embodiment of the present invention and FIG. 22B is a sectional view taken along line X-X' illustrated in FIG. 22A.

FIG. 23A is a plan view illustrating the method for fabricating the semiconductor device according to the embodiment of the present invention and FIG. 23B is a sectional view taken along line X-X' illustrated in FIG. 23A.

FIG. 24A is a plan view illustrating the method for fabricating the semiconductor device according to the embodiment of the present invention and FIG. 24B is a sectional view taken along line X-X' illustrated in FIG. 24A.

FIG. 26A is a plan view illustrating the method for fabricating the semiconductor device according to the embodiment of the present invention and FIG. 26B is a sectional view taken along line X-X' illustrated in FIG. 26A.

FIG. 27A is a plan view illustrating the method for fabricating the semiconductor device according to the embodiment of the present invention and FIG. 27B is a sectional view taken along line X-X' illustrated in FIG. 27A.

FIG. 28A is a plan view illustrating the method for fabricating the semiconductor device according to the embodiment of the present invention and FIG. 28B is a sectional view taken along line X-X' illustrated in FIG. 28A.

FIG. 33A is a plan view illustrating the method for fabricating the semiconductor device according to the embodiment of the present invention and FIG. 33B is a sectional view taken along line X-X' illustrated in FIG. 33A.

FIG. 34A is a plan view illustrating the method for fabricating the semiconductor device according to the embodiment of the present invention and FIG. 34B is a sectional view taken along line X-X' illustrated in FIG. 34A.

FIG. 38A is a plan view illustrating the method for fabricating the semiconductor device according to the embodiment of the present invention and FIG. 38B is a sectional view taken along line X-X' illustrated in FIG. 38A.

FIG. 40A is a plan view illustrating the method for fabricating the semiconductor device according to the embodiment of the present invention and FIG. 40B is a sectional view taken along line X-X' illustrated in FIG. 40A.

FIG. 42A is a plan view illustrating the method for fabricating the semiconductor device according to the embodiment of the present invention and FIG. 42B is a sectional view taken along line X-X' illustrated in FIG. 42A.

FIG. 43A is a plan view illustrating the method for fabricating the semiconductor device according to the embodiment of the present invention and FIG. 43B is a sectional view taken along line X-X' illustrated in FIG. 43A.

FIG. 45A is a plan view illustrating the method for fabricating the semiconductor device according to the embodiment of the present invention and FIG. 45B is a sectional view taken along line X-X' illustrated in FIG. 45A.

DETAILED DESCRIPTION OF THE INVENTION

Figure 1:
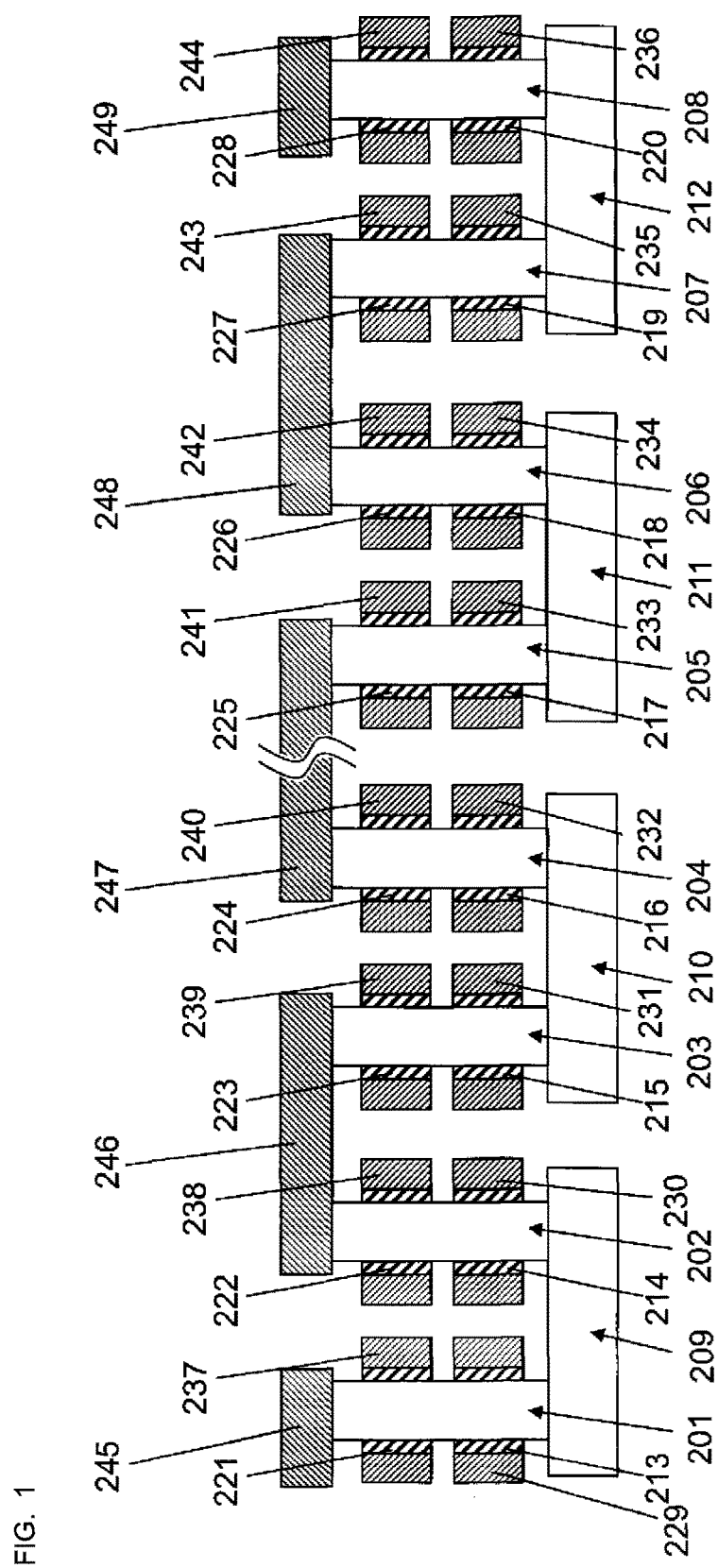
FIG. 1 is a sectional view of a semiconductor device according to an embodiment of the present invention.

FIG. 1 illustrates a structure of a semiconductor device.

The semiconductor device includes a first pillar-shaped semiconductor layer 201, a first selection gate insulating film 221 surrounding the first pillar-shaped semiconductor layer 201, a first selection gate 237 surrounding the first selection gate insulating film 221, and a first bit line 245 connected to an upper portion of the first pillar-shaped semiconductor layer 201.

A third selection gate insulating film 213 surrounding the first pillar-shaped semiconductor layer 201 and a third selection gate 229 surrounding the third selection gate insulating film 213 are disposed below the first selection gate 237.

The third selection gate 229 disposed below the first selection gate 237 may be replaced by a control gate. In addition, the third selection gate insulating film 213 may be replaced by a layer including a charge storage layer.

The semiconductor device also includes a second pillar-shaped semiconductor layer 202, a layer 214 including a first charge storage layer, a first control gate 230, a layer 222 including a second charge storage layer, a second control gate 238, and a first lower-portion internal line 209. The layer 214 including the first charge storage layer surrounds the second pillar-shaped semiconductor layer 202. The first control gate 230 surrounds the layer 214 including the first charge storage layer. The layer 222 including the second charge storage layer is disposed above the first control gate 230 and surrounds the second pillar-shaped semiconductor layer 202. The second control gate 238 surrounds the layer 222 including the second charge storage layer. The first lower-portion internal line 209 connects a lower portion of the first pillar-shaped semiconductor layer 201 to a lower portion of the second pillar-shaped semiconductor layer 202.

A layer including a charge storage layer preferably includes a nitride film as the charge storage layer. A structure in which an oxide film, a nitride film, and an oxide film are laminated may be used. Alternatively, polysilicon may be used as a charge storage film. A structure in which an oxide film, polysilicon, an oxide film are laminated may be used.

The semiconductor device also includes a third pillar-shaped semiconductor layer 207, a layer 219 including a third charge storage layer, a third control gate 235, a layer 227 including a fourth charge storage layer, and a fourth control gate 243. The layer 219 including the third charge storage layer surrounds the third pillar-shaped semiconductor layer 207. The third control gate 235 surrounds the layer 219 including the third charge storage layer. The layer 227 including the fourth charge storage layer is disposed above the third control gate 235 and surrounds the third pillar-shaped semiconductor layer 207. The fourth control gate 243 surrounds the layer 227 including the fourth charge storage layer.

The semiconductor device also includes a fourth pillar-shaped semiconductor layer 208, a second selection gate insulating film 228 surrounding the fourth pillar-shaped semiconductor layer 208, a second selection gate 244 surrounding the second selection gate insulating film 228, a first source line 249 connected to an upper portion of the fourth pillar-shaped semiconductor layer 208, and a second lower-portion internal line 212 that connects a lower portion of the third pillar-shaped semiconductor layer 207 to a lower portion of the fourth pillar-shaped semiconductor layer 208.

A fourth selection gate insulating film 220 surrounding the fourth pillar-shaped semiconductor layer 208 and a fourth selection gate 236 surrounding the fourth selection gate insulating film 220 are disposed below the second selection gate 244.

The fourth selection gate 236 disposed below the second selection gate 244 may be replaced by a control gate. In addition, the fourth selection gate insulating film 220 may be replaced by a layer including a charge storage layer.

The second control gate 238 and the fourth control gate 243 may be provided in a plurality, and the second control gates 238 and the fourth control gates 243 may be disposed in a direction perpendicular or substantially perpendicular to a substrate.

The semiconductor device also includes a fifth pillar-shaped semiconductor layer 203, a layer 215 including a fifth charge storage layer, a fifth control gate 231, a layer 223 including a sixth charge storage layer, and a sixth control gate 239. The layer 215 including the fifth charge storage layer surrounds the fifth pillar-shaped semiconductor layer 203. The fifth control gate 231 surrounds the layer 215 including the fifth charge storage layer. The layer 223 including the sixth charge storage layer is disposed above the fifth control gate 231 and surrounds the fifth pillar-shaped semiconductor layer 203. The sixth control gate 239 surrounds the layer 223 including the sixth charge storage layer.

The semiconductor device also includes a sixth pillar-shaped semiconductor layer 204, a layer 216 including a seventh charge storage layer, a seventh control gate 232, a layer 224 including an eighth charge storage layer, an eighth control gate 240, a third lower-portion internal line 210, and a first upper-portion internal line 246. The layer 216 including the seventh charge storage layer surrounds the sixth pillar-shaped semiconductor layer 204. The seventh control gate 232 surrounds the layer 216 including the seventh charge storage layer. The layer 224 including the eighth charge storage layer is disposed above the seventh control gate 232 and surrounds the sixth pillar-shaped semiconductor layer 204. The eighth control gate 240 surrounds the layer 224 including the eighth charge storage layer. The third lower-portion internal line 210 connects a lower portion of the fifth pillar-shaped semiconductor layer 203 to a lower portion of the sixth pillar-shaped semiconductor layer 204. The first upper-portion internal line 246 connects an upper portion of the second pillar-shaped semiconductor layer 202 to an upper portion of the fifth pillar-shaped semiconductor layer 203. The semiconductor device also includes a third upper-portion internal line 247 that connects an upper portion of the sixth pillar-shaped semiconductor layer 204 to an upper portion of an adjacent pillar-shaped semiconductor layer.

The sixth control gate 239 and the eighth control gate 240 may be provided in a plurality, and the sixth control gates 239 and the eighth control gates 240 may be disposed in a direction perpendicular or substantially perpendicular to the substrate.

The semiconductor device also includes a seventh pillar-shaped semiconductor layer 205, a layer 217 including a ninth charge storage layer, a ninth control gate 233, a layer 225 including a tenth charge storage layer, and a tenth control gate 241. The layer 217 including the ninth charge storage layer surrounds the seventh pillar-shaped semiconductor layer 205. The ninth control gate 233 surrounds the layer 217 including the ninth charge storage layer. The layer 225 including the tenth charge storage layer is disposed above the ninth control gate 233 and surrounds the seventh pillar-shaped semiconductor layer 205. The tenth control gate 241 surrounds the layer 225 including the tenth charge storage layer.

The semiconductor device also includes an eighth pillar-shaped semiconductor layer 206, a layer 218 including an eleventh charge storage layer, an eleventh control gate 234, a layer 226 including a twelfth charge storage layer, a twelfth control gate 242, a fourth lower-portion internal line 211, and a second upper-portion internal line 248. The layer 218 including the eleventh charge storage layer surrounds the eighth pillar-shaped semiconductor layer 206. The eleventh control gate 234 surrounds the layer 218 including the eleventh charge storage layer. The layer 226 including the twelfth charge storage layer is disposed above the eleventh control gate 234 and surrounds the eighth pillar-shaped semiconductor layer 206. The twelfth control gate 242 surrounds the layer 226 including the twelfth charge storage layer. The fourth lower-portion internal line 211 connects a lower portion of the seventh pillar-shaped semiconductor layer 205 to a lower portion of the eighth pillar-shaped semiconductor layer 206. The second upper-portion internal line 248 connects an upper portion of the third pillar-shaped semiconductor layer 207 to an upper portion of the eighth pillar-shaped semiconductor layer 206.

The tenth control gate 241 and the twelfth control gate 242 may be provided in a plurality, and the tenth control gates 241 and the twelfth control gates 242 may be disposed in a direction perpendicular or substantially perpendicular to the substrate.

The first pillar-shaped semiconductor layer 201 and the fourth pillar-shaped semiconductor layer 208 are pillar-shaped semiconductor layers having a selection gate formed therearound. The second pillar-shaped semiconductor layer 202, the third pillar-shaped semiconductor layer 207, the fifth pillar-shaped semiconductor layer 203, the sixth pillar-shaped semiconductor layer 204, the seventh pillar-shaped semiconductor layer 205, and the eighth pillar-shaped semiconductor layer 206 are pillar-shaped semiconductor layers having control gates alone formed therearound.

A number "m" of pillar-shaped semiconductor layers having control gates alone formed therearound (i.e., the pillar-shaped semiconductor layers 202, 203, 204, 205, 206, and 207) are arranged in a line, and the pillar-shaped semiconductor layers 201 and 208 having a selection gate formed therearound are arranged at the respective ends of the line. The pillar-shaped semiconductor layers are connected to one another by the lower-portion internal lines 209, 210, 211, and 212, each of which connects lower portions of adjacent pillar-shaped semiconductor layers, and by the upper-portion internal lines 246, 247, and 248, each of which connects upper portions of adjacent pillar-shaped semiconductor layers, to connect the memory cells in series. This configuration consequently makes the number of selection gates per pillar-shaped semiconductor layer equal to 2/m.

If m is equal to 32, the number of selection gates per pillar-shaped semiconductor layer is equal to 2/32. If m is equal to 64, the number of selection gates per pillar-shaped semiconductor layer is equal to 2/64. Accordingly, the number of circuits for driving a selection gate can be reduced.

In addition, because pillar-shaped semiconductor layers having control gates alone formed therearound are used, the number of gates can be reduced by one or two. As a result, the number of fabrication steps can be reduced.

FIGS. 2A and 2B illustrate a structure of the semiconductor device. A silicon layer is used as a semiconductor layer. Another material may be used to form the semiconductor layer.

The semiconductor device includes a first pillar-shaped silicon layer 115, a first selection gate insulating film 133a surrounding the first pillar-shaped silicon layer 115, a first selection gate 134a surrounding the first selection gate insulating film 133a, and a first bit line 136a connected to an upper portion of the first pillar-shaped silicon layer 115.

A third selection gate insulating film 131a surrounding the first pillar-shaped silicon layer 115 and a third selection gate 132a surrounding the third selection gate insulating film 131a are disposed below the first selection gate 134a.

The third selection gate 132a disposed below the first selection gate 134a may be replaced by a control gate. In addition, the third selection gate insulating film 131a may be replaced by a layer including a charge storage layer.

The semiconductor device also includes a second pillar-shaped silicon layer 116, a layer 131b including a first charge storage layer, a first control gate 132b, a layer 133b including a second charge storage layer, a second control gate 134b, and a first diffusion layer 127. The layer 131b including the first charge storage layer surrounds the second pillar-shaped silicon layer 116. The first control gate 132b surrounds the layer 131b including the first charge storage layer. The layer 133b including the second charge storage layer is disposed above the first control gate 132b and surrounds the second pillar-shaped silicon layer 116. The second control gate 134b surrounds the layer 133b including the second charge storage layer. The first diffusion layer 127 serves as the first lower-portion internal line that connects a lower portion of the first pillar-shaped silicon layer 115 to a lower portion of the second pillar-shaped silicon layer 116.

The semiconductor device also includes a first fin-shaped silicon layer 104 disposed below the first pillar-shaped silicon layer 115 and the second pillar-shaped silicon layer 116. The first lower-portion internal line is formed as the first diffusion layer 127 in the first fin-shaped silicon layer 104.

The semiconductor device also includes a fifth diffusion layer 122 disposed in an upper portion of the first pillar-shaped silicon layer 115 and a sixth diffusion layer 123 disposed in an upper portion of the second pillar-shaped silicon layer 116.

The semiconductor device also includes a third pillar-shaped silicon layer 117, a layer 131c including a third charge storage layer, a third control gate 132c, a layer 133c including a fourth charge storage layer, and a fourth control gate 134c. The layer 131c including the third charge storage layer surrounds the third pillar-shaped silicon layer 117. The third control gate 132c surrounds the layer 131c including the third charge storage layer. The layer 133c including the fourth charge storage layer is disposed above the third control gate 132c and surrounds the third pillar-shaped silicon layer 117. The fourth control gate 134c surrounds the layer 133c including the fourth charge storage layer.

The semiconductor device also includes a fourth pillar-shaped silicon layer 118, a second selection gate insulating film 133d surrounding the fourth pillar-shaped silicon layer 118, a second selection gate 134d surrounding the second selection gate insulating film 133d, a first source line 136c connected to an upper portion of the fourth pillar-shaped silicon layer 118, and a second diffusion layer 128 that serves as the second lower-portion internal line that connects a lower portion of the third pillar-shaped silicon layer 117 to a lower portion of the fourth pillar-shaped silicon layer 118.

A fourth selection gate insulating film 131d surrounding the fourth pillar-shaped silicon layer 118 and a fourth selection gate 132d surrounding the fourth selection gate insulating film 131d are disposed below the second selection gate 134d.

The fourth selection gate 132d disposed below the second selection gate 134d may be replaced by a control gate. In addition, the fourth selection gate insulating film 131d may be replaced by a layer including a charge storage layer.

The semiconductor device also includes a second fin-shaped silicon layer 105 disposed below the third pillar-shaped silicon layer 117 and the fourth pillar-shaped silicon layer 118. The second lower-portion internal line is formed as the second diffusion layer 128 in the second fin-shaped silicon layer 105.

A first element separation film is disposed around the first fin-shaped silicon layer 104 and around the second fin-shaped silicon layer 105.

Because the first element separation film disposed around the first and second fin-shaped semiconductor layers 104 and 105 enables separation of elements, memory strings can be formed.

The semiconductor device also includes a seventh diffusion layer 124 disposed in an upper portion of the third pillar-shaped silicon layer 117 and an eighth diffusion layer 125 disposed in an upper portion of the fourth pillar-shaped silicon layer 118.

The semiconductor device also includes an upper-portion internal line 136b that connects an upper portion of the second pillar-shaped silicon layer 116 to an upper portion of the third pillar-shaped silicon layer 117.

The first bit line 136a is connected to a second bit line 143a via a contact 142.

Because the pillar-shaped silicon layers are disposed on the fin-shaped silicon layers disposed on a substrate, the pillar-shaped silicon layers are a single crystal. Thus, a reduction in the mobility of charges due to a grain boundary can be avoided, and consequently a reduction in the read speed due to a grain boundary can be avoided.

The control gates can be insulated from the pillar-shaped silicon layers and the fin-shaped silicon layers by the layers including a charge storage layer that are disposed around and on bottom portions of the control gates.

In addition, the selection gates can be insulated from the pillar-shaped silicon layers and the selection gates or control gates by the selection gate insulating films disposed around and on bottom portions of the selection gates.

A fabrication process for forming the structure of the semiconductor device according to the embodiment of the present invention will be described below with reference to FIGS. 3A to 46B. Although a silicon substrate is used in this exemplary embodiment, any other semiconductor substrate may be used.

As illustrated in FIGS. 3A and 3B, first resists 102 and 103 used to form fin-shaped silicon layers are formed on a silicon substrate 101.

Figure 4A:
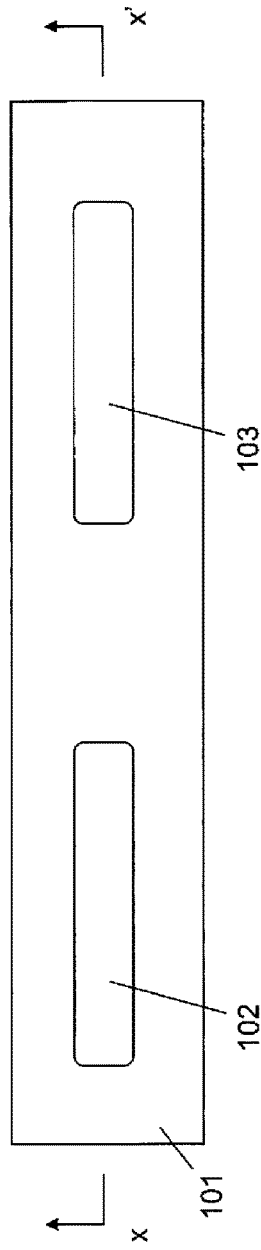
FIG. 4A is a plan view illustrating the method for fabricating the semiconductor device according to the embodiment of the present invention and FIG. 4B is a sectional view taken along line X-X' illustrated in FIG. 4A.
Figure 4B:
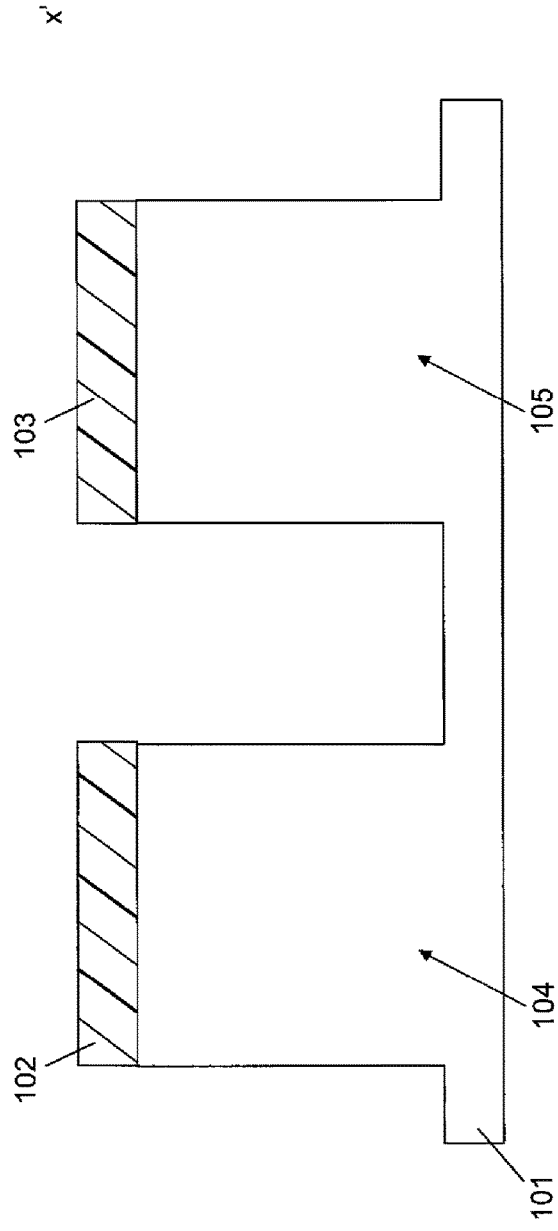

As illustrated in FIGS. 4A and 4B, the silicon substrate 101 is etched so as to form the first fin-shaped silicon layer 104 and the second fin-shaped silicon layer 105. In this case, the first fin-shaped silicon layer 104 and the second fin-shaped silicon layer 105 are formed by using the first resists 102 and 103 as a mask; however, a hard mask such as an oxide film or a nitride film may be used.

Figure 5A:
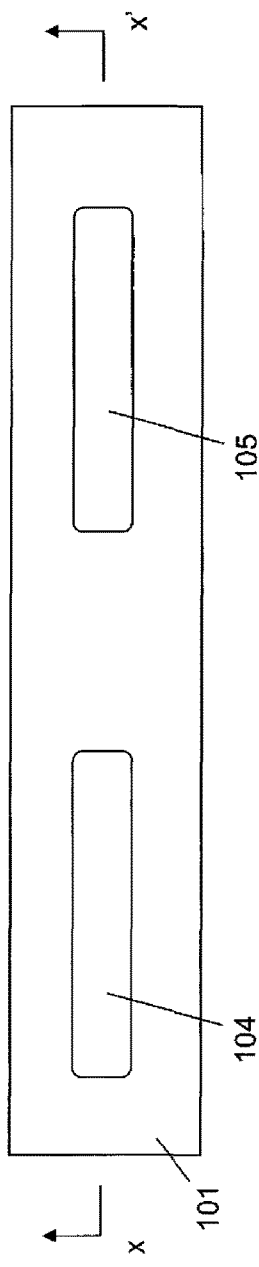
FIG. 5A is a plan view illustrating the method for fabricating the semiconductor device according to the embodiment of the present invention and FIG. 5B is a sectional view taken along line X-X' illustrated in FIG. 5A.
Figure 5B:
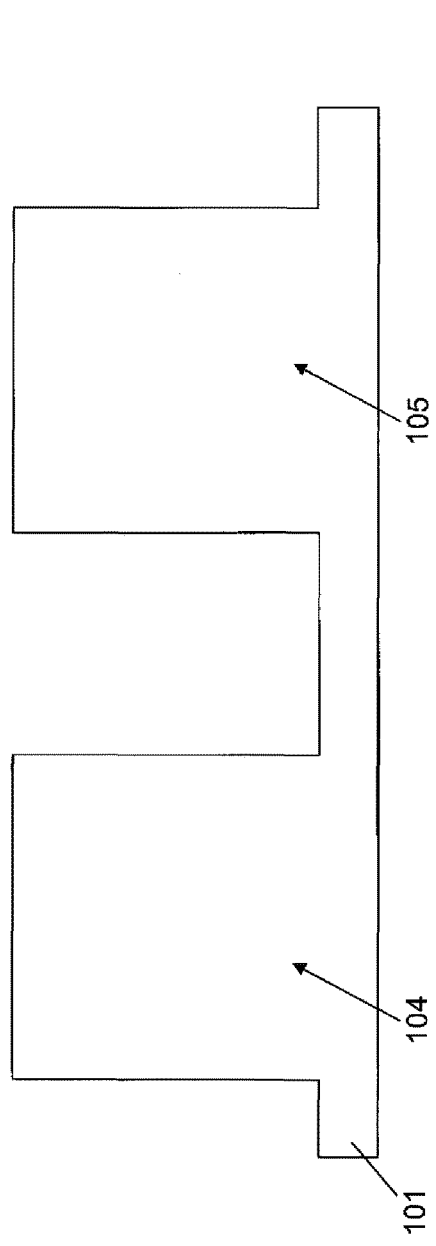

As illustrated in FIGS. 5A and 5B, the first resists 102 and 103 are removed.

As illustrated in FIGS. 6A and 6B, a first element separation film 106 is deposited around the first fin-shaped silicon layer 104 and the second fin-shaped silicon layer 105. An oxide film obtained by using high-density plasma or by low-pressure chemical vapor deposition (CVD) may be used as the first element separation film 106.

Figure 7A:
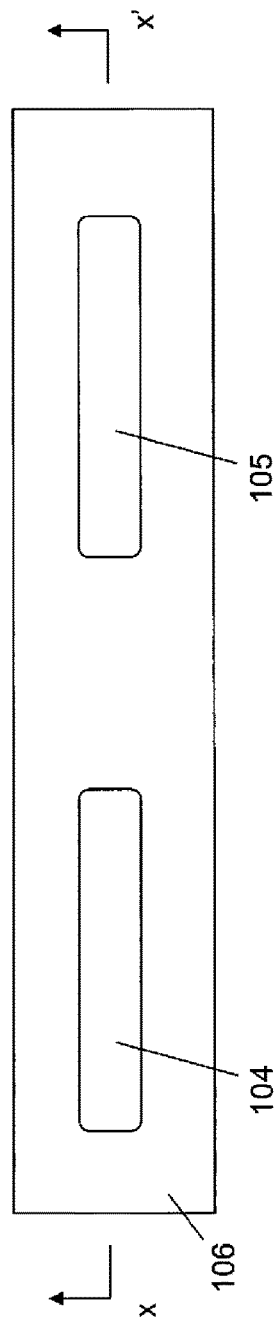
FIG. 7A is a plan view illustrating the method for fabricating the semiconductor device according to the embodiment of the present invention and FIG. 7B is a sectional view taken along line X-X' illustrated in FIG. 7A.
Figure 7B:
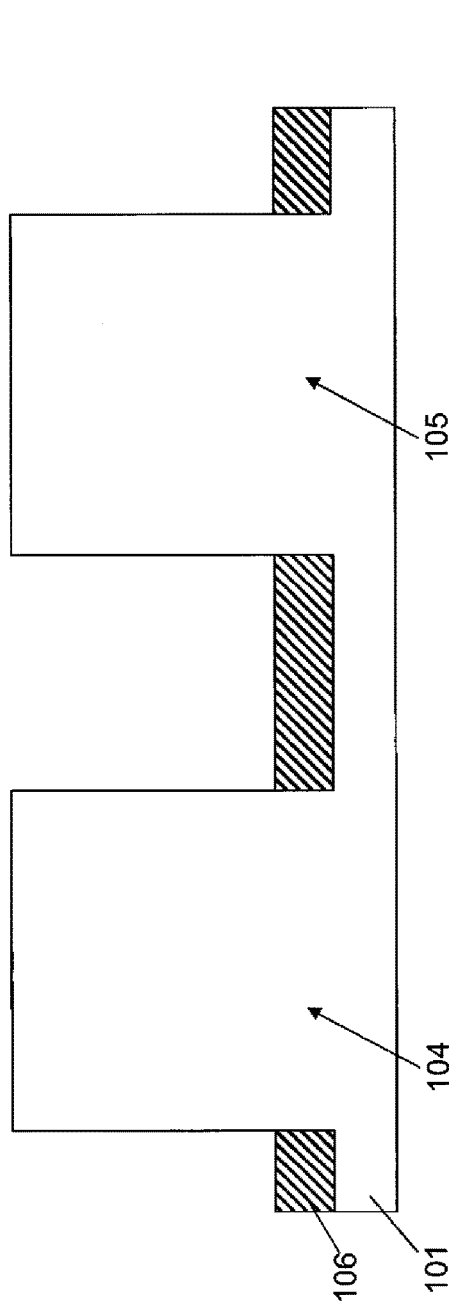

As illustrated in FIGS. 7A and 7B, the first element separation film 106 is etched-back so as to expose upper portions of the first fin-shaped silicon layer 104 and the second fin-shaped silicon layer 105.

As illustrated in FIGS. 8A and 8B, second insulating films 107 and 108 are formed over the first fin-shaped silicon layer 104 and the second fin-shaped silicon layer 105, respectively. The second insulating films 107 and 108 are preferably oxide films.

As illustrated in FIGS. 9A and 9B, a first polysilicon 109 is deposited on the second insulating films 107 and 108 for planarization.

Figure 10A:
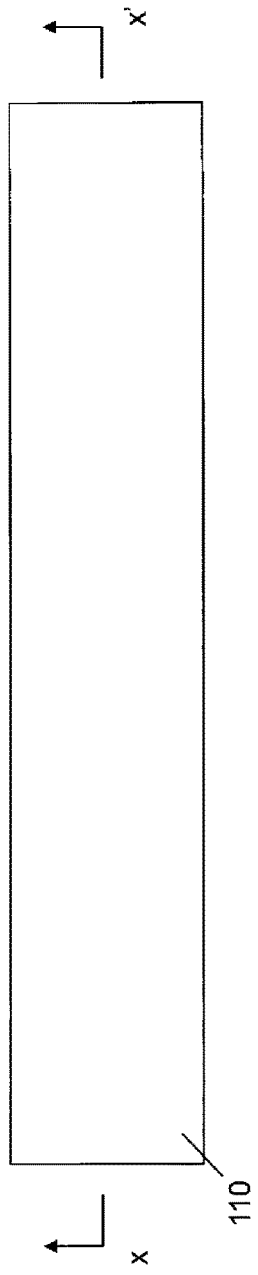
FIG. 10A is a plan view illustrating the method for fabricating the semiconductor device according to the embodiment of the present invention and FIG. 10B is a sectional view taken along line X-X' illustrated in FIG. 10A.
Figure 10B:
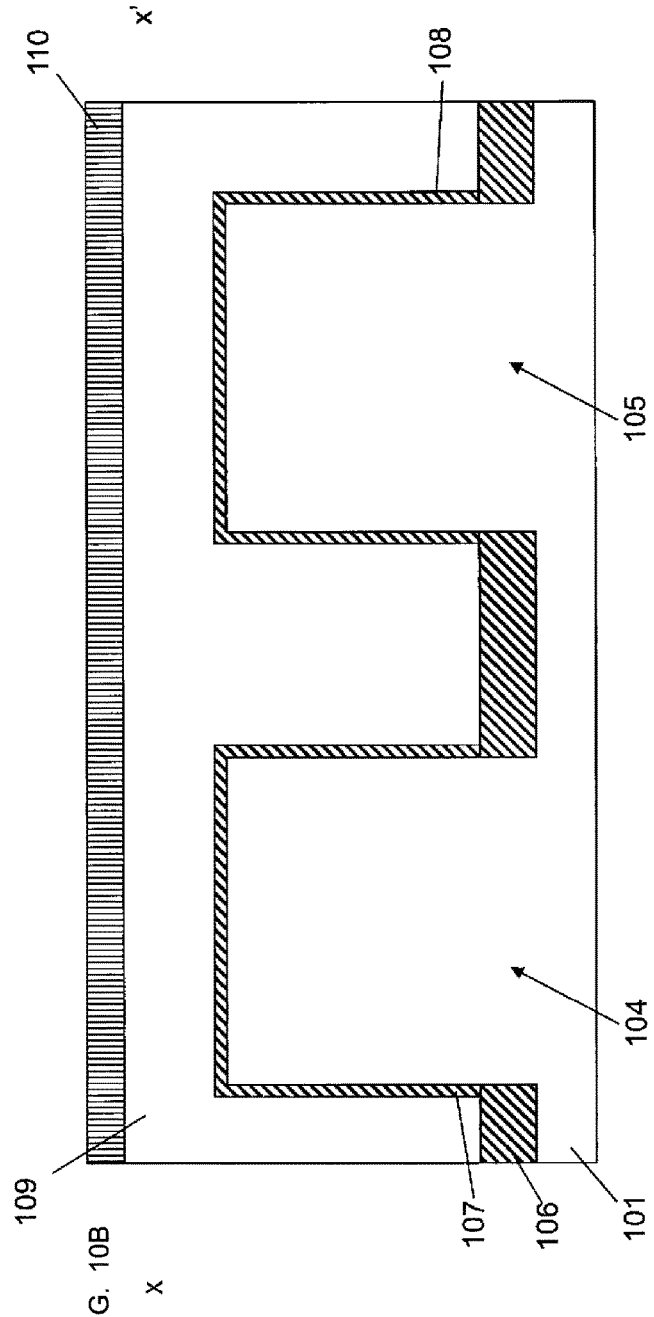

As illustrated in FIGS. 10A and 10B, a third insulating film 110 is formed on the first polysilicon 109. The third insulating film 110 is preferably a nitride film.

As illustrated in FIGS. 11A and 11B, second resists 111, 112, 113, and 114 are formed in a direction perpendicular or substantially perpendicular to a direction in which the first fin-shaped silicon layer 104 and the second fin-shaped silicon layer 105 extend.

As illustrated in FIGS. 12A and 12B, the third insulating film 110, the first polysilicon 109, the second insulating films 107 and 108, the first fin-shaped silicon layer 104, and the second fin-shaped silicon layer 105 are etched so as to form the first pillar-shaped silicon layer 115, the second pillar-shaped silicon layer 116, the third pillar-shaped silicon layer 117, and the fourth pillar-shaped silicon layer 118 and form first dummy gates 109a, 109b, 109c, and 109d formed of the first polysilicon 109. At this time, the third insulating film 110 is separated into third insulating films 110a, 110b, 110c, and 110d. In addition, the second insulating films 107 and 108 are separated into second insulating films 107a, 107b, 108a, and 108b. If the second resists 111, 112, 113, and 114 are removed during etching, the third insulating films 110a, 110b, 110c, and 110d function as a hard mask. If the second resists 111, 112, 113, and 114 are not removed during etching, the third insulating films 110a, 110b, 110c, and 110d are not used.

As illustrated in FIGS. 13A and 13B, the second resists 111, 112, 113, and 114 are removed.

As illustrated in FIGS. 14A and 14B, fourth insulating films 119 and 120 are formed around the first pillar-shaped silicon layer 115, the second pillar-shaped silicon layer 116, the third pillar-shaped silicon layer 117, the fourth pillar-shaped silicon layer 118, and the first dummy gates 109a, 109b, 109c, and 109d.

As illustrated in FIGS. 15A and 15B, a third resist 121 is formed and then is etched-back so as to expose upper portions of the first pillar-shaped silicon layer 115, the second pillar-shaped silicon layer 116, the third pillar-shaped silicon layer 117, and the fourth pillar-shaped silicon layer 118.

As illustrated in FIGS. 16A and 16B, an impurity such as arsenic, phosphorus, or boron is implanted so as to form the fifth diffusion layer 112, the sixth diffusion layer 123, the seventh diffusion layer 124, and the eighth diffusion layer 125 in upper portions of the first pillar-shaped silicon layer 115, the second pillar-shaped silicon layer 116, the third pillar-shaped silicon layer 117, and the fourth pillar-shaped silicon layer 118, respectively.

As illustrated in FIGS. 17A and 17B, the third resist 121 is removed.

Figure 18A:
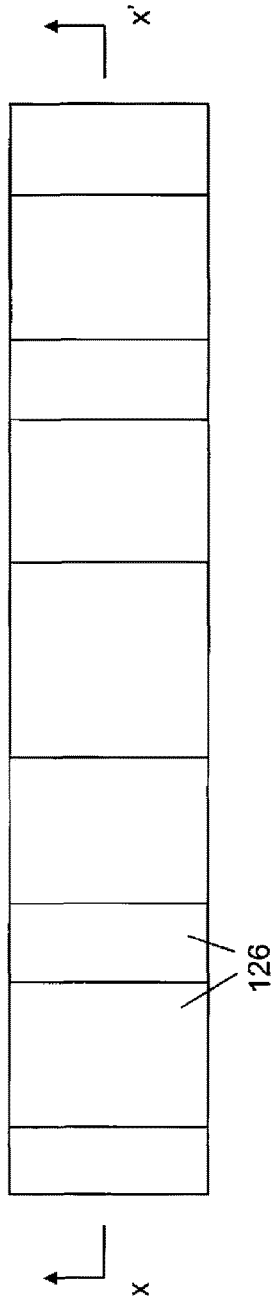
FIG. 18A is a plan view illustrating the method for fabricating the semiconductor device according to the embodiment of the present invention and FIG. 18B is a sectional view taken along line X-X' illustrated in FIG. 18A.
Figure 18B:
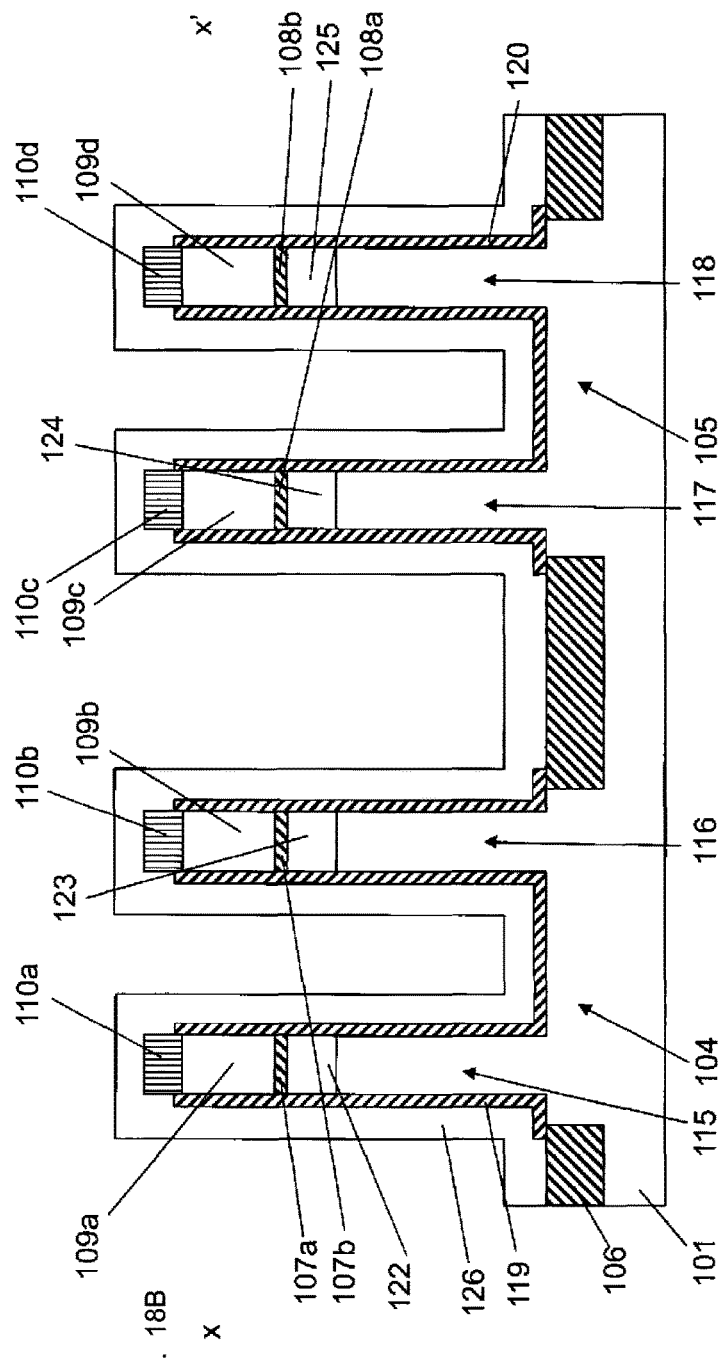

As illustrated in FIGS. 18A and 18B, a second polysilicon 126 is deposited over the fourth insulating films 119 and 120.

As illustrated in FIGS. 19A and 19B, the second polysilicon 126 is etched so that the second polysilicon 126 remains on sidewalls of the first dummy gates 109a, 109b, 109c, and 109d and of the first pillar-shaped silicon layer 115, the second pillar-shaped silicon layer 116, the third pillar-shaped silicon layer 117, and the fourth pillar-shaped silicon layer 118 so as to form second dummy gates 126a, 126b, 126c, and 126d, respectively. At this time, the fourth insulating films 119 and 120 may be separated into fourth insulating films 119a, 119b, 120a, and 120b. An impurity is implanted so as to form the first diffusion layer 127 and the second diffusion layer 128 in upper portions of the first fin-shaped silicon layer 104 and the second fin-shaped silicon layer 105, respectively. In the case of forming n-type diffusion layers, it is preferable to implant arsenic or phosphorus. In the case of forming p-type diffusion layers, it is preferable to implant boron. The diffusion layers may be formed after sidewalls formed of a fifth insulating film 129 is formed, which will be described later.

Figure 20A:
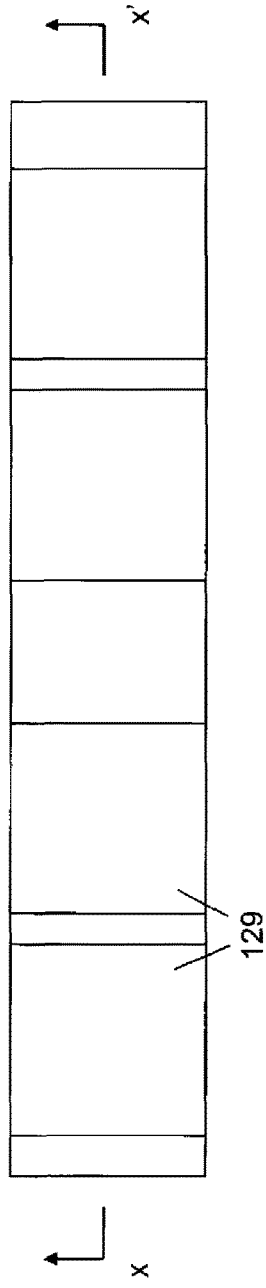
FIG. 20A is a plan view illustrating the method for fabricating the semiconductor device according to the embodiment of the present invention and FIG. 20B is a sectional view taken along line X-X' illustrated in FIG. 20A.
Figure 20B:
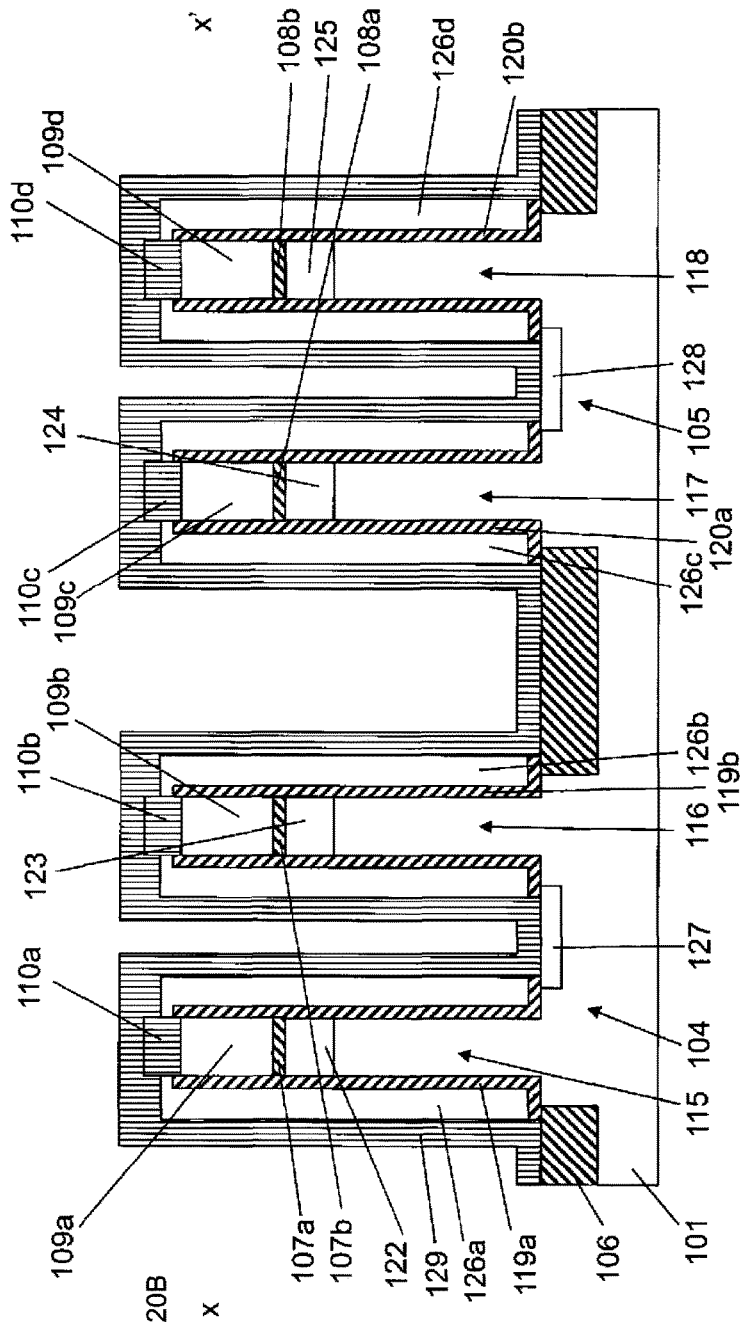

As illustrated in FIGS. 20A and 20B, the fifth insulating film 129 is formed over the second dummy gates 126a, 126b, 126c, and 126d. The fifth insulating film 129 is preferably a nitride film. Then, the fifth insulating film 129 is etched so that the fifth insulating film 129 remains as a sidewall. In this way, a sidewall formed of the fifth insulating film 129 is formed. Metal-semiconductor compound layers may be formed on the first diffusion layer 127 and the second diffusion layer 128.

As illustrated in FIGS. 21A and 21B, an interlayer insulating film 130 is deposited. A contact stopper film may be used.

As illustrated in FIGS. 22A and 22B, chemical mechanical polishing is performed so as to expose the upper portions of the first dummy gates 109a, 109b, 109c, and 109d and the second dummy gates 126a, 126b, 126c, and 126d.

As illustrated in FIGS. 23A and 23B, the first dummy gates 109a, 109b, 109c, and 109d and the second dummy gates 126a, 126b, 126c, and 126d are removed.

As illustrated in FIGS. 24A and 24B, the second insulating films 107a, 107b, 108a, and 108b and the fourth insulating films 119a, 119b, 120a, and 120b are removed.

Figure 25A:
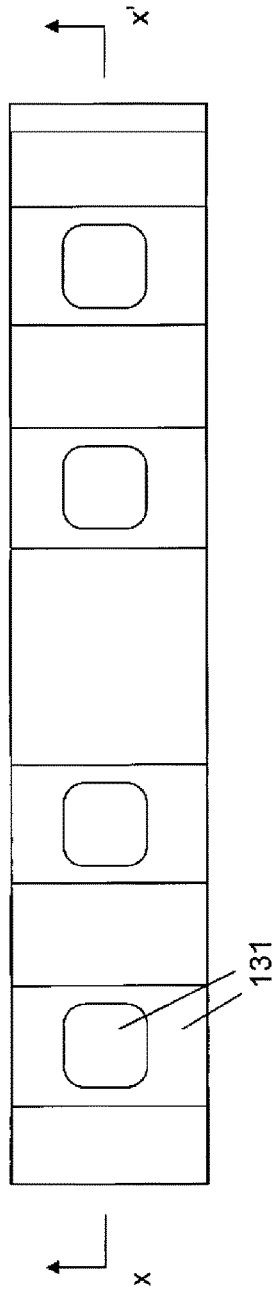
FIG. 25A is a plan view illustrating the method for fabricating the semiconductor device according to the embodiment of the present invention and FIG. 25B is a sectional view taken along line X-X' illustrated in FIG. 25A.
Figure 25B:
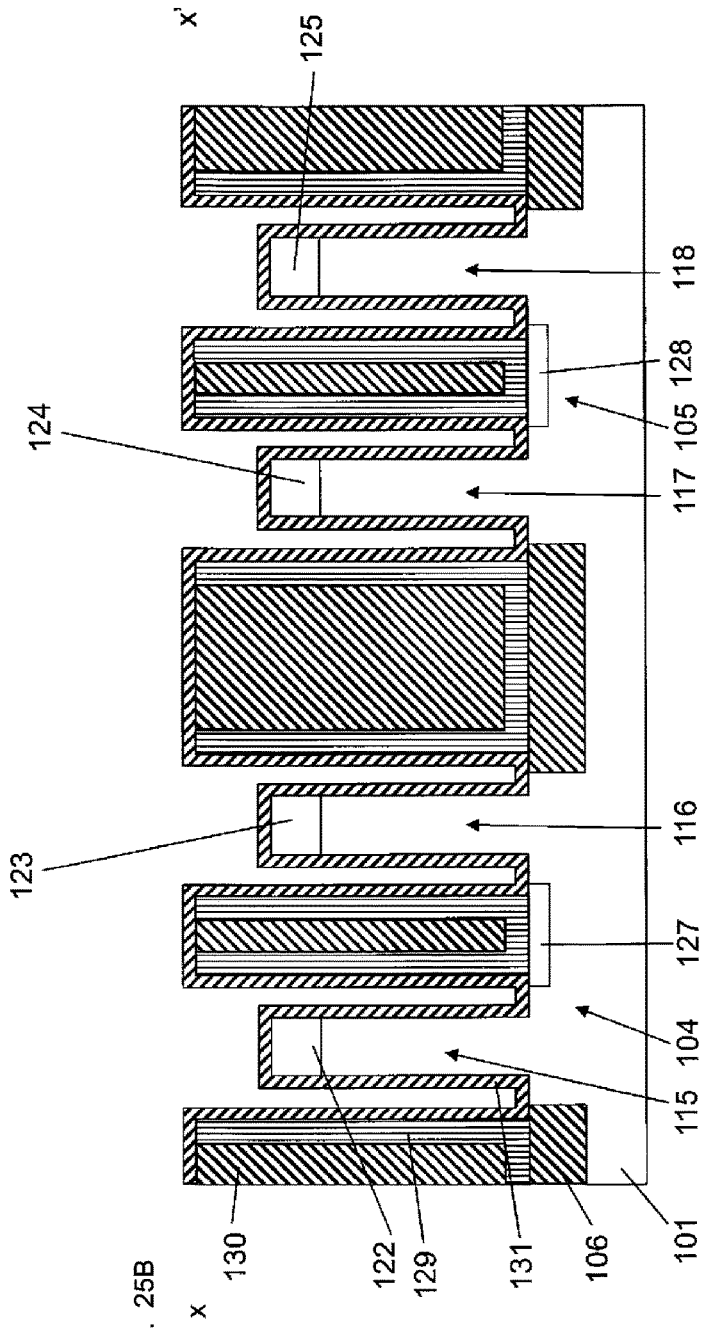

As illustrated in FIGS. 25A and 25B, a layer 131 having a charge storage layer is formed over the first pillar-shaped silicon layer 115, the second pillar-shaped silicon layer 116, the third pillar-shaped silicon layer 117, and the fourth pillar-shaped silicon layer 118, and on the inner side of the fifth insulating film 129. The layer 131 including a charge storage layer preferably includes a nitride film. The layer 131 including a charge storage layer may have a structure in which an oxide film, a nitride film, and an oxide film are laminated. In this exemplary fabrication method, an insulating film including a nitride film is used as the layer 131 including a charge storage layer. Because the layer 131 including a charge storage layer is formed of an insulating film, the layer 131 can be used as a selection gate insulating film.

As illustrated in FIGS. 26A and 26B, a gate conductive film 132 is deposited. The gate conductive film 132 is preferably formed of a metal.

As illustrated in FIGS. 27A and 27B, the gate conductive film 132 is etched-back so as to form the third selection gate 132a around the first pillar-shaped silicon layer 115, the first control gate 132b around the second pillar-shaped silicon layer 116, the third control gate 132c around the third pillar-shaped silicon layer 117, and the fourth selection gate 132d around the fourth pillar-shaped silicon layer 118.

As illustrated in FIGS. 28A and 28B, an exposed portion of the layer 131 including a charge storage layer is removed. Consequently, the layer 131 including a charge storage layer is separated into the third selection gate insulating film 131a, the layer 131b including the first charge storage layer, the layer 131c including the third charge storage layer, and the fourth selection gate insulating film 131d.

Figure 29A:
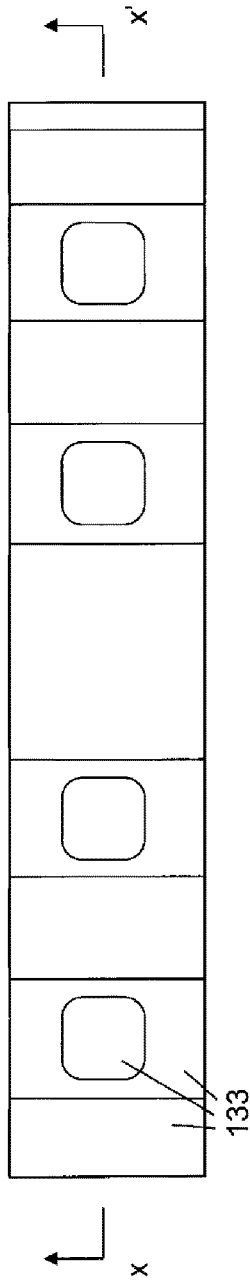
FIG. 29A is a plan view illustrating the method for fabricating the semiconductor device according to the embodiment of the present invention and FIG. 29B is a sectional view taken along line X-X' illustrated in FIG. 29A.
Figure 29B:
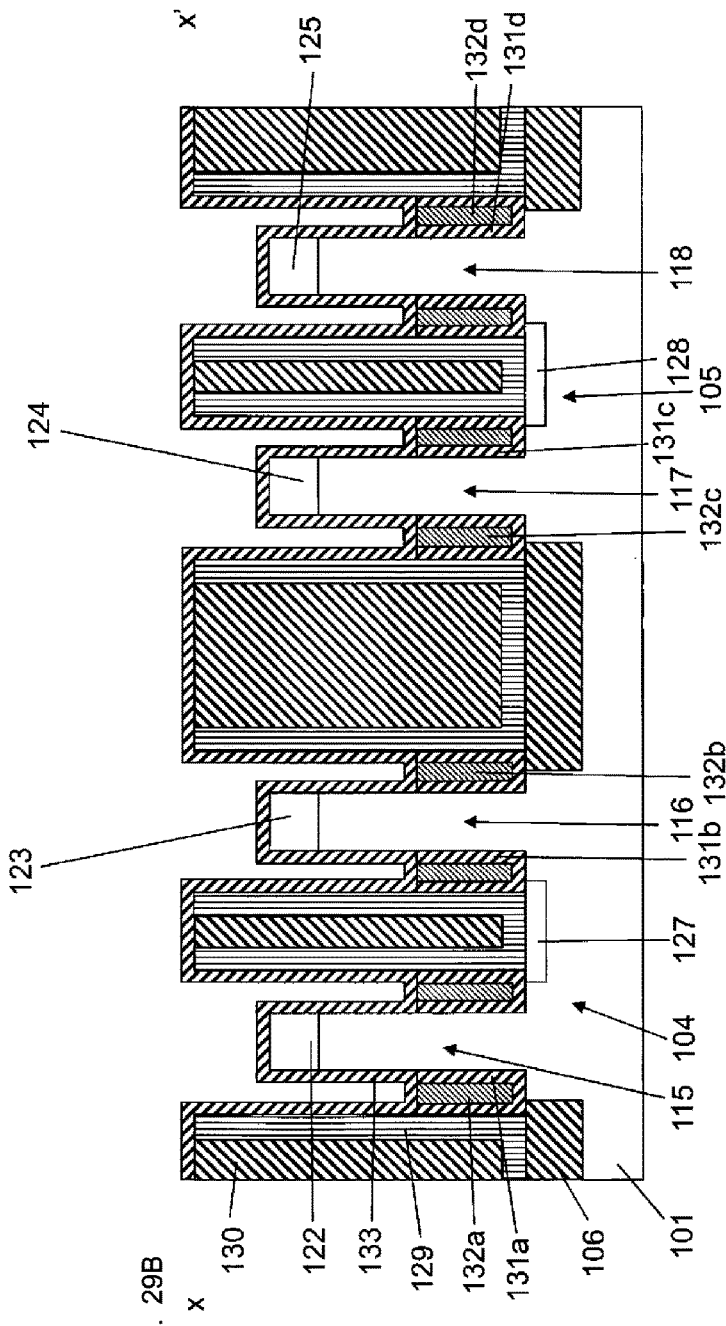

As illustrated in FIGS. 29A and 29B, a layer 133 including a charge storage layer is formed over the first pillar-shaped silicon layer 115, the second pillar-shaped silicon layer 116, the third pillar-shaped silicon layer 117, and the fourth pillar-shaped silicon layer 118 and on the inner side of the fifth insulating film 129. The layer 133 including a charge storage layer preferably includes a nitride film. The layer 133 including a charge storage layer may have a structure in which an oxide film, a nitride film, and an oxide film are laminated. In this exemplary fabrication method, an insulating film including a nitride film is used as the layer 133 including a charge storage layer. Because the layer 133 including a charge storage layer is formed of an insulating film, the layer 133 can be used as a selection gate insulating film.

Figure 30A:
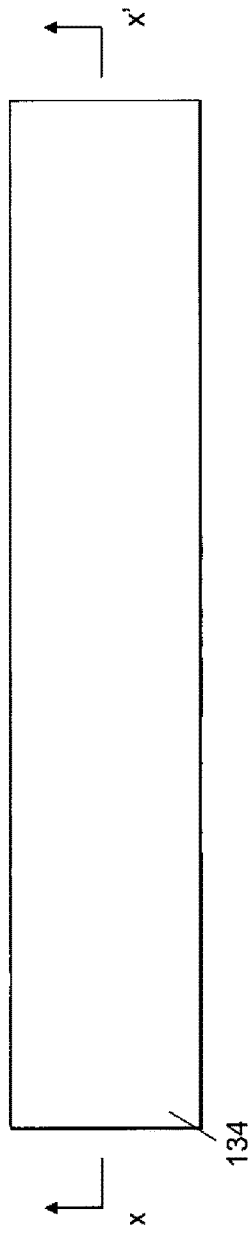
FIG. 30A is a plan view illustrating the method for fabricating the semiconductor device according to the embodiment of the present invention and FIG. 30B is a sectional view taken along line X-X' illustrated in FIG. 30A.
Figure 30B:
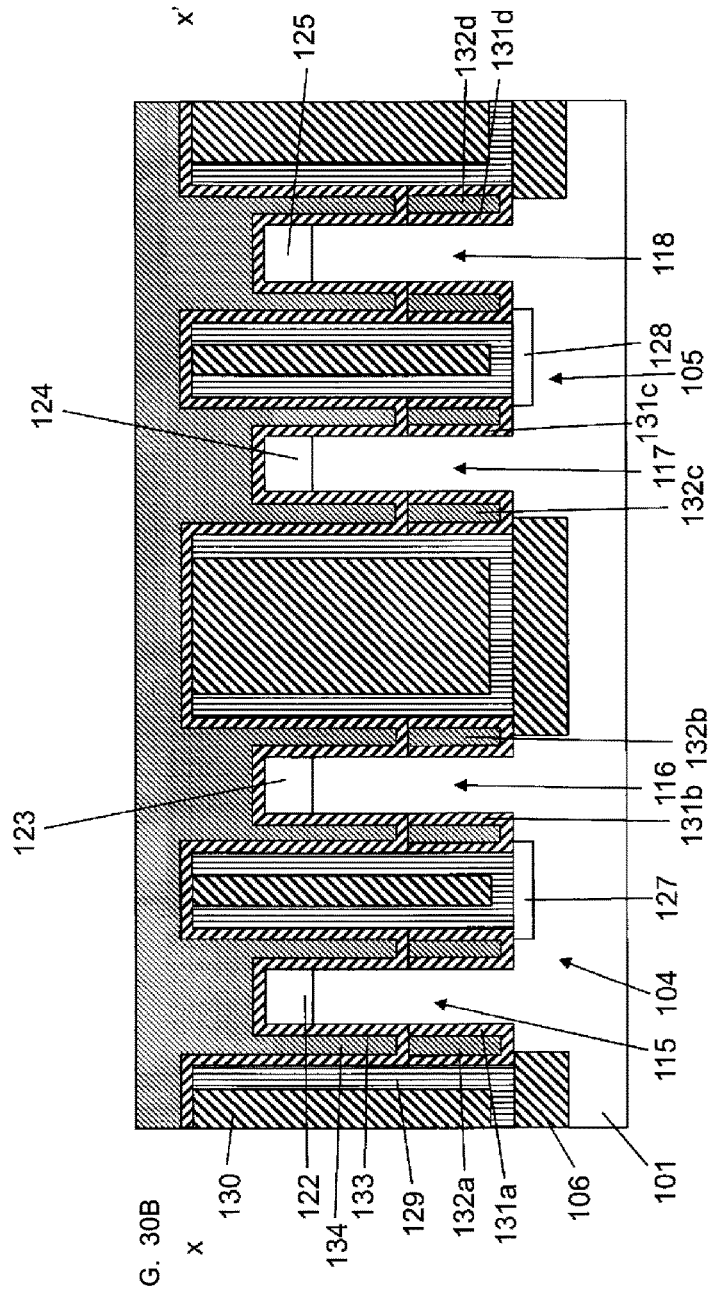

As illustrated in FIGS. 30A and 30B, a gate conductive film 134 is deposited. The gate conductive film 134 is preferably formed of a metal.

Figure 31A:
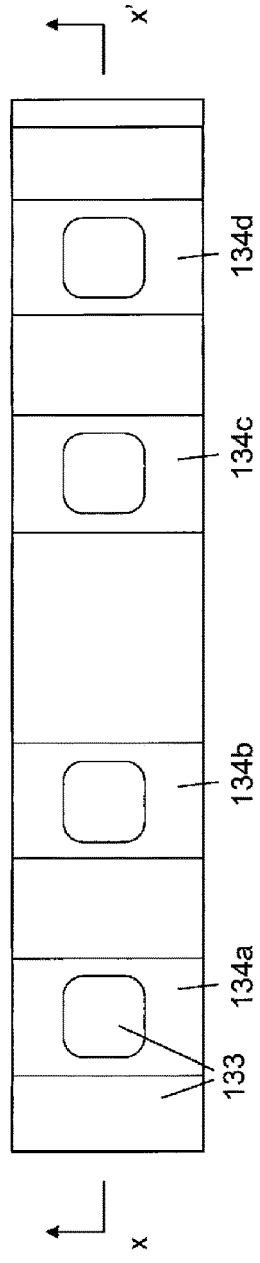
FIG. 31A is a plan view illustrating the method for fabricating the semiconductor device according to the embodiment of the present invention and FIG. 31B is a sectional view taken along line X-X' illustrated in FIG. 31A.
Figure 31B:
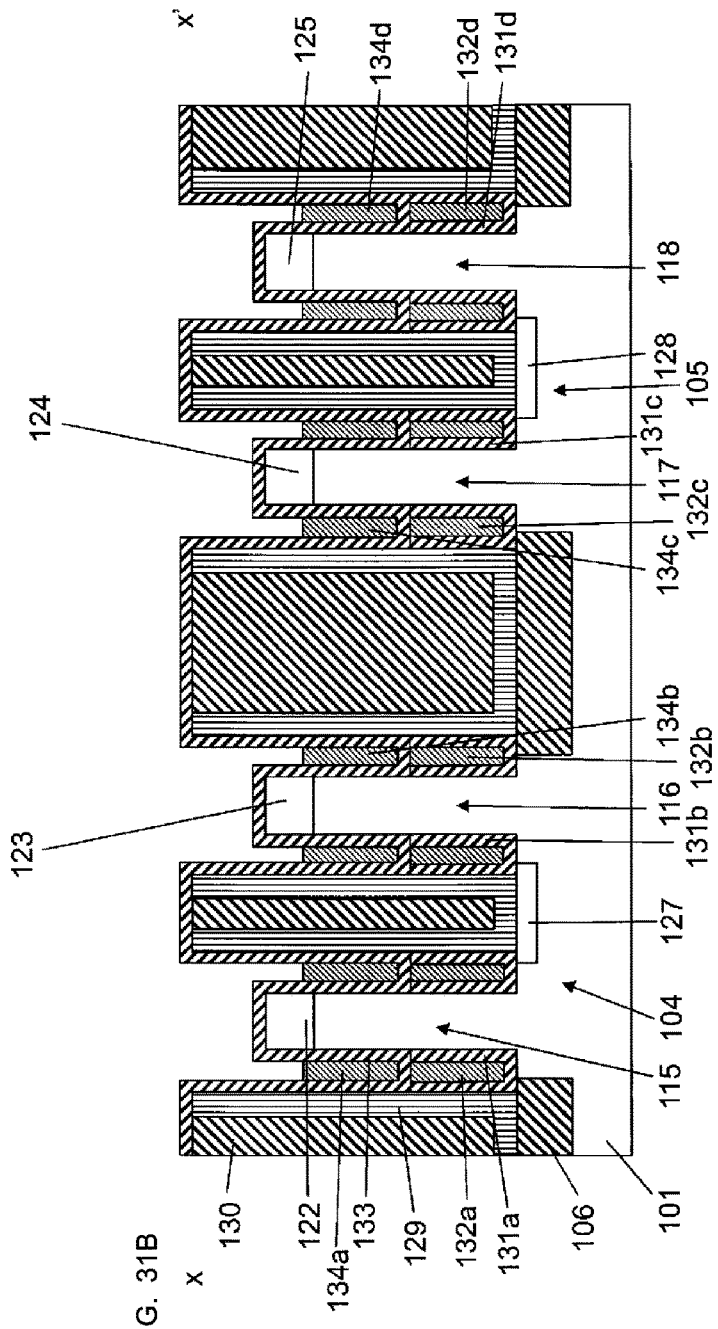

As illustrated in FIGS. 31A and 31B, the gate conductive film 134 is etched-back so as to form the first selection gate 134a around the first pillar-shaped silicon layer 115, the second control gate 134b around the second pillar-shaped silicon layer 116, the fourth control gate 134c around the third pillar-shaped silicon layer 117, and the second selection gate 134d around the fourth pillar-shaped silicon layer 118.

Figure 32A:
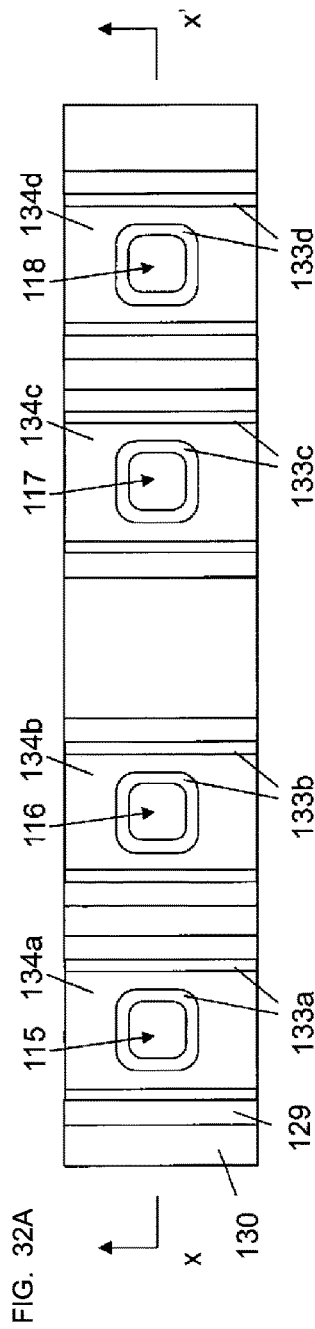
FIG. 32A is a plan view illustrating the method for fabricating the semiconductor device according to the embodiment of the present invention and FIG. 32B is a sectional view taken along line X-X' illustrated in FIG. 32A.
Figure 32B:
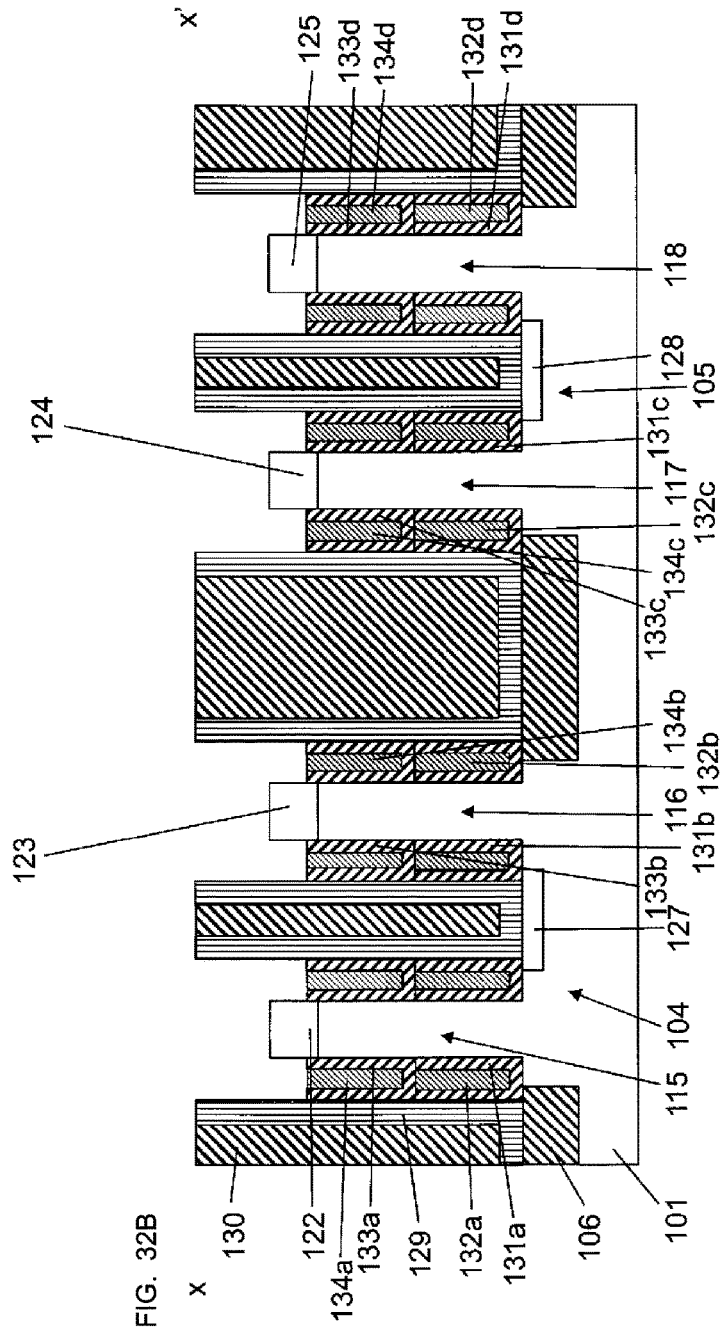

As illustrated in FIGS. 32A and 32B, an exposed portion of the layer 133 including a charge storage layer is removed. Consequently, the layer 133 including a charge storage layer is separated into the first selection gate insulating film 133a, the layer 133b including the second charge storage layer, the layer 133c including the fourth charge storage layer, and the second selection gate insulating film 133d.

As illustrated in FIGS. 33A and 33B, a second interlayer insulating film 135 is deposited.

As illustrated in FIGS. 34A and 34B, planarization is performed so as to expose upper portions of the first pillar-shaped silicon layer 115, the second pillar-shaped silicon layer 116, the third pillar-shaped silicon layer 117, and the fourth pillar-shaped silicon layer 118. Consequently, the second interlayer insulating film 135 is separated into second interlayer insulating films 135a, 135b, 135c, and 135d.

Figure 35A:
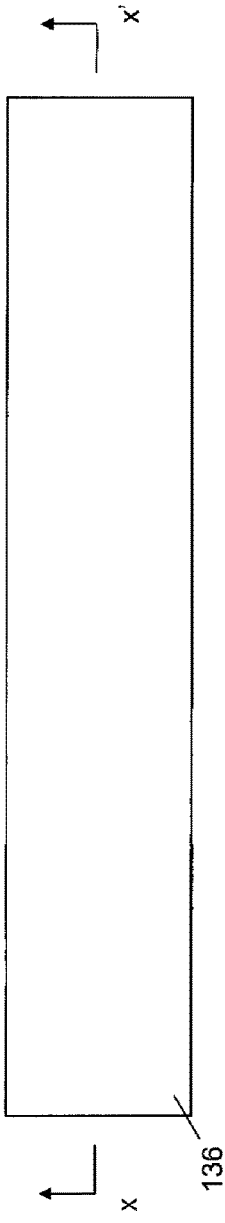
FIG. 35A is a plan view illustrating the method for fabricating the semiconductor device according to the embodiment of the present invention and FIG. 35B is a sectional view taken along line X-X' illustrated in FIG. 35A.
Figure 35B:
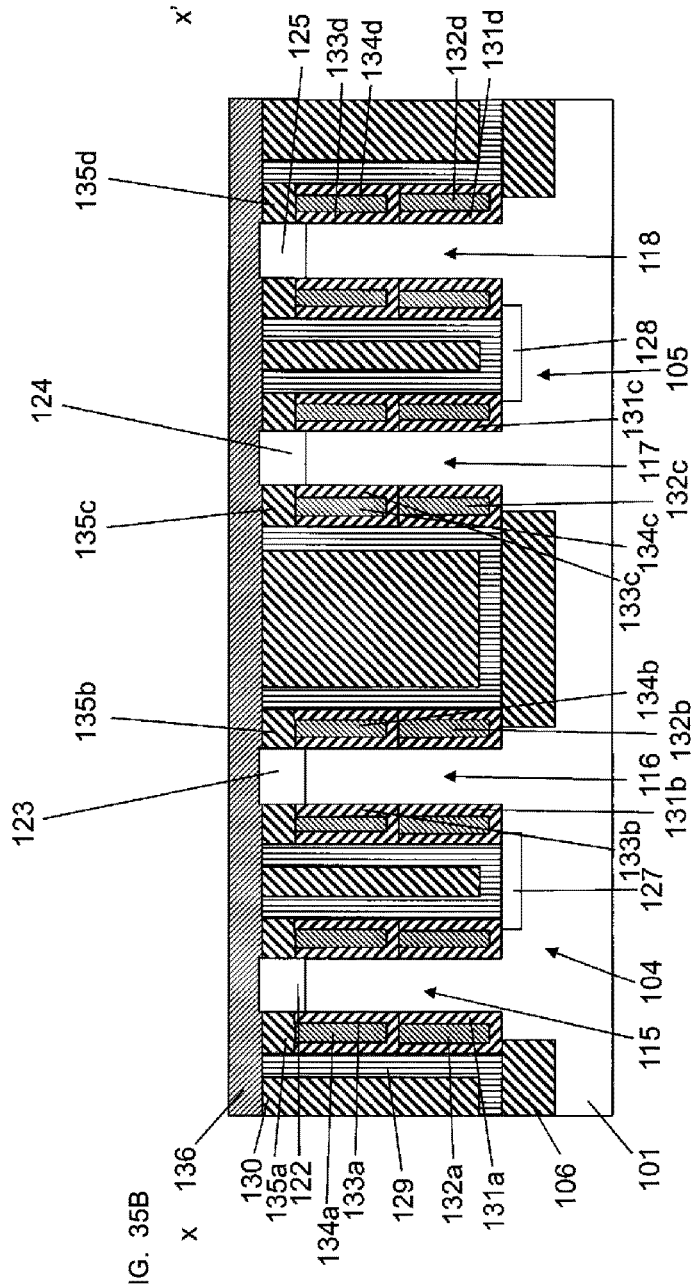

As illustrated in FIGS. 35A and 35B, a metal 136 is deposited.

Figure 36A:
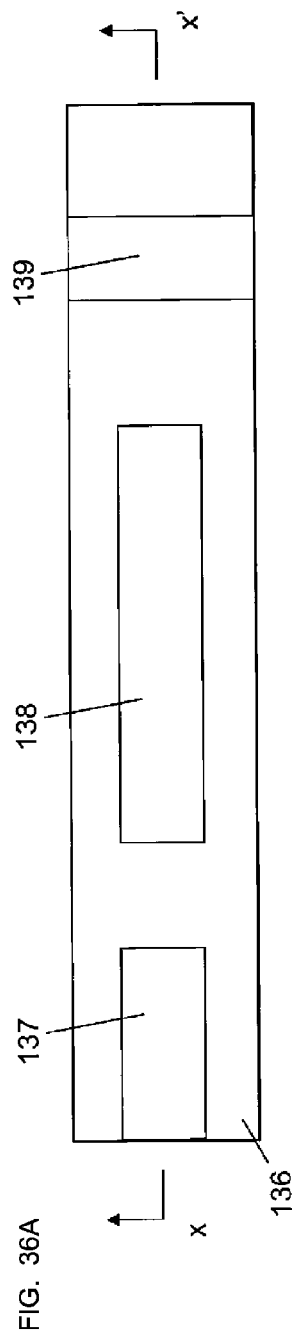
FIG. 36A is a plan view illustrating the method for fabricating the semiconductor device according to the embodiment of the present invention and FIG. 36B is a sectional view taken along line X-X' illustrated in FIG. 36A.
Figure 36B:
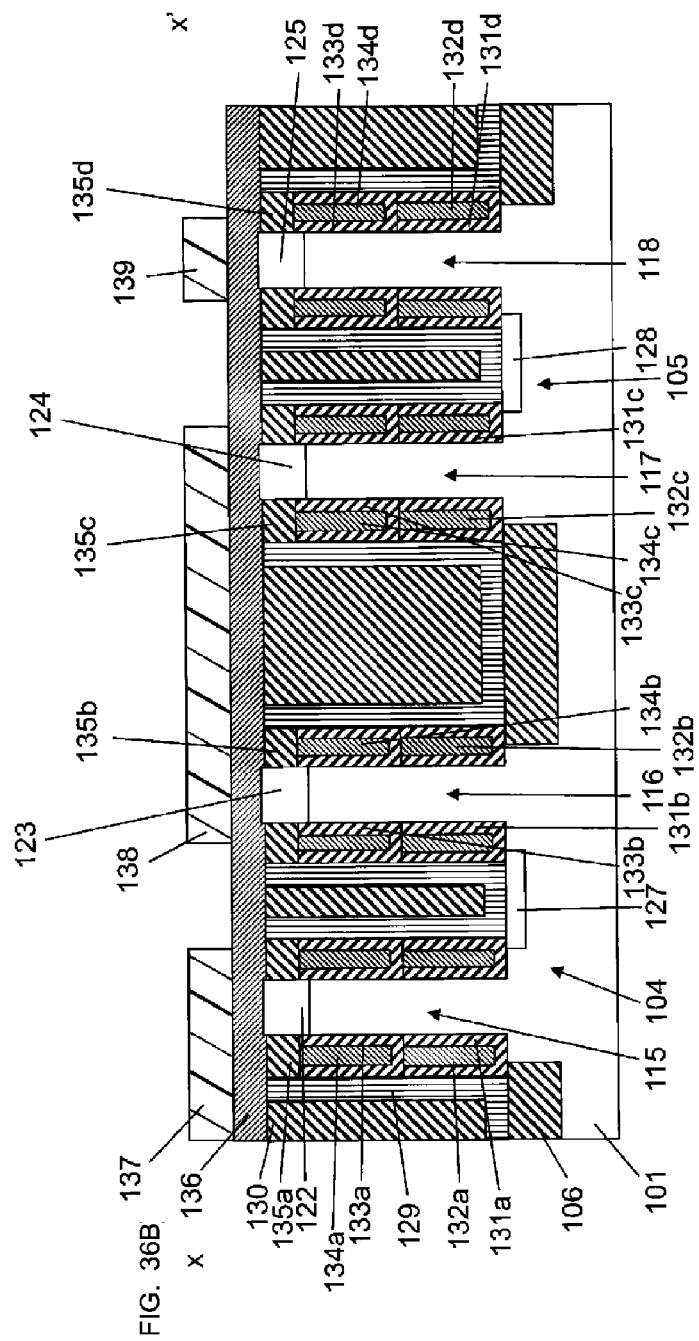

As illustrated in FIGS. 36A and 36B, fourth resists 137, 138, and 139 are formed.

Figure 37A:
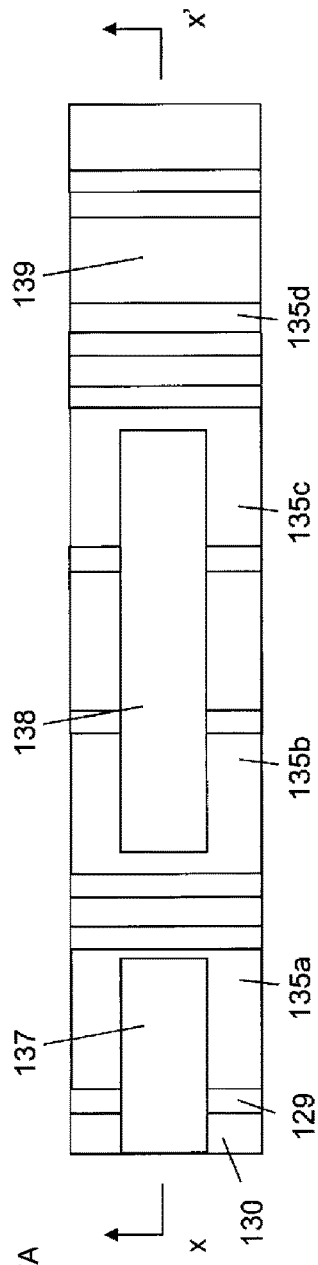
FIG. 37A is a plan view illustrating the method for fabricating the semiconductor device according to the embodiment of the present invention and FIG. 37B is a sectional view taken along line X-X' illustrated in FIG. 37A.
Figure 37B:
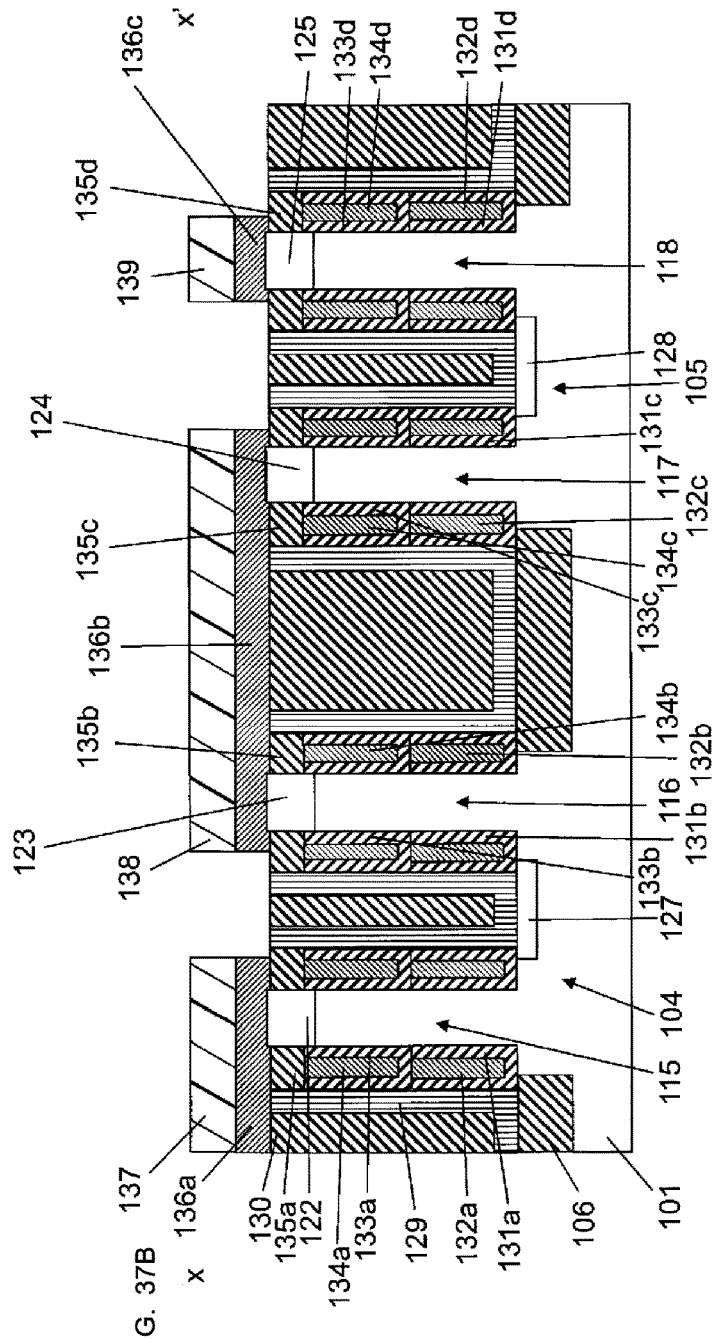

As illustrated in FIGS. 37A and 37B, the metal 136 is etched so as to form the first bit line 136a, the upper-portion internal line 136b, and the first source line 136c.

As illustrated in FIGS. 38A and 38B, the fourth resists 137, 138, and 139 are removed.

Figure 39A:
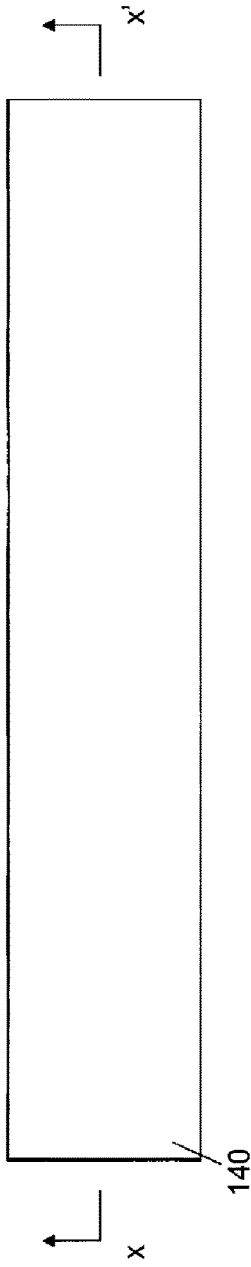
FIG. 39A is a plan view illustrating the method for fabricating the semiconductor device according to the embodiment of the present invention and FIG. 39B is a sectional view taken along line X-X' illustrated in FIG. 39A.
Figure 39B:
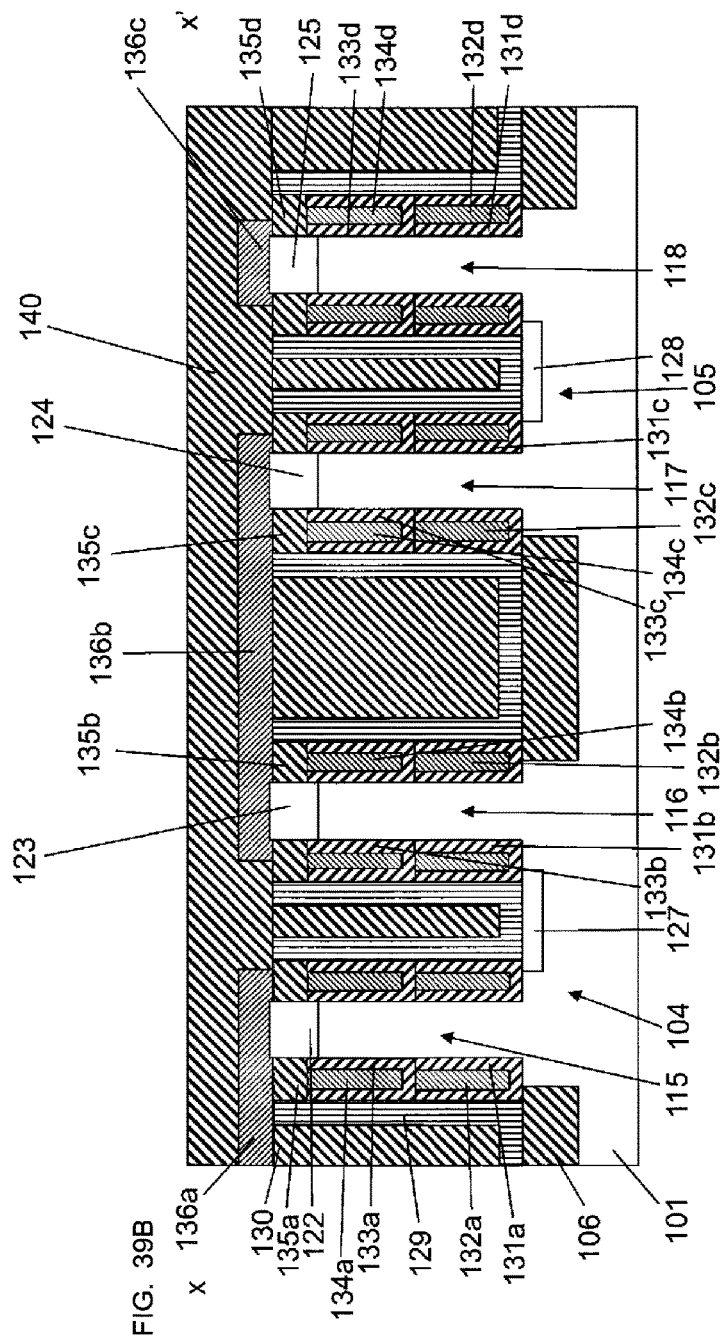

As illustrated in FIGS. 39A and 39B, a third interlayer insulating film 140 is formed.

As illustrated in FIGS. 40A and 40B, a fifth resist 141 used to form a contact is formed.

Figure 41A:
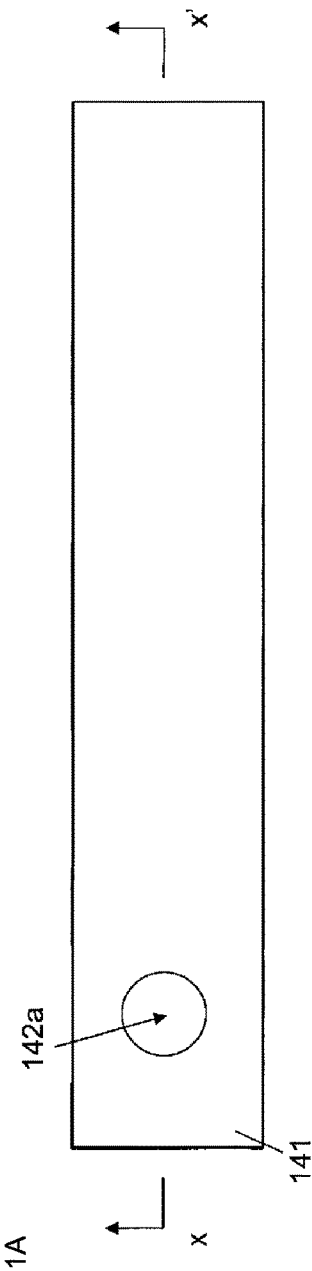
FIG. 41A is a plan view illustrating the method for fabricating the semiconductor device according to the embodiment of the present invention and FIG. 41B is a sectional view taken along line X-X' illustrated in FIG. 41A.
Figure 41B:
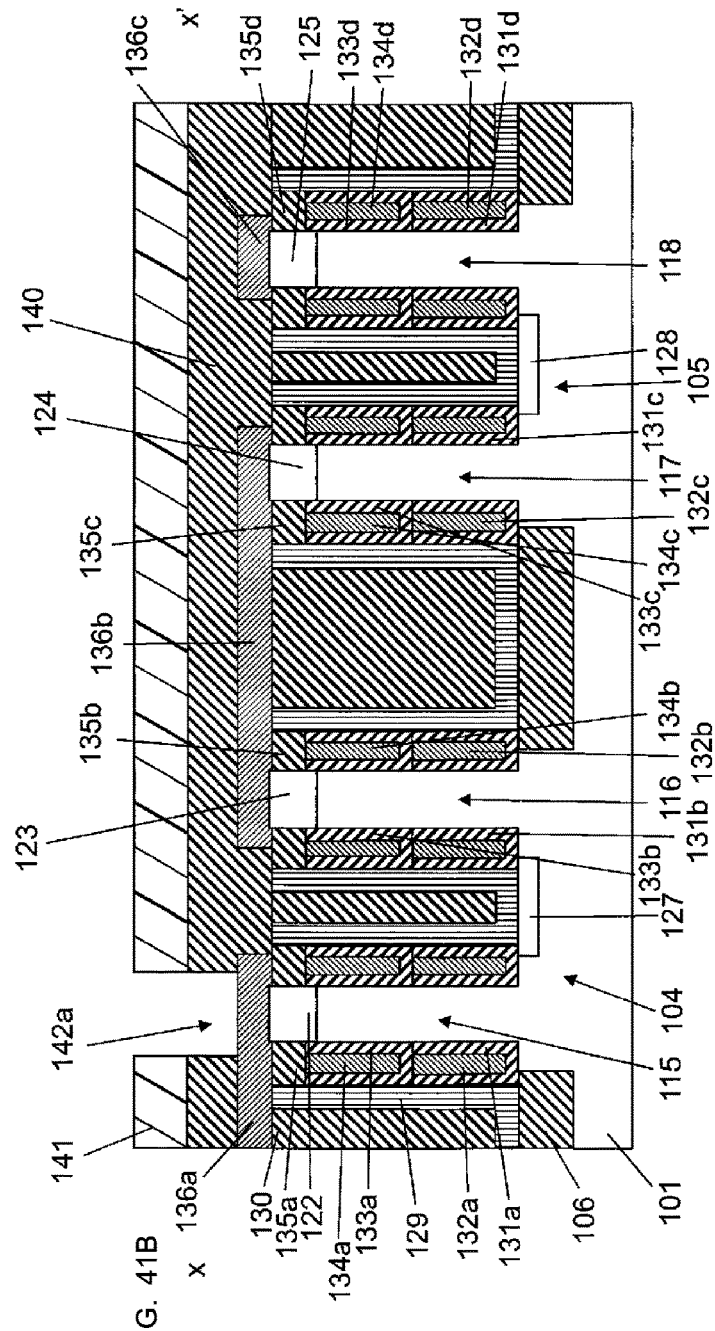

As illustrated in FIGS. 41A and 41B, the third interlayer insulating film 140 is etched so as to form a contact hole 142a.

As illustrated in FIGS. 42A and 42B, the fifth resist 141 is removed.

As illustrated in FIGS. 43A and 43B, a metal 143 is deposited. At this time, the contact hole 142a is filled with the metal 143, and consequently the contact 142 is formed.

Figure 44A:
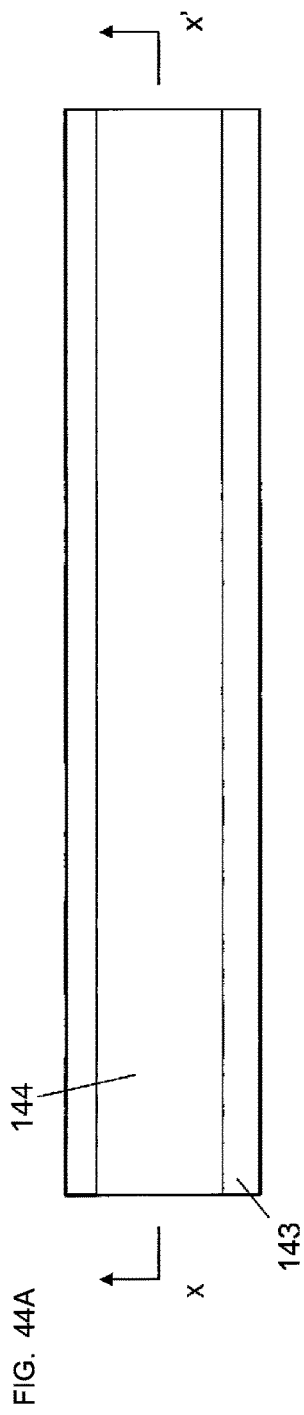
FIG. 44A is a plan view illustrating the method for fabricating the semiconductor device according to the embodiment of the present invention and FIG. 44B is a sectional view taken along line X-X' illustrated in FIG. 44A.
Figure 44B:
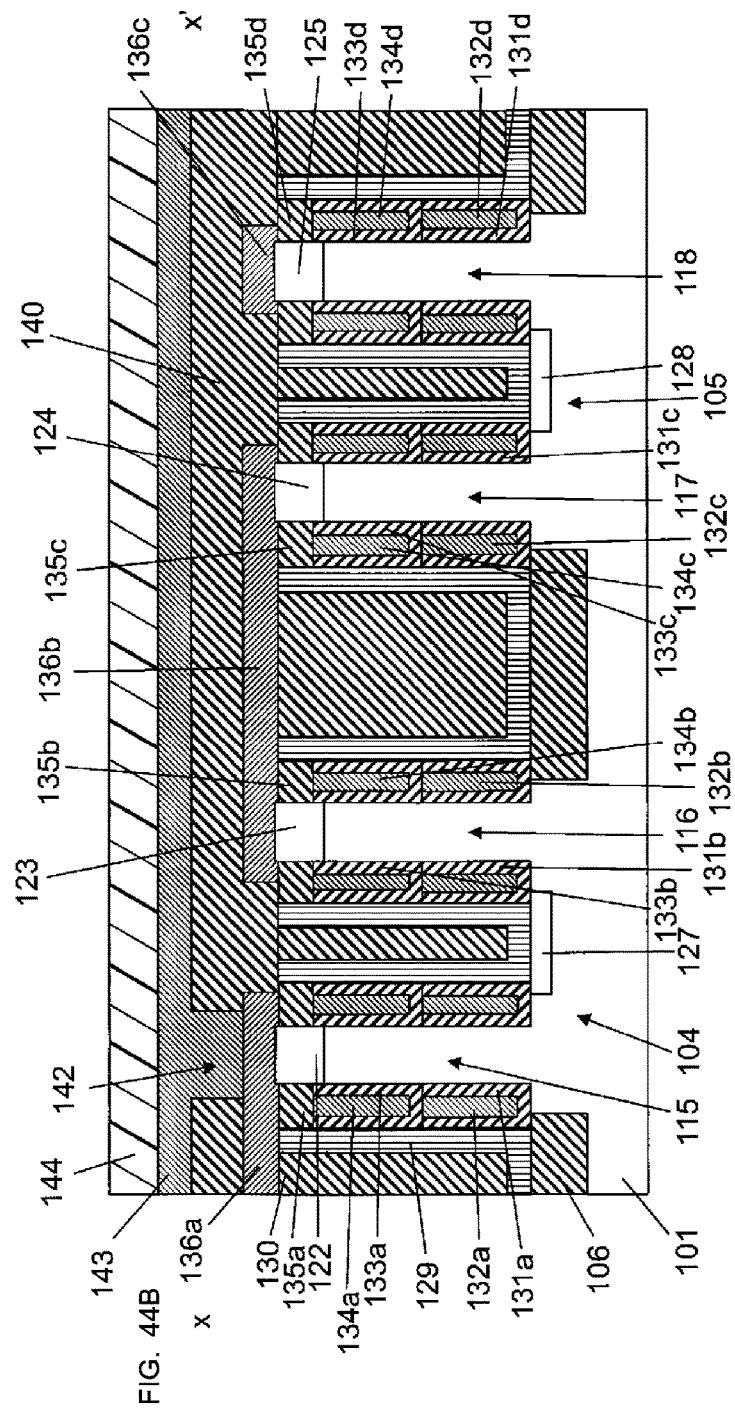

As illustrated in FIGS. 44A and 44B, a sixth resist 144 is formed.

As illustrated in FIGS. 45A and 45B, the metal 143 is etched so as to form the second bit line 143a.

Figure 46A:
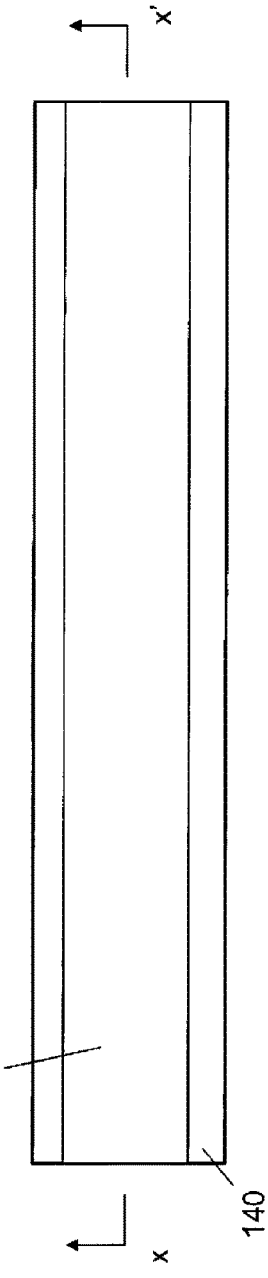
FIG. 46A is a plan view illustrating the method for fabricating the semiconductor device according to the embodiment of the present invention and FIG. 46B is a sectional view taken along line X-X' illustrated in FIG. 46A.
Figure 46B:
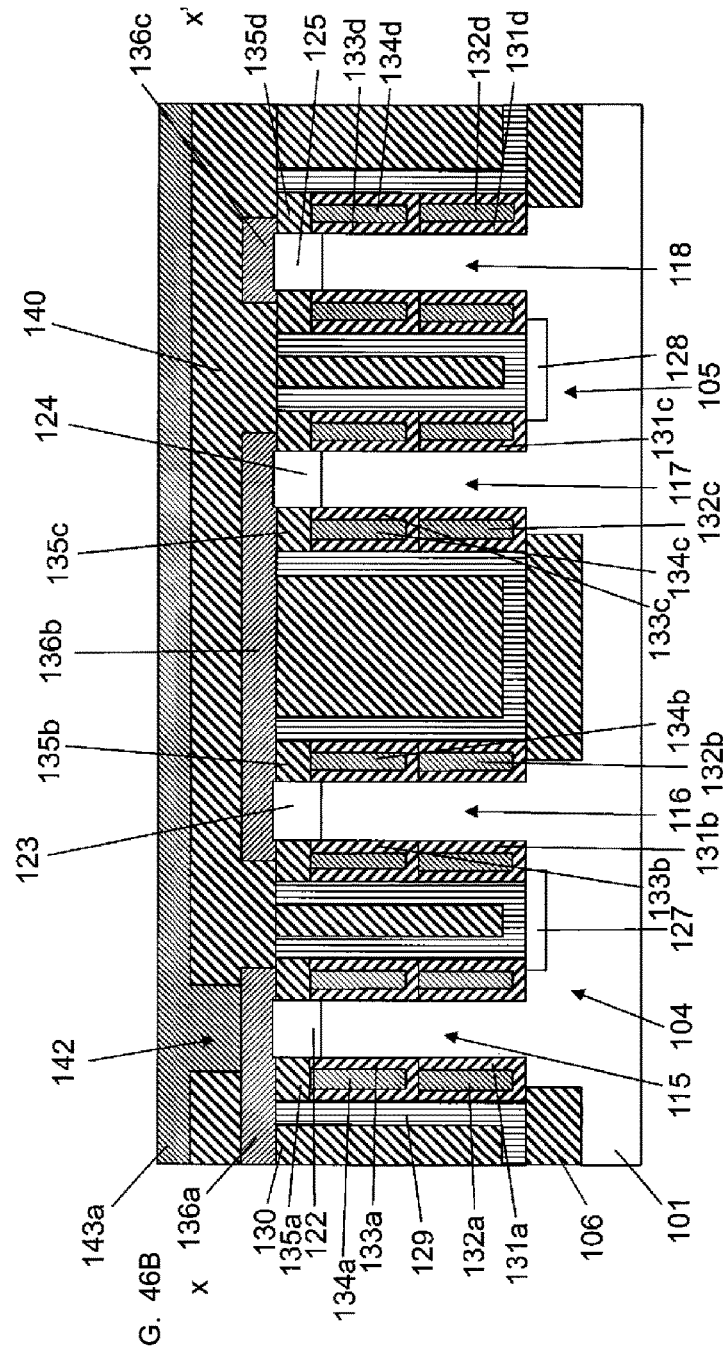

As illustrated in FIGS. 46A and 46B, the sixth resist 144 is removed.

The process of forming line layers have been described above.

The fabrication process for forming the structure of the semiconductor device according to the embodiment of the present invention has been described above.

Note that various embodiments and modifications can be made to the present invention without departing from the broad spirit and scope of the present invention. In addition, the embodiment described above is merely for describing one exemplary embodiment of the present invention and does not limit the scope of the present invention.

For example, a method for fabricating a semiconductor device in which the p-type (including the p$^+$-type) and the n-type (including the n$^+$-type) are made opposite to those of the above-described embodiment and a semiconductor device obtained using the method are obviously within the technical scope of the present invention.

The invention claimed is:

1. A semiconductor device comprising:
   a first pillar-shaped semiconductor layer;
   a first selection gate insulating film surrounding the first pillar-shaped semiconductor layer;
   a first selection gate surrounding the first selection gate insulating film;
   a first bit line connected to an upper portion of the first pillar-shaped semiconductor layer;
   a second pillar-shaped semiconductor layer;
   a layer including a first charge storage layer, surrounding the second pillar-shaped semiconductor layer;
   a first control gate surrounding the layer including the first charge storage layer;
   a layer including a second charge storage layer, the layer being disposed above the first control gate and surrounding the second pillar-shaped semiconductor layer;
   a second control gate surrounding the layer including the second charge storage layer;
   a first lower-portion internal line connecting a lower portion of the first pillar-shaped semiconductor layer to a lower portion of the second pillar-shaped semiconductor layer, wherein an upper portion of the second pillar-shaped semiconductor layer is connected to a pillar-shaped semiconductor layer next to the second pillar-shaped semiconductor layer and located on a side of the second pillar-shaped semiconductor layer being opposite the first pillar-shaped semiconductor layer, by a first upper-portion internal line, and wherein the upper portion of the second pillar-shaped semiconductor layer is not connected to any pillar-shaped semiconductor layers other than the pillar-shaped semiconductor layer next to the second pillar-shaped semiconductor layer;
   a third pillar-shaped semiconductor layer;
   a layer including a third charge storage layer, surrounding the third pillar-shaped semiconductor layer;
   a third control gate surrounding the layer including the third charge storage layer;
   a layer including a fourth charge storage layer, the layer being disposed above the third control gate and surrounding the third pillar-shaped semiconductor layer;
   a fourth control gate surrounding the layer including the fourth charge storage layer;
   a fourth pillar-shaped semiconductor layer;
   a second selection gate insulating film surrounding the fourth pillar-shaped semiconductor layer;
   a second selection gate surrounding the second selection gate insulating film;
   a first source line connected to an upper portion of the fourth pillar-shaped semiconductor layer; and
   a second lower-portion internal line connecting a lower portion of the third pillar-shaped semiconductor layer to a lower portion of the fourth pillar-shaped semiconductor layer.

2. The semiconductor device according to claim 1, wherein the second control gate and the fourth control gate are provided in a plurality, and the second control gates and the fourth control gates are disposed in a direction perpendicular to a substrate.

3. The semiconductor device according to claim 1, further comprising:
   a fifth pillar-shaped semiconductor layer defined by the pillar-shaped semiconductor layer, next to the second pillar-shaped semiconductor layer and located on the side of the second pillar-shaped semiconductor layer being opposite the first pillar-shaped semiconductor layer;
   a layer including a fifth charge storage layer, surrounding the fifth pillar-shaped semiconductor layer;

a fifth control gate surrounding the layer including the fifth charge storage layer;

a layer including a sixth charge storage layer, the layer being disposed above the fifth control gate and surrounding the fifth pillar-shaped semiconductor layer;

a sixth control gate surrounding the layer including the sixth charge storage layer;

a sixth pillar-shaped semiconductor layer;

a layer including a seventh charge storage layer, surrounding the sixth pillar-shaped semiconductor layer;

a seventh control gate surrounding the layer including the seventh charge storage layer;

a layer including an eighth charge storage layer, the layer being disposed above the seventh control gate and surrounding the sixth pillar-shaped semiconductor layer;

an eighth control gate surrounding the layer including the eighth charge storage layer; and a third lower-portion internal line connecting a lower portion of the fifth pillar-shaped semiconductor layer to a lower portion of the sixth pillar-shaped semiconductor layer.

4. The semiconductor device according to claim 3, wherein the sixth control gate and the eighth control gate are provided in a plurality, and the sixth control gates and the eighth control gates are disposed in a direction perpendicular to a substrate.

5. The semiconductor device according to claim 3, further comprising:

a seventh pillar-shaped semiconductor layer;

a layer including a ninth charge storage layer, surrounding the seventh pillar-shaped semiconductor layer;

a ninth control gate surrounding the layer including the ninth charge storage layer;

a layer including a tenth charge storage layer, the layer being disposed above the ninth control gate and surrounding the seventh pillar-shaped semiconductor layer;

a tenth control gate surrounding the layer including the tenth charge storage layer;

an eighth pillar-shaped semiconductor layer;

a layer including an eleventh charge storage layer, surrounding the eighth pillar-shaped semiconductor layer;

an eleventh control gate surrounding the layer including the eleventh charge storage layer;

a layer including a twelfth charge storage layer, the layer being disposed above the eleventh control gate and surrounding the eighth pillar-shaped semiconductor layer;

a twelfth control gate surrounding the layer including the twelfth charge storage layer;

a fourth lower-portion internal line connecting a lower portion of the seventh pillar-shaped semiconductor layer to a lower portion of the eighth pillar-shaped semiconductor layer; and a second upper-portion internal line connecting an upper portion of the third pillar-shaped semiconductor layer to an upper portion of the eighth pillar-shaped semiconductor layer.

6. The semiconductor device according to claim 5, wherein the tenth control gate and the twelfth control gate are provided in a plurality, and the tenth control gates and the twelfth control gates are disposed in a direction perpendicular to a substrate.

7. The semiconductor device according to claim 1, further comprising:

a first fin-shaped semiconductor layer disposed below the first pillar-shaped semiconductor layer and the second pillar-shaped semiconductor layer; and a second fin-shaped semiconductor layer disposed below the third pillar-shaped semiconductor layer and the fourth pillar-shaped semiconductor layer, wherein the first lower-portion internal line is formed in the first fin-shaped semiconductor layer, and the second lower-portion internal line is formed in the second fin-shaped semiconductor layer.

8. The semiconductor device according to claim 7, further comprising a third fin-shaped semiconductor layer disposed below the fifth pillar-shaped semiconductor layer and the sixth pillar-shaped semiconductor layer, and wherein the third lower-portion internal line is formed in the third fin-shaped semiconductor layer.

9. The semiconductor device according to claim 8, further comprising a fourth fin-shaped semiconductor layer disposed below the seventh pillar-shaped semiconductor layer and the eighth pillar-shaped semiconductor layer, and wherein the fourth lower-portion internal line is formed in the fourth fin-shaped semiconductor layer.

10. The semiconductor device according to claim 7, further comprising a first element separation film disposed around the first fin-shaped semiconductor layer and the second fin-shaped semiconductor layer.

11. The semiconductor device according to claim 1, further comprising a third selection gate disposed below the first selection gate.

12. The semiconductor device according to claim 11, further comprising a fourth selection gate disposed below the second selection gate.

13. The semiconductor device according to claim 5 further comprising a thirteenth control gate disposed below the first selection gate.

14. The semiconductor device according to claim 13, further comprising a fourteenth control gate disposed below the second selection gate.

15. The semiconductor device according to claim 7, wherein the first lower-portion internal line is a first diffusion layer and the second lower-portion internal line is a second diffusion layer.

16. The semiconductor device according to claim 15, wherein the third lower-portion internal line is a third diffusion layer.

17. The semiconductor device according to claim 9, wherein the fourth lower-portion internal line is a fourth diffusion layer.

18. The semiconductor device according to claim 17, further comprising:

a fifth diffusion layer disposed in an upper portion of the first pillar-shaped semiconductor layer;

a sixth diffusion layer disposed in an upper portion of the second pillar-shaped semiconductor layer;

a seventh diffusion layer disposed in an upper portion of the third pillar-shaped semiconductor layer; and an eighth diffusion layer disposed in an upper portion of the fourth pillar-shaped semiconductor layer.

19. The semiconductor device according to claim 18, further comprising:

a ninth diffusion layer disposed in an upper portion of the fifth pillar-shaped semiconductor layer; and a tenth diffusion layer disposed in an upper portion of the sixth pillar-shaped semiconductor layer.

20. The semiconductor device according to claim 19, further comprising:

an eleventh diffusion layer disposed in an upper portion of the seventh pillar-shaped semiconductor layer; and a twelfth diffusion layer disposed in an upper portion of the eighth pillar-shaped semiconductor layer.

21. The semiconductor device according to claim 1, wherein the layer including the first charge storage layer includes a nitride film serving as a charge storage layer.

* * * * *